(12) United States Patent
Fujimoto et al.

(10) Patent No.: US 12,382,599 B2
(45) Date of Patent: *Aug. 5, 2025

(54) SEMICONDUCTOR MEMORY DEVICE

(71) Applicant: Kioxia Corporation, Tokyo (JP)

(72) Inventors: Akihisa Fujimoto, Yamato (JP); Atsushi Kondo, Yokohama (JP); Noriya Sakamoto, Chigasaki (JP); Taku Nishiyama, Yokohama (JP); Katsuyoshi Watanabe, Fujisawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/738,605

(22) Filed: Jun. 10, 2024

(65) Prior Publication Data

US 2024/0334631 A1 Oct. 3, 2024

Related U.S. Application Data

(63) Continuation of application No. 17/076,109, filed on Oct. 21, 2020, now Pat. No. 12,048,110, which is a (Continued)

(30) Foreign Application Priority Data

Apr. 23, 2018 (JP) .................. 2018-082281
Dec. 5, 2018 (JP) .................. 2018-228246

(51) Int. Cl.
*G06F 3/00* (2006.01)
*G06F 1/18* (2006.01)
(Continued)

(52) U.S. Cl.
CPC .......... *H05K 5/0247* (2013.01); *G06F 1/187* (2013.01); *G06F 13/4068* (2013.01);
(Continued)

(58) Field of Classification Search
CPC .................. H05K 5/0247; G06F 1/187; G06F 13/4068; G06F 13/4221; G06F 2213/0026;
(Continued)

(56) References Cited

U.S. PATENT DOCUMENTS

| 8,708,749 B2 | 4/2014 | Suenaga et al. |
| 2005/0182881 A1 | 8/2005 | Chou et al. |

(Continued)

FOREIGN PATENT DOCUMENTS

| CN | 107886149 A | 4/2018 |
| JP | 2009-093445 A | 4/2009 |

(Continued)

OTHER PUBLICATIONS

International Search Report issued Jun. 18, 2019 in PCT/JP2019/012290 filed on Mar. 18, 2019, 3 pages.

(Continued)

*Primary Examiner* — Henry Tsai
*Assistant Examiner* — Kim T Huynh
(74) *Attorney, Agent, or Firm* — Oblon, McClelland, Maier & Neustadt, L.L.P.

(57) ABSTRACT

According to one embodiment, a semiconductor memory device includes a housing and terminals. The housing has a first end edge extending in a first direction and a second end edge opposite to the first end edge. The terminals include signal terminals and include first terminals, second terminals, and third terminals. The first terminals are arranged in the first direction at a position close to the first end edge. The second terminals are arranged in the first direction with intervals at a position closer to the first end edge than the second end edge. The first plurality of terminals are closer to the first end edge than the second plurality of terminals are. The third terminals are arranged in the first direction with intervals at a position closer to the second end edge than the first end edge.

20 Claims, 26 Drawing Sheets

Related U.S. Application Data continuation of application No. PCT/JP2019/012290, filed on Mar. 18, 2019.

(51) Int. Cl.
*G06F 13/40* (2006.01)
*G06F 13/42* (2006.01)
*G11C 5/04* (2006.01)
*H05K 5/02* (2006.01)

(52) U.S. Cl.
CPC ............ *G06F 13/4221* (2013.01); *G11C 5/04* (2013.01); *G06F 2213/0026* (2013.01)

(58) Field of Classification Search
CPC ........................ G06F 13/1684; G06F 13/4022; G11C 5/04; G11C 5/025; G11C 5/063; G11C 5/145; G06K 19/07743; H10B 80/00
See application file for complete search history.

(56) References Cited

U.S. PATENT DOCUMENTS

| | | | |
|---|---|---|---|
| 2009/0236722 A1 | 9/2009 | Nishiyama et al. | |
| 2009/0321960 A1* | 12/2009 | Okumura | H01L 23/49838 257/784 |
| 2011/0145465 A1 | 6/2011 | Okada | |
| 2012/0117315 A1 | 5/2012 | Okada | |
| 2014/0357105 A1 | 12/2014 | Wig | |
| 2015/0333741 A1* | 11/2015 | Lee | H03K 3/012 327/294 |
| 2016/0049742 A1 | 2/2016 | Han et al. | |
| 2017/0010639 A1* | 1/2017 | Matsumoto | G06F 1/183 |

FOREIGN PATENT DOCUMENTS

| | | |
|---|---|---|
| JP | 2009-259207 A | 11/2009 |
| JP | 2011-28433 A | 2/2011 |
| JP | 2011-123609 A | 6/2011 |
| JP | 2011-146020 A | 7/2011 |
| JP | 2011-146022 A | 7/2011 |
| JP | 5068895 B2 | 11/2012 |
| JP | WO2018/186456 A1 | 10/2018 |

OTHER PUBLICATIONS

Written Opinion issued Jun. 18, 2019 in PCT/JP2019/012290 filed on Mar. 18, 2019, 5 pages.

Hiroto Okada, "The 4K video is also Ok by high-speed serial UHS-II interfacing appearance! The image is also crunchy in 300MB/s or more! Study of the latest SD card", Interface, Japan, CQ Publishing Co., Ltd., Feb. 1, 2014, vol. 40 No. 2, pp. 102-109, with an unedited English machine translation.

* cited by examiner

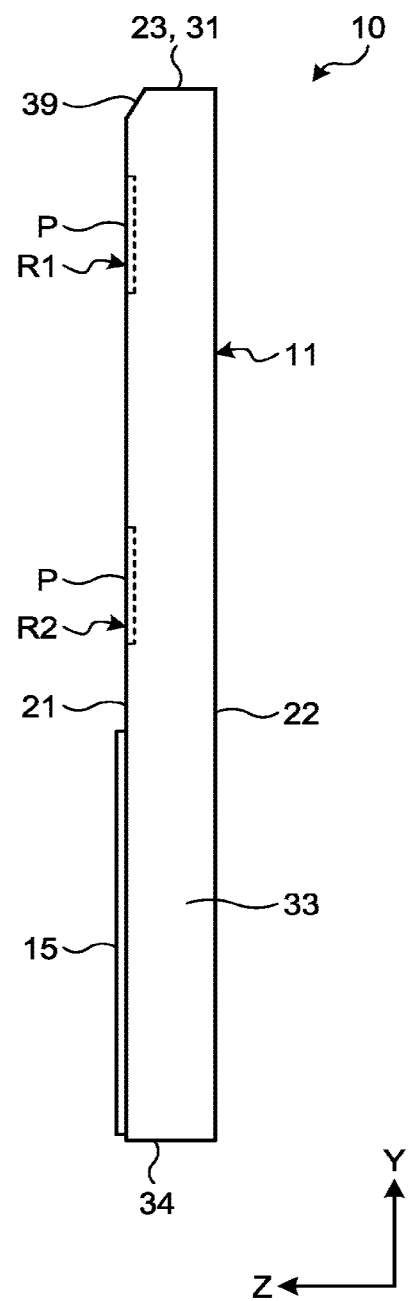

FIG.3

| TERMINAL NUMBER | SIGNAL NAME | FUNCTION | DESCRIPTION |
|---|---|---|---|
| 1 | GND | Ground | |
| 2 | PERp0 | Receiver differential pair, Lane 0 | PCIe RX Differential signals defined by the PCIe 3.0 specification |
| 3 | PERn0 | | |
| 4 | GND | Ground | |
| 5 | PETp0 | Transmitter differential pair, Lane 0 | PCIe TX Differential signals defined by the PCIe 3.0 specification |
| 6 | PETn0 | | |
| 7 | GND | Ground | |
| 8 | PERp1 | Receiver differential pair, Lane 1 | PCIe RX Differential signals defined by the PCIe 3.0 specification |
| 9 | PERn1 | | |
| 10 | GND | Ground | |
| 11 | PETp1 | Transmitter differential pair, Lane 1 | PCIe TX Differential signals defined by the PCIe 3.0 specification |
| 12 | PETn1 | | |
| 13 | GND | Ground | |
| 14 | GND | Ground | |
| 15 | REFCLKp | Reference clock differential pair | PCIe Reference Clock signals (100 MHz) defined by the PCIe 3.0 specification |
| 16 | REFCLKn | | |
| 17 | GND | Ground | |
| 18 | PWR_2 | Power Rail 2 | |
| 19 | PWR_2 | Power Rail 2 | |
| 20 | PERST# | Fundamental reset /1.8V | functional reset to the card as defined by the PCIe Mini CEM specification |
| 21 | PWR_1 | Power Rail 1 | |
| 22 | CLKREQ# | Clock Request Signal / 1.8V open drain | reference clock request signal as defined by the PCIe Mini CEM specification |
| 23 | CNTA | Control Signal A | |
| 24 | PWR_3 | Power Rail 3 | |
| 25 | PWR_3 | Power Rail 3 | |
| 26 | CNTB | Control Signal B | |

FIG.8

| Power Rails | Register Fields |
|---|---|
| PWR1 | Voltage Range |
| | Maximum Peak Current (100us period) |
| | Maximum DC Current (constant) for Slot Power Limit A |
| | Maximum DC Current (constant) for Slot Power Limit B |
| | Maximum DC Current (constant) for Slot Power Limit C |
| PWR2 | Voltage Range |
| | Maximum Peak Current (100us period) |
| | Maximum DC Current (constant) for Slot Power Limit A |
| | Maximum DC Current (constant) for Slot Power Limit B |
| | Maximum DC Current (constant) for Slot Power Limit C |
| PWR3 | Voltage Range |
| | Maximum Peak Current (100us period) |
| | Maximum DC Current (constant) for Slot Power Limit A |
| | Maximum DC Current (constant) for Slot Power Limit B |
| | Maximum DC Current (constant) for Slot Power Limit C |
| | Regulator Support |

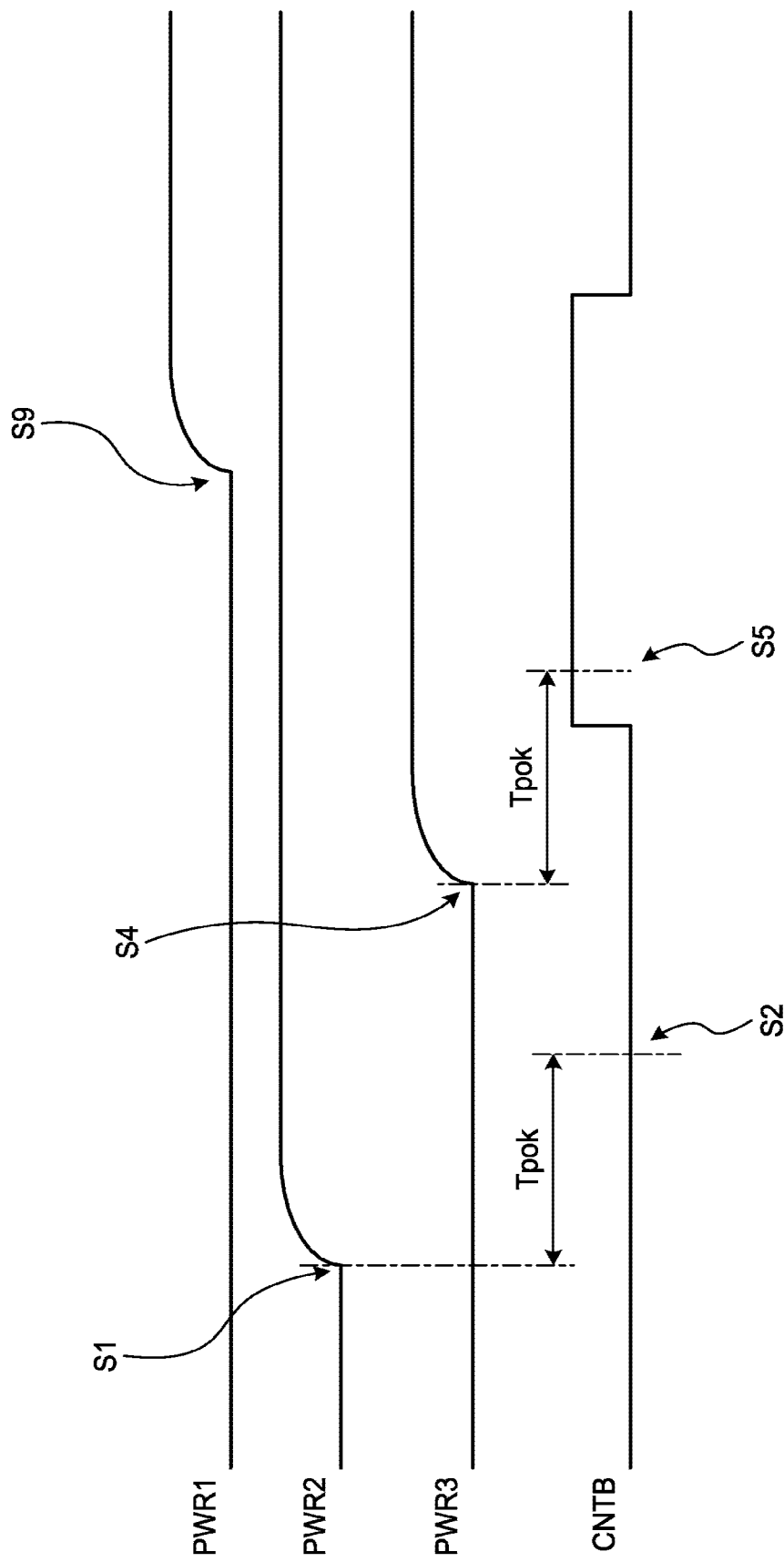

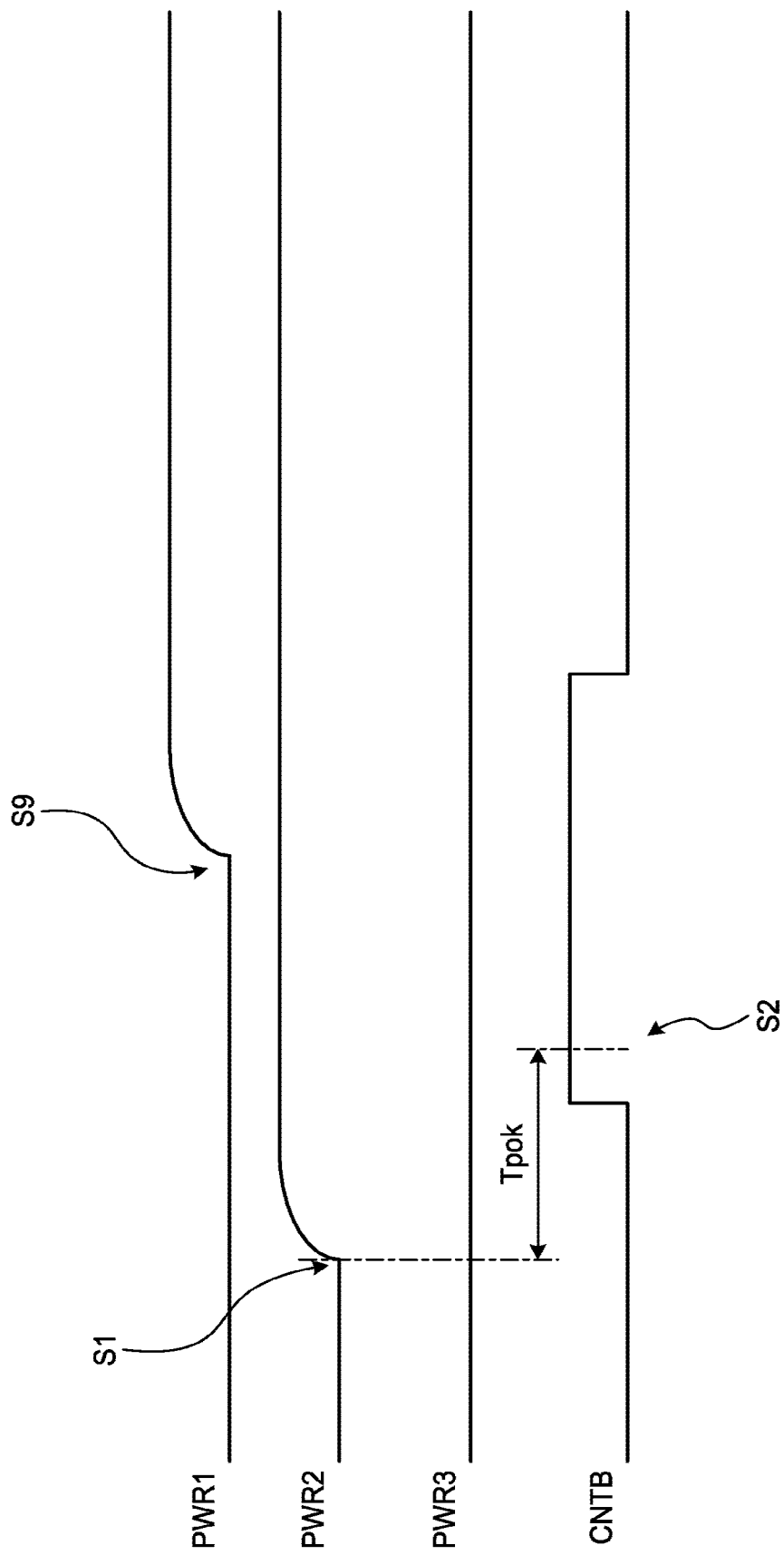

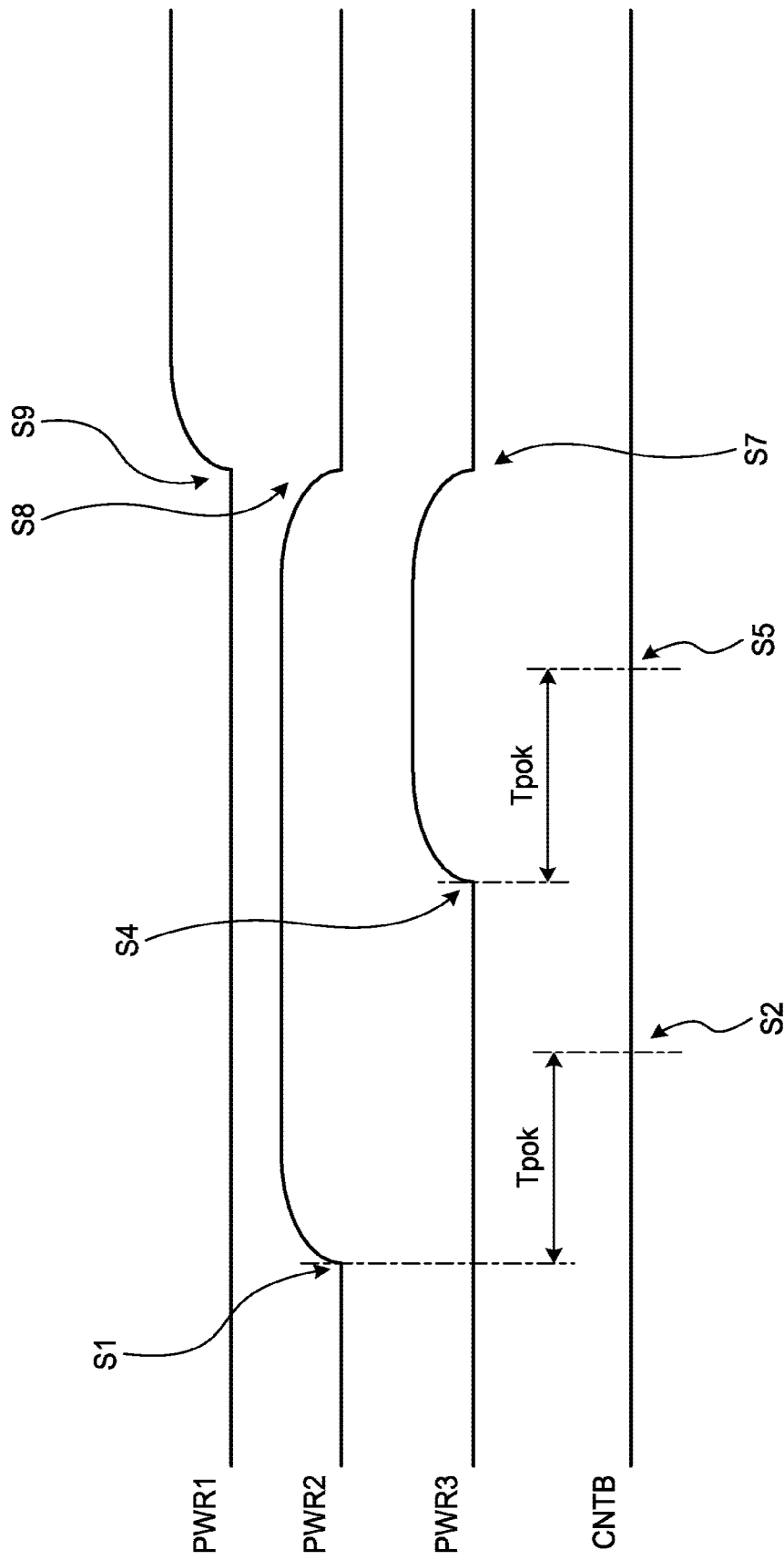

FIG.12
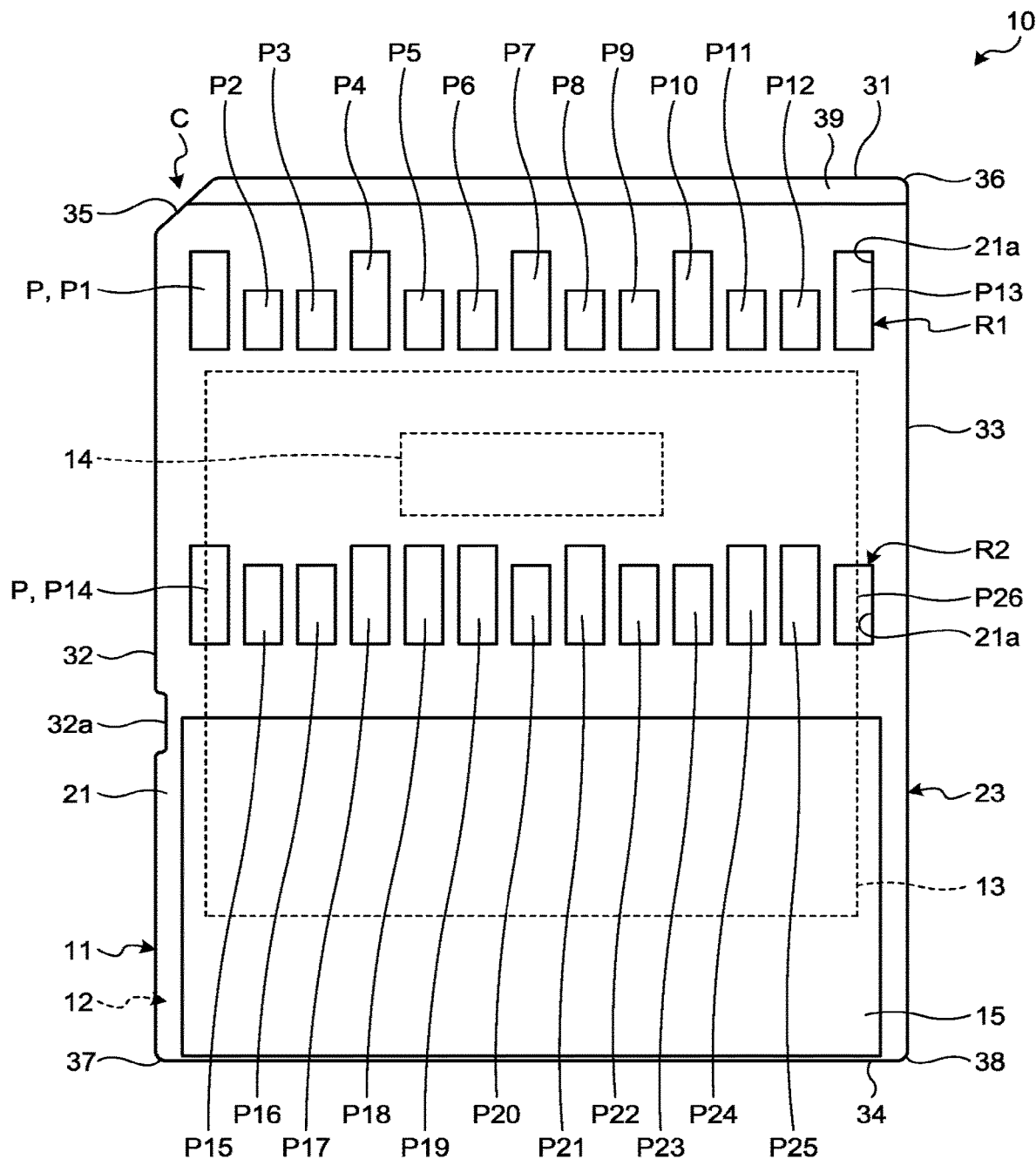
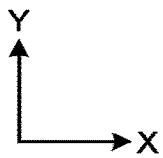

FIG.16

| ROW | TERMINAL | SIGNAL NAME | FUNCTION | DESCRIPTION |
|---|---|---|---|---|
| | P101 | GND | Ground | |
| | P102 | PERp0 | Receiver differential pair, Lane 0 | PCIe RX Differential signals defined by the PCIe 3.0 specification |
| | P103 | PERn0 | | |
| | P104 | GND | Ground | |
| | P105 | PETp0 | Transmitter differential pair, Lane 0 | PCIe TX Differential signals defined by the PCIe 3.0 specification |
| | P106 | PETn0 | | |
| | P107 | GND | Ground | |
| R11 | P108 | PERp1 | Receiver differential pair, Lane 1 | PCIe RX Differential signals defined by the PCIe 3.0 specification |
| | P109 | PERn1 | | |
| | P110 | GND | Ground | |
| | P111 | PETp1 | Transmitter differential pair, Lane 1 | PCIe TX Differential signals defined by the PCIe 3.0 specification |
| | P112 | PETn1 | | |
| | P113 | GND | Ground | |
| | P114 | GND | Ground | |
| | P115 | PERp0 | Receiver differential pair, Lane 2 | PCIe RX Differential signals defined by the PCIe 3.0 specification |
| | P116 | PERn0 | | |
| | P117 | GND | Ground | |
| | P118 | PETp0 | Transmitter differential pair, Lane 2 | PCIe TX Differential signals defined by the PCIe 3.0 specification |
| | P119 | PETn0 | | |
| | P120 | GND | Ground | |
| R12 | P121 | PERp1 | Receiver differential pair, Lane 3 | PCIe RX Differential signals defined by the PCIe 3.0 specification |
| | P122 | PERn1 | | |
| | P123 | GND | Ground | |
| | P124 | PETp1 | Transmitter differential pair, Lane 3 | PCIe TX Differential signals defined by the PCIe 3.0 specification |
| | P125 | PETn1 | | |
| | P126 | GND | Ground | |
| | P127 | GND | Ground | |
| | P128 | REFCLKp | Reference clock differential pair | PCIe Reference Clock signals (100 MHz) defined by the PCIe 3.0 specification |
| | P129 | REFCLKn | | |
| | P130 | GND | Ground | |
| | P131 | PWR_2 | Power Rail 2 | |
| | P132 | PWR_2 | Power Rail 2 | |
| | P133 | PERST# | Fundamental reset / 1.8V | functional reset to the card as defined by the PCIe Mini CEM specification |
| | P134 | PWR_1 | Power Rail 1 | |
| | P135 | CLKREQ# | Clock Request Signal / 1.8V open drain | reference clock request signal as defined by the PCIe Mini CEM specification |
| R21 | P136 | CNTA | Control A | |
| | P137 | PWR_3 | Power Rail 3 | |
| | P138 | PWR_3 | Power Rail 3 | |
| | P139 | CNTB | Control B | |

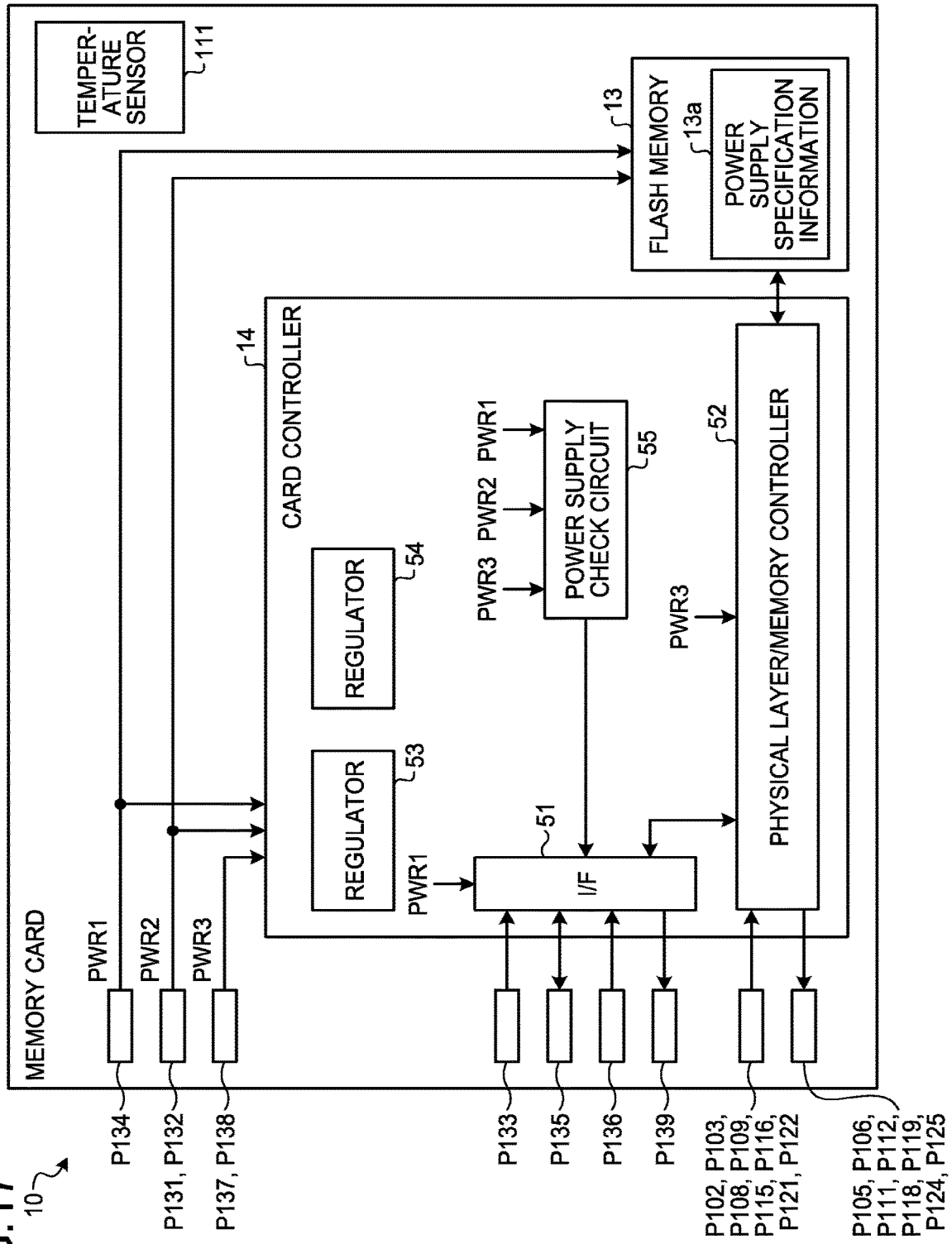

FIG.20

| Power Rails | Register Fields |
|---|---|
| PWR1 | Voltage Range |
| | Maximum Peak Current (100us period) |
| | Maximum DC Current (constant) for Slot Power State A |
| | Maximum DC Current (constant) for Slot Power State B |
| | Maximum DC Current (constant) for Slot Power State C |
| PWR2 | Voltage Range |
| | Maximum Peak Current (100us period) |
| | Maximum DC Current (constant) for Slot Power State A |
| | Maximum DC Current (constant) for Slot Power State B |
| | Maximum DC Current (constant) for Slot Power State C |
| | Regulator Support |
| PWR3 | Voltage Range |
| | Maximum Peak Current (100us period) |
| | Maximum DC Current (constant) for Slot Power State A |
| | Maximum DC Current (constant) for Slot Power State B |
| | Maximum DC Current (constant) for Slot Power State C |
| | Regulator Support |

SEMICONDUCTOR MEMORY DEVICE

CROSS-REFERENCE TO RELATED APPLICATIONS

This application is a continuation of and claims the benefit of priority under 35 U.S.C. § 120 from U.S. application Ser. No. 17/076,109 filed Oct. 21, 2020, which is a continuation of International Application No. PCT/JP2019/012290 filed Mar. 18, 2019, and claims the benefit of priority under 35 U. S. C. § 119 from Japanese Application No. 2018-082281 filed on Apr. 23, 2018 and Japanese Application No. 2018-228246 filed on Dec. 5, 2018; the entire contents of each of which are incorporated herein by reference.

FIELD

Embodiments described herein relate generally to a semiconductor memory device.

BACKGROUND

With the improvement of technology, the memory capacity of the flash memory has been increased. Along with this, a data transmission amount of a semiconductor memory device such as a removable memory card is increased, and a data transmission time is also increased.

If a communication interface of the semiconductor memory device speeds up, the data transmission time can be shortened.

BRIEF DESCRIPTION OF THE DRAWINGS

FIG. 2 is an exemplary side view illustrating the memory card in the first embodiment;

FIG. 3 is an exemplary table listing an example of signal assignment of a plurality of terminals in the first embodiment;

FIG. 8 is an exemplary table listing an example of power supply specification information in the first embodiment;

FIG. 9 is an exemplary timing chart illustrating a first example of the power supply check sequence of the memory card in the first embodiment;

FIG. 10 is an exemplary timing chart illustrating a second example of the power supply check sequence of the memory card in the first embodiment;

FIG. 11 is an exemplary timing chart illustrating a third example of the power supply check sequence of the memory card in the first embodiment;

FIG. 12 is an exemplary plan view illustrating a memory card according to a second embodiment;

FIG. 16 is an exemplary table listing an example of signal assignment of a plurality of terminals in the third embodiment;

FIG. 17 is an exemplary block diagram schematically illustrating a first example of a configuration of the memory card in the third embodiment;

FIG. 20 is an exemplary table listing an example of power supply specification information in the third embodiment;

DETAILED DESCRIPTION

In general, according to an embodiment, a semiconductor memory device includes a housing, a memory, a controller and a plurality of terminals. The housing has a first surface, a second surface located on a side opposite to the first surface, a first end edge extending in a first direction, a second end edge located on a side opposite to the first end edge and extending in the first direction, a first side edge extending in a second direction intersecting the first direction, and a first corner portion where a notch between the first end edge and the first side edge is formed. The memory is provided in the housing. The controller is provided in the housing and is configured to control the memory. The plurality of terminals include a plurality of signal terminals used for signal transmission and are provided on the first surface. The terminals include a first plurality of terminals, a second plurality of terminals, and a third plurality of terminals. The first plurality of terminals are arranged in the first direction with intervals at a position closer to the first end edge than the second end edge. The second plurality of terminals are arranged in the first direction with intervals at a position closer to the first end edge than the second end edge. The first plurality of terminals are closer to the first end edge than the second plurality of terminals are. One of the first plurality of terminals and one of the second plurality of terminals are arranged in the second direction with a certain interval. The third plurality of terminals are arranged in the first direction with intervals at a position closer to the second end edge than the first end edge. The first plurality of terminals include at least one pair of first signal terminals for differential data signals, the differential data signals complying with PCIe standard. At least a portion of sides of the controller is located between the second plurality of terminals and the third plurality of terminals, and has a connection terminal connected to one of the second plurality of terminals through a wire line.

Hereinafter, a semiconductor memory device according to an embodiment will be described in detail with reference to the accompanying drawings. In addition, the present invention is not limited by these embodiments.

First Embodiment

Hereinafter, a first embodiment will be described with reference to FIGS. 1 to 11. In addition, in this specification, sometimes, constituent elements of the embodiment and explanations of the elements are expressed in plural forms. The constituent elements and the explanations expressed in plural forms may be written in other expressions not described. In addition, constituent elements and explanations that are not expressed in plural forms may also be written in other expressions not described.

Figure 1:
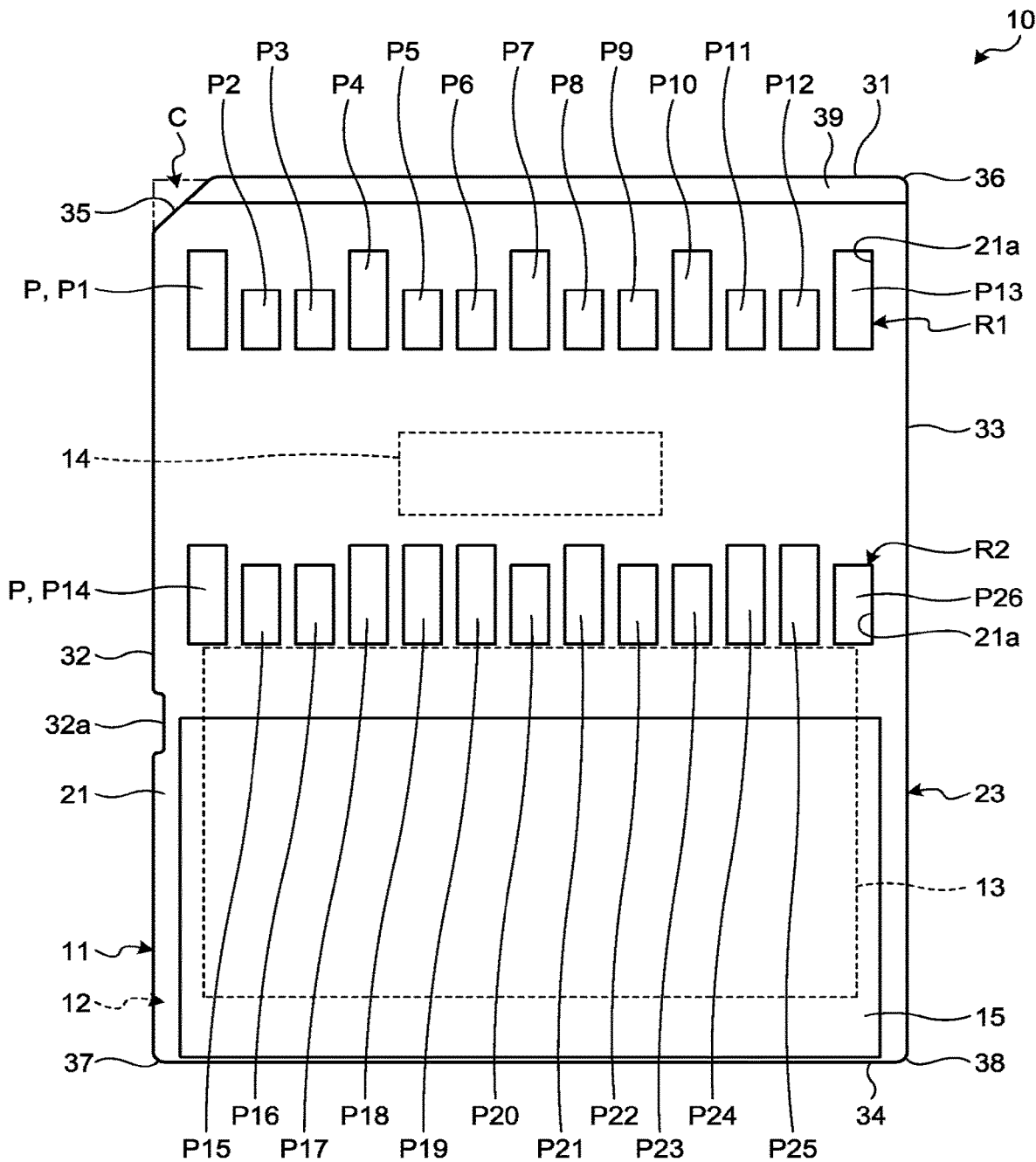
FIG. 1 is an exemplary plan view illustrating a memory card according to a first embodiment.

FIG. 1 is an exemplary plan view illustrating a memory card 10 according to the first embodiment. FIG. 2 is an exemplary side view illustrating the memory card 10 of the first embodiment. The memory card 10 is an example of semiconductor memory device and may be referred to as, for example, a removable medium and a removable memory card.

In the present specification, X axis, Y axis and Z axis are defined as illustrated in each figure. The X axis, the Y axis, and the Z axis are perpendicular to each other. The X axis is along the width of the memory card 10. The Y axis is along the length of the memory card 10. The Z axis is along the thickness of the memory card 10.

The memory card 10 includes a housing 11, a substrate 12, a flash memory 13, a card controller 14, and a protective sheet 15. The flash memory 13 is an example of a memory. The card controller 14 is an example of a controller.

The memory card 10 and the housing 11 are formed, for example, in a substantially rectangular plate shape extending in the Y-axis direction. The Y-axis direction is the longitudinal direction of the memory card 10 and the housing 11 and includes the positive Y-axis direction (the direction indicated by the arrow of the Y axis) and the negative Y-axis direction (the opposite direction of the arrow of the Y axis). The Y-axis direction is an example of the second direction.

As illustrated in FIG. 2, the housing 11 has a plate shape and has a first surface 21, a second surface 22, and an outer edge 23. The first surface 21 and the second surface 22 are formed in a substantially quadrangular (rectangular) shape extending in the Y-axis direction. That is, the Y-axis direction is also the longitudinal direction of the first surface 21 and the second surface 22. In the embodiment, each of the shapes of the memory card 10, the housing 11, the first surface 21, and the second surface 22 is expressed as a rectangular shape, but other shapes can also be used.

The first surface 21 is a substantially flat surface facing the positive direction of the Z axis (the direction in which the arrow of the Z axis is directed). As illustrated in FIG. 2, the second surface 22 is located on a side opposite to the first surface 21 and is a substantially flat surface facing in the negative Z-axis direction (the direction opposite to the arrow of the Z axis).

The outer edge 23 is provided between the first surface 21 and the second surface 22 and is connected to the edge of the first surface 21 and the edge of the second surface 22. As illustrated in FIG. 1, the outer edge 23 includes a first edge 31, a second edge 32, a third edge 33, a fourth edge 34, a first corner portion 35, a second corner portion 36, a third corner portion 37, and a fourth corner portion 38.

The first edge 31 extends in the X-axis direction and faces in the positive Y-axis direction. The X-axis direction is the short side direction of the memory card 10, the housing 11, the first surface 21, and the second surface 22 and includes the positive X-axis direction (the direction indicated by the arrow of the X axis) and the negative X-axis direction (the direction opposite to the arrow of the X axis). The X-axis direction is an example of the first direction.

The second edge 32 extends in the Y-axis direction and faces in the negative X-axis direction. The second edge 32 is provided with a recess 32a. In addition, the recess 32a may be omitted. In some cases, a connector into which the memory card 10 is inserted may be provided with a protrusion fitted into the recess 32a. In this case, the protrusion allows the memory card 10 provided with the recess 32a to be inserted into the connector and can prevent the memory card 10 without the recess 32a from being inserted into the connector. Both of the memory cards 10 can be allowed to be inserted into the connector without the protrusion. In this manner, the connector can identify the type of the memory card 10 on the basis of the recess 32a. In addition, the connector can identify more types of the memory card 10 on the basis of the position of the recess 32a of the memory card 10 and the position of the protrusion of the connector. The third edge 33 is located on a side opposite to the second edge 32, extends in the Y-axis direction, and faces in the positive X-axis direction. The fourth edge 34 is located on a side opposite to the first edge 31, extends in the X-axis direction, and faces in the negative Y-axis direction.

The length of each of the second edge 32 and the third edge 33 is larger than the length of each of the first edge 31 and the fourth edge 34. The first edge 31 and the fourth edge 34 constitute the short sides of the substantially rectangular memory card 10, and the second edge 32 and the third edge 33 constitute the long sides of the substantially rectangular memory card 10.

The first corner portion 35 is a corner portion between the first edge 31 and the second edge 32 and connects the end of the first edge 31 in the negative X-axis direction and the end of the second edge 32 in the positive Y-axis direction. The end of the first edge 31 in the negative X-axis direction is an example of one end of the first edge. The end of the second edge 32 in the positive Y-axis direction is an example of the end of the second edge.

The first corner portion 35 extends in a linear shape between the end of the first edge 31 in the negative X-axis direction and the end of the second edge 32 in the positive Y-axis direction. In the X-axis direction, the distance between the end of the first edge 31 in the negative X-axis direction and the second edge 32 is 1.1 mm. In the Y-axis direction, the distance between the end of the second edge 32 in the positive Y-axis direction and the first edge 31 is 1.1 mm.

By setting the corner between the first edge 31 and the second edge 32 to a corner chamfer of so-called C1.1, the first corner portion 35 is provided. According to another expression, in the first corner portion 35, a notch C is formed between the first edge 31 and the second edge 32.

In the embodiment, in the first corner portion 35, a substantially triangular notch C is formed in the corner portion between the first edge 31 and the second edge 32 extending in directions perpendicular to each other. However, the notch C is not limited to this example. For example, in the first corner portion 35, a substantially rectangular notch C recessed inside the housing 11 as compared with the embodiment may be formed.

The second corner portion 36 is a corner portion between the first edge 31 and the third edge 33 and connects the end of the first edge 31 in the positive X-axis direction and the end of the third edge 33 in the positive Y-axis direction. The end of the first edge 31 in the positive X-axis direction is an example of the other end of the first edge. The end of the third edge 33 in the positive Y-axis direction is an example of the end of the third edge.

The second corner portion 36 extends in an arc shape between the end of the first edge 31 in the positive X-axis direction and the end of the third edge 33 in the positive Y-axis direction. The second corner portion 36 extends in a circular arc shape. However, the second corner 36 portion may extend in an elliptic arc shape.

The radius of the second corner portion 36 extending in an arc shape is 0.2 mm. By setting the corner between the first edge 31 and the third edge 33 to a round chamfer of so-called R0.2, the second corner portion 36 is provided. In this manner, the shape of the first corner portion 35 and the shape of the second corner portion 36 are different from each other.

The third corner portion 37 connects the end of the second edge 32 in the negative Y-axis direction and the end of the fourth edge 34 in the negative X-axis direction. The fourth corner portion 38 connects the end of the third edge 33 in the negative Y-axis direction and the end of the fourth edge 34 in the positive X-axis direction. Each of the third corner portion 37 and the fourth corner portion 38 extends in an arc shape having a radius of 0.2 mm.

The memory card 10, the housing 11, the first surface 21 and the second surface 22 are set to have a length of about 18±0.1 mm in the Y-axis direction and a length of about 14±0.1 mm in the X-axis direction. That is, the distance between the first edge 31 and the fourth edge 34 in the Y-axis direction is set to about 18±0.1 mm, and the distance between the second edge 32 and the third edge 33 in the X-axis direction is set to about 14±0.1 mm. In addition, the lengths of the memory card 10, the housing 11, the first surface 21, and the second surface 22 in the X-axis direction and the Y-axis direction are not limited to this example.

As illustrated in FIG. 2, the housing 11 further has an inclined portion 39. The inclined portion 39 is a corner portion between the first surface 21 and the first edge 31 and extends in a linear shape between the end of the first surface 21 in the positive Y-axis direction and the end of the first edge 31 in the positive Z-axis direction.

As illustrated in FIG. 1, the substrate 12, the flash memory 13, and the card controller 14 are provided in the interior of the housing 11. The substrate 12, the flash memory 13, and the card controller 14 may be accommodated in the box-shaped housing 11 or may be embedded in the housing 11.

The substrate 12 is, for example, a printed circuit board (PCB). In addition, the substrate 12 may be another kind of substrate. The flash memory 13 and the card controller 14 are mounted on the substrate 12.

The flash memory 13 is a nonvolatile memory capable of storing information, and is, for example, a NAND type flash memory. In addition, the flash memory 13 may be another flash memory such as a NOR type flash memory. The memory card 10 may have, for example, a plurality of stacked flash memories 13.

The card controller 14 can control overall the flash memory 13 and the memory card 10 including the flash memory 13. For example, the card controller 14 can perform control of read/write with respect to the flash memory 13 and control of communication with the outside. This control of communication includes protocol control corresponding to a Peripheral Component Interconnect express (PCIe) standard (hereinafter, simply referred to as a PCIe). In addition, the card controller 14 may indirectly control the flash memory 13 via other electronic components that control the flash memory 13.

The protective sheet 15 is attached to the first surface 21. The protective sheet 15 seals a test terminal exposed to, for example, the first surface 21. The protective sheet 15 is not limited to this example.

The memory card 10 further has a plurality of terminals P. In the embodiment, the memory card 10 has twenty-six terminals P. In addition, the number of terminals P is merely an example and is not limited to this example. That is, the number of terminals P may be less than 26 or more than 26. The plurality of terminals P are provided, for example, in the substrate 12. The plurality of terminals P are metal plates attached to the first surface 21. In the embodiment, the second surface 22 is not provided with the terminal P and can be used, for example, for a printing surface or a heat dissipating surface.

In the embodiment, the plurality of terminals P are arranged in two rows to form a first row R1 and a second row R2. The plurality of terminals P may be arranged in three or more rows to form a plurality of second rows R2.

Thirteen terminals P are arranged in the X-axis direction with intervals interposed between the terminals to constitute the first row R1. Hereinafter, in some cases, the thirteen terminals P constituting the first row R1 may be individually referred to as terminals P1 to P13. The number of terminals P constituting the first row R1 is not limited to 13. The terminals P constituting the first row R1 are arranged in order from the terminal P1 closest to the second edge 32 to the terminal P13 closest to the third edge 33.

The terminals P1 to P13 are arranged in the X-axis direction along the first edge 31 in the vicinity of the first edge 31. The first row R1 constituted by the terminals P1 to P13 and the terminals P1 to P13 is spaced from the first edge 31. However, the distance between the first row R1 and the first edge 31 is shorter than the distance between the first row R1 and the fourth edge 34. In addition, the terminals P1 to P13 and the first row R1 may be adjacent to the first edge 31.

Thirteen terminals P are arranged in the X-axis direction with intervals interposed between the terminals to constitute a second row R2. Hereinafter, the thirteen terminals P constituting the second row R2 may be individually referred to as terminals P14 to P26. In addition, the number of terminals P constituting the second row R2 is not limited to thirteen. In addition, the number of terminals P constituting the second row R2 may be larger or smaller than the number of terminals P constituting the first row R1. The terminals P constituting the second row R2 are arranged in order from the terminal P14 closest to the second edge 32 to the terminal P26 closest to the third edge 33.

The plurality of terminals P constituting the second row R2 are arranged at a position further away from the first edge 31 than away from the first row R1. For this reason, the second row R2 is farther away from the first edge 31 than away from the first row R1. The first row R1 and the second row R2 are arranged in the Y-axis direction with an interval interposed between the rows.

As described above, the plurality of terminals P are arranged in the X-axis direction. In this case, at least a portion of one terminal P is located in the region between an end of another terminal P in the positive Y-axis direction and an end of the other terminal P in the negative Y-axis direction that is adjacent in the Y-axis direction. In each of the first row R1 and the second row R2, one terminal P may protrude in the positive Y-axis direction from an end of another terminal P in the positive Y-axis direction or may protrude in the negative Y-axis direction from an end of the other terminal P in the negative Y-axis direction. That is, the position of each terminal P may be shifted in the Y-axis direction. By aligning the ends of the terminals P in the negative Y-axis direction in the same rows R1 and R2, the electrical characteristics of the terminals P can be allowed to be similar in a case where the contact positions of the connectors are aligned in the Y-axis direction.

The plurality of terminals P may have shapes different from each other. For example, in the first row R1, the shapes of the terminals P1, P4, P7, P10, and P13 and the shapes of the terminals P2, P3, P5, P6, P8, P9, P11, and P12 are different from each other. In addition, in the second row R2, the shapes of the terminals P14, P17, P18, P19, P21, P24, and P25 and the shapes of the terminals P15, P16, P20, P22, P23, and P26 are different from each other. Furthermore, in the embodiment, in each of the first row R1 and the second row R2, the distance between the plurality of terminals P is substantially constant. However, the distance between the plurality of terminals P may be different. In the connector to be attached in the Y-axis direction, the terminals P1, P4, P7, P10, P13, P14, P17, P18, P19, P21, P24, and P25 which are power supply terminals and ground terminals of the memory card 10 are set to be longer than the terminals P2, P3, P5, P6, P8, P9, P11, P12, P15, P16, P20, P22, P23, and P26 which are signal terminals. Accordingly, since the connector first comes into contact with the power supply terminal and the ground terminal, the connector is electrically stable, and thus, it is possible to avoid applying an electrical stress to the signal terminals. When a voltage is applied to the signal terminal before power is supplied to the card controller 14, an electrical stress is applied to the input buffer of the interface circuit 51 described later.

Signals used for communication in accordance with a predetermined interface standard are assigned to the plurality of terminals P. However, signals used for communication in accordance with a plurality of interface standards may be assigned to the plurality of terminals P.

FIG. 3 is an exemplary table listing an example of signal assignment of the plurality of terminals P according to the first embodiment. As illustrated in FIG. 3, in the embodiment, signals used for the data communication in accordance with the PCIe are assigned to a plurality of terminals P in the first row R1. In the PCIe, differential data signal pairs can be used for data communication.

In the first row R1, the ground (GND) ground potential is assigned to the terminals P1, P4, P7, P10, and P13 and the reception differential signals PERp0, PERn0, PERp1, and PERn1 is assigned to the terminals P2, P3, P8, and P9 and the transmission differential signals PETp0, PETn0, PETp1, and PETn1 are assigned to the terminals P5, P6, P11, and P12.

The terminals P1, P4, P7, P10, and P13 are examples of the ground terminals. The reception differential signals PERp0, PERn0, PERp1, and PERn1 and the transmission differential signals PETp0, PETn0, PETp1, and PETn1 are examples of signals and differential data signals. The terminals P2, P3, P5, P6, P8, P9, P11, and P12 are examples of the signal terminals, the first signal terminals, and the differential data signal terminals.

A pair of the terminals P2 and P3 to which the reception differential signals PERp0 and PERn0 are assigned is located between the two terminals P1 and P4 and is surrounded by the two terminals P1 and P4. A pair of the terminals P5 and P6 to which the transmission differential signals PETp0 and PETn0 are assigned is located between the two terminals P4 and P7 and is surrounded by the two terminals P4 and P7.

A pair of the terminals P8 and P9 to which the reception differential signals PERp1 and PERn1 are assigned is located between the two terminals P7 and P10 and is surrounded by the two terminals P7 and P10. A pair of the terminals P11 and P12 to which the transmission differential signals PETp1 and PETn1 are assigned is located between the two terminals P10 and P13 and is surrounded by the two terminals P10 and P13.

In the PCIe, data are serially transmitted, but in order to be able to generate a clock in the reception circuit and to prevent the voltage level from being deviated to a high level or a low level due to the same logic level continuing to the data, encoding is performed for each unit. Methods such as 8B10B and 128$b$/130$b$ are used for the encoding. With this encoding, the average signal voltage level at the time of the data transmission can be allowed to be in the vicinity of the common voltage, and thus, the deviation from the reception threshold level can be reduced. In addition, since the reception side can generate a reception clock following the temporal fluctuation of the data by generating the reception clock from the change point of the data, stable data reception becomes possible. Even in a case where there is deviation between a plurality of lanes (upward and downward pairs of differential data signals), the start positions of the received data are aligned by configuring the reception circuit independently in each lane, so that the skew between the lanes can be allowed to be cancelled.

For example, in the case of the PCIe 3.0, the maximum transmission rate is 2 Gbytes/second per lane (sum of upward and downward transmission rates). In the PCIe, one lane may be configured by one set of the transmission differential signals PETp0 and PETn0 and the reception differential signals PERp0 and PERn0. In the PCIe, furthermore, one lane can be configured by one set of the transmission differential signals PETp1 and PETn1 and the reception differential signals PERp1 and PERn1. In this manner, since two lanes are assigned to the plurality of terminals P constituting the first row R1, the number of lanes of the PCIe can be increased, and thus, the data transmission rate can be improved.

In the PCIe, it is possible to recognize a multiple-lane configuration at initialization and to transmit one data with the multiple lanes. In addition, in a case where the host apparatus does not support the multiple lanes, the memory card 10 can operate in a one-lane mode.

The terminals P2, P3, P5, P6, P8, P9, P11, and P12 transmit differential data signals in accordance with the PCIe and enable bi-directional communication. The terminals P2, P3, P5, P6, P8, P9, P11, and P12 transmit differential data signals with frequencies in a GHz band.

Control signals used for controlling communication in the PCIe are assigned to the plurality of terminals P of the second row R2. GND is assigned to the terminals P14 and P17 in the second row R2; reference differential clock signals REFCLKp and REFCLKn are assigned to the terminals P15 and P16; a second power supply (power rail) PWR2 is assigned to the terminals P18 and P19; a reset signal PERST# is assigned to the terminal P20; a first power supply (power rail) PWR1 is assigned to the terminal P21; a power management control signal CLKREQ# is assigned to the terminal P22; control signals CNTA and CNTB are assigned to the terminals P23 and P26; and a third power supply (power rail) PWR3 is assigned to the terminals P24 and P25.

The terminals P15, P16, P20, P22, P23, and P26 are examples of the signal terminals and the second signal terminals. The terminals P15 and P16 are examples of the differential clock signal terminals. The terminals P20, P22, P23, and P26 are examples of the single-end signal terminals. The terminals P20 and P22 are examples of the sideband signal terminals. The terminals P18, P19, P21, P24, and P25 are examples of the power supply terminals. The terminals P18 and P19 are examples of the second power supply terminals. The terminal P21 is an example of the first power supply terminal. The terminals P24 and P25 are examples of the third power supply terminal. By providing the plurality of terminals Pas the power supply terminals, the current is dispersed, and thus, the current flowing per terminal is reduced, so that the drop voltage due to the resistance component existing between the power supply circuit and the power supply terminal can be reduced.

The two reference differential clock signals REFCLKp/n constitute a differential clock signal. By transmitting a clock signal having a frequency in a MHz band from the host apparatus to the terminals P15 and P16, the memory card 10 can facilitate synchronization with the host apparatus to which the memory card 10 is attached. In this manner, the frequencies of the clock signals used for transmission at the terminals P15 and P16 are set to be lower than the frequencies of the differential data signals used for transmission by the terminals P2, P3, P5, P6, P8, P9, P11, and P12, the generation of EMI can be lowered by making a waveform close to a sinusoidal wave.

The host apparatus is an information processing apparatus such as a personal computer, a portable terminal such as a mobile phone, a digital camera, an imaging apparatus, a tablet computer or a smartphone, a game device, an in-vehicle terminal such as a car navigation system, or other apparatuses.

The memory card 10 generates the bit clock by multiplying the received reference differential clock by a PLL oscillation circuit. Data is output from the transmission differential signals PETp0, PETn0, PETp1, and PETn1 in synchronization with the bit clock. The data read from the reception differential signals PERp0, PER0, PERp1, and PERn1 are aligned as one data in synchronization with the bit clock. That is, it is possible to resynchronize the data, once received by the reception clock generated from the code, with the reference differential clock.

The reset signal PERST# can be used to allow the host apparatus to reset the bus used for communication in accordance with the PCIe. The initialization start timing of the PCIe differential lane is regulated by the timing specification of reset release of the PCIe. This reset signal PERST# can be used when the host apparatus reinitializes the memory card 10 at the occurrence of an error or the like.

The power management control signal CLKREQ# can be used as a clock for recovering from the power saving mode. In the power saving mode, it is possible to reduce the power consumption by stopping the high-frequency bit clock used for the data transmission.

The control signals CNTA and CNTB can be used to control various functions. For example, as described below, the control signal CNTB can be used to determine whether or not the power supply voltage PWR3 is required for the initialization of the PCIe, to determine whether or not the power supply voltage PWR2 is required, or whether or not operations can be performed with only the power supply voltage PWR1.

The reset signal PERST#, the power management control signal CLKREQ#, and the control signals CNTA and CNTB are single-end signals. In addition, the reset signal PERST# and the power management control signal CLKREQ# are sideband signals of the PCIe.

By allowing the memory card 10 to support the communication in accordance with the PCIe, it is possible to use the standard physical layer (PHY: Physical Layer) of the PCIe. For this reason, it is possible to facilitate the design for increasing the data transmission rate of the memory card 10 and to reduce the development cost.

Furthermore, the memory card 10 supports the communication in the PCIe, so that Non Volatile Memory express (NVMe) can be adopted for the data link layer of the PCIe. For this reason, overhead at the time of data transmission can be reduced, and thus, data transmission efficiency can be improved.

The host apparatus can supply the power supply voltage PWR1 as the first power supply to the terminal P21. The power supply voltage PWR1 is set to 3.3 V in the embodiment. The power supply voltage notation indicates the median value, and some voltage variation width is allowed. The power supply voltage PWR1 may be set, for example, in a range from 2.5 V to 3.3 V, but the power supply voltage is not limited to this example.

The host apparatus can supply the power supply voltage PWR2 as the second power supply to the terminals P18 and P19. The power supply voltage PWR2 is an example of the second power supply voltage. In the embodiment, the power supply voltage PWR2 is set to 1.8 V. That is, the power supply voltage PWR2 is equal to or lower than the power supply voltage PWR1. The power supply voltage PWR2 can be set to be, for example, in a range from 1.2 V to 1.8 V, but the power supply voltage is not limited to this example.

The host apparatus can supply the power supply voltage PWR3 as the third power supply to the terminals P24 and P25. The power supply voltage PWR3 is an example of the first power supply voltage. In the embodiment, the power supply voltage PWR3 is set to 1.2 V. That is, the power supply voltage PWR3 is equal to or lower than the power supply voltage PWR2. The power supply voltage PWR3 is not limited to this example.

Figure 4:
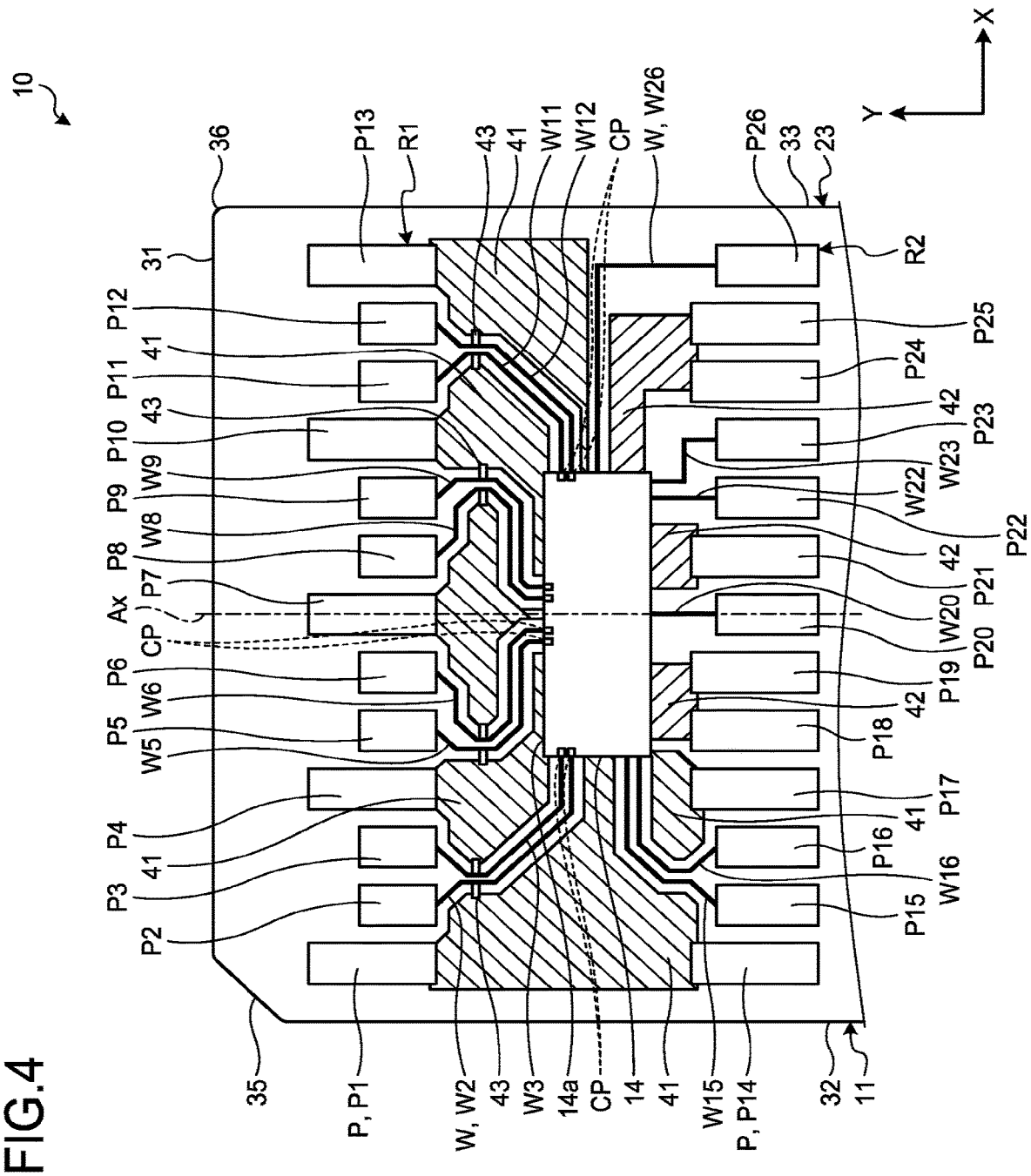
FIG. 4 is an exemplary plan view schematically illustrating wire lines of the memory card in the first embodiment.

FIG. 4 is an exemplary plan view schematically illustrating wire lines of the memory card 10 of the first embodiment. As illustrated in FIG. 4, the card controller 14 is located between the first row R1 and the second row R2. In addition, the card controller 14 may be disposed at another position. For example, the card controller 14 may be disposed at another position, for example, between the end of the terminal P included in the first row R1 in the positive Y-axis direction and the end of the terminal P included in the second row R2 in the negative Y-axis direction. In addition, the card controller 14 may be disposed such that the terminals P included in the second row R2 are located between the end of the card controller 14 in the positive Y-axis direction and the end of the card controller 14 the negative Y-axis direction.

The card controller 14 has a plurality of connection terminals CP. The plurality of connection terminal CP are the terminals of the card controller 14 to which the reception differential signals PERp0, PERn0, PERp1, and PERn1 and the transmission differential signals PETp0, PETn0, PETp1, and PETn1 are assigned. The plurality of connection terminals CP are provided on a portion of the sides 14a of the card controller 14 and are located between the first row R1 and the second row R2. It is preferable that the connection terminals CP are disposed such that the wire lines between the connection terminals CP and the terminals P do not intersect.

The memory card 10 further includes a plurality of wire lines W, a plurality of ground planes 41, a plurality of power supply wire lines 42, and a plurality of ESD protection diodes 43. FIG. 4 schematically illustrates the card controller 14, the terminals P, the wire lines W, the ground planes 41, the power supply wire lines 42 and the ESD protection diodes 43 on the same plane for the explanation. In addition, in FIG. 4, hatching is given to the ground planes 41 and the power supply wire lines 42 for the explanation.

In the embodiment, the plurality of terminals P are assigned such that a plurality of wire lines W, the plurality of ground planes 41, and the plurality of power supply wire lines 42 do not overlap each other. For this reason, the wire lines W, the ground planes 41, and the power supply wire lines 42 are efficiently formed without via-holes.

The plurality of wire lines W include wire lines W2, W3, W5, W6, W8, W9, W11, and W12 connecting the connection terminal CP of the card controller 14 and the terminals P2, P3, P5, P6, P8, P9, P11, and P12. In addition, the plurality of wire lines W include wire lines W15, W16, W20, W22, W23, and W26 connecting the card controller 14 and the terminals P15, P16, P20, P22, P23, and P26.

The lengths of wire lines W2, W3, W5, W6, W8, W9, W11, and W12 are set to be equal to each other. In addition, the wire lines W2, W3, W5, W6, W8, W9, W11, and W12 are provided mirror-symmetrically with respect to the center axis Ax extending in the Y-axis direction through the center of the terminal P7. For this reason, it is easy to design the wire lines W2, W3, W5, W6, W8, W9, W11, and W12. In addition, the lengths of the wire lines W15 and W16 are set to be equal to each other.

The wire lines W2, W3, W5, W6, W8, W9, W11, and W12 are wired with equal length to eliminate interline skew. It is necessary to bend the wire line in order to adjust the length, but since it is difficult to draw a pattern with a normally smooth curve, at the time of changing the wire line direction, the wire lines at a plurality of places are bent at not 90° but 45°. Although the width of wire line W is slightly increased at the bending portion, a change in characteristic impedance occurs, and thus, noise is generated from the portion. Since the fluctuation of the width is smaller at 45° than at 90°, the occurrence of noise is suppressed.

The plurality of ground planes 41 surround the wire lines W2, W3, W5, W6, W8, W9, W11, W12, W15, and W16. According to another expression, the wire lines W2, W3, W5, W6, W8, W9, W11, W12, W15, and W16 pass between the plurality of ground planes 41. Accordingly, a return path can be ensured for each of the differential signals, mutual interference between the differential signals is reduced, and thus, the operation signal level is stabilized.

The power supply wire line 42 is connected to the terminals P18, P19, P21, P24, and P25. The width of the power supply wire line 42 is larger than the width of wire line W. For this reason, the current that can flow through the power supply wire line 42 is increased, and the heat dissipation through the power supply wire line 42 can be efficiently performed. In addition, the memory card 10 can dissipate heat from the plurality of terminals P.

Since resistance components or inductance components of the wire lines and the connectors exist, voltage drop occurs between a host power output and a memory card terminal. In a case where an allowable variation range of the power supply voltage is a constant ratio to the power supply voltage, the lower the voltage is, the smaller the allowable voltage variation width is. Therefore, since the voltage drop exists, it is difficult to control the power supply voltage such that the power supply voltage of the card terminal can be maintained within the allowable voltage variation width from the host apparatus as the power supply voltage is lower.

On the other hand, the resistance values of the wire lines including the connector of the host apparatus and the power supply wire line 42 are similar resistance values regardless of the voltage for the same substrate and the same connector. For this reason, when the power supply voltage is low, the current value that can flow through one terminal P is decreased.

In the embodiment, the power supply voltage PWR2 flows to two terminals P18 and P19. In addition, the power supply voltage PWR3 flows to two terminals P24 and P25. In this manner, the current is distributed to the plurality of terminals P18, P19, P24, P25, and thus, the current value per one terminal P is set to be small, so that it is possible to reduce the drop voltage due to the resistance component of the power supply wire line 42 and the connector of the host apparatus. Therefore, the host apparatus makes it easier for the power supply voltage to be maintained within allowable voltage variation width. Furthermore, the power supply voltages PWR2 and PWR3 are set to the same voltage, so that it is possible to supply a larger current.

In addition, generally, the PWR1 is 3.3 V±5% and PWR2 is 1.8 V±5%. However, as described above, the power supply voltage PWR1 may be set to be within a voltage range that is wider on a lower side such as 2.5-5% to 3.3 V+5%, and the power supply voltage PWR2 may be set to be within a voltage range that is wider on a lower side such as 1.2-5% to 1.8 V+5%. Accordingly, it is possible to lower the voltage and reduce the power consumption.

The ESD protection diode 43 connects each of the wire lines W2, W3, W5, W6, W8, W9, W11, and W12 to the ground plane 41. The ESD protection diode 43 is disposed between the terminal P and the connection terminal CP and absorbs static electricity intruding from the terminals P2, P3, P5, P6, P8, P9, P11, and P12.

When the plurality of connection terminals CP are located between the first row R1 and the second row R2, the wire lines W2, W3, W5, W6, W8, W9, W11, and W12 can be set without bypassing other wire lines or other parts or passing between the plurality of terminals P included in the second row R2. For this reason, the lengths of the wire lines W2, W3, W5, W6, W8, W9, W11, and W12 can be decreased, and the ESD protection diodes 43 can be disposed effectively. In the embodiment, the ESD protection diode 43 is disposed in the vicinity of the terminal P included in the first row R1.

The memory card 10 is attached to the connector of the host apparatus. For example, the memory card 10 is inserted into a slot of a push-pull connector, so that the memory card is attached to the connector. In addition, the memory card 10 may be attached to another type of connector.

The memory card 10 of the embodiment is inserted into the slot of the connector from the first edge 31 of FIG. 1 where the notch C is provided. Accordingly, in a state where the memory card 10 is attached to the connector, the first edge 31 is located at the inner side of the connector than the fourth edge 34.

By forming the notch C between the first edge 31 and the second edge 32 in the first corner portion 35, it is prevented that the memory card 10 is inserted into the slot of the connector slot in a state where the front and back sides are reversed. For example, when the memory card 10 is inserted into the slot of the connector in the correct direction, the notch C avoids the member of the interior of the connector. On the other hand, when the memory card 10 is inserted into the slot of the connector in reverse, the member of the interior of the connector interferes with, for example, the second corner portion 36 and prevents the memory card 10 from being completely inserted. In addition, when the memory card 10 is inserted into the connector from the fourth edge in a state where the Y-axis direction becomes a reverse direction, the memory card 10 cannot be attached to the connector in the same manner. In the vicinity of the second corner portion 36 formed between the first edge 31 and the third edge 33, the edge in the X-axis direction and the edge in the Y-axis direction are brought into close contact with the connector, so that the deviation of the connector and the memory card 10 in the rotational direction can be reduced.

When the memory card 10 is inserted into the connector, the lead frame of the connector comes into contact with each of the plurality of terminals P. An inclined portion 39 is provided in the memory card 10, and the distal end of the memory card 10 is tapered. For this reason, the lead frame can be guided by the inclined portion 39, and thus, for example, the friction between the lead frame and the housing 11 is reduced. Accordingly, the peeling of the plating of the lead frame is suppressed, and thus, the abrasion resistance of the connector is improved.

When the lead frame comes into contact with the terminal P, the controller (hereinafter, referred to as a host controller) of the host apparatus, and the card controller 14 of the memory card 10 is electrically connected via the wire line of the host apparatus and the wire line W of the memory card 10.

The connection point of the connector on the host controller side, such as the terminal of the connector for mounting on the substrate of the host apparatus is generally provided at the inner side of the slot of the connector (upward direction in FIG. 1). For this reason, the length of the wire line between the contact point of the terminal P and the lead frame constituting the first row R1 and the host controller is likely to be decreased. On the other hand, the length of the wire line between the contact point of the terminal P and the lead frame constituting the second row R2 and the host controller is likely to be lengthened in order to bypass, for example, the first row R1.

In the memory card 10 of the embodiment, the terminals P2, P3, P5, P6, P8, P9, P11, and P12 for high-speed transmission of the differential data signals are included in the first row R1 where the wire line length to the host controller becomes shorter. Accordingly, the physical layer (PHY) of the host apparatus approaches the physical layer (PHY) of the memory card 10, so that the signal integrity can be easily ensured in the transmission of the differential data signals of the memory card 10.

Figure 5:
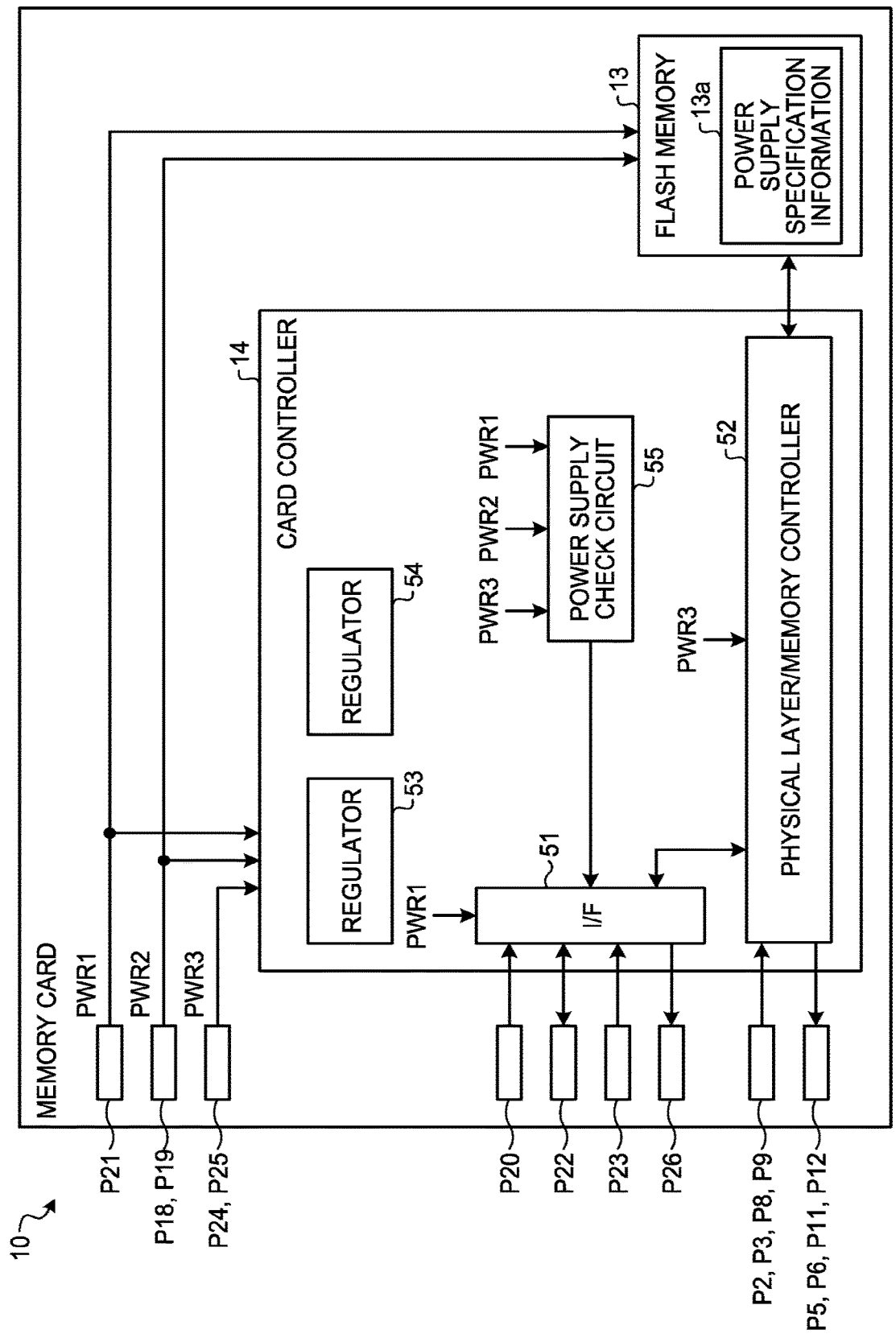
FIG. 5 is an exemplary block diagram schematically illustrating a first example of a configuration of the memory card in the first embodiment.

FIG. 5 is an exemplary block diagram schematically illustrating a first example of the configuration of the memory card 10 of the first embodiment. The card controller 14 includes an interface circuit (I/F) 51, a physical layer/memory controller 52, two regulators 53 and 54, and a power supply check circuit 55. The physical layer of the card controller 14 and the physical layer/memory controller 52 are illustrated in one block in FIG. 5 and also described below collectively.

An I/F 51 can cope with a single-end signal. The I/F 51 is provided with, for example, an input buffer and an output buffer. The reset signal PERST#, the power management control signal CLKREQ#, and the control signal CNTA can be input to the input buffer from the terminals P20, P22, and P23. The output buffer can output the response to the power management control signal CLKREQ# and the control signal CNTB through the terminals P22 and P26.

The physical layer/memory controller 52 can handle differential signals. The physical layer/memory controller 52 are provided with a receiver and a transmitter. The reception differential signals PERp0, PERn0, PERp1, and PERn1 can be input to the receiver. The transmitter can output the transmission differential signals PETp0, PETn0, PETp1, and PETn1.

The physical layer/memory controller 52 and the power supply check circuit 55 are connected to the I/F 51. The physical layer/memory controller 52 are connected to the flash memory 13. Besides the physical layer of the PCIe, a data link layer and a transaction layer of the PCIe may be provided in the card controller 14.

The physical layer/memory controller 52 can perform serial/parallel conversion, parallel/serial conversion, data symbolization, and the like. The symbolization is a process of replacing 0 or 1 with a certain number or more of non-consecutive symbols when 0 or 1 of data is consecutive, with a value where the total number of 0 and the total number of 1 are equal or close to each other among the codes of the 8B10B, 128*b*/130*b*, and the like. With this symbolization, the average signal voltage level can be allowed to be in the vicinity of the common voltage, and thus, the deviation from the reception threshold level can be suppressed. In addition, when the same symbol pattern is repeatedly transmitted, harmonics of a specific frequency are increased. However, the pattern is switched to a plurality of symbols with different patterns so as not to be repeated patterns, so that the harmonics of a specific frequency can be allowed not to be large. That is, the occurrence of ElectroMagnetic Interference (EMI) can be suppressed.

In addition, in the transaction layer of the PCIe, it is possible to packetize data or to add a command or the like to the header of a packet. In the data link layer of the PCIe, it is possible to add a sequence number or a Cyclic Redundancy Check (CRC) code to a packet received from the transaction layer. The sequence number can be used for checking transmission of packets or the like.

When serial reception differential signals PERp0, PERn0, PERp1, and PERn1 are transmitted from the host apparatus to the memory card 10, the serial reception differential signals are converted into the reception signals of the parallel data by the receiver. When a transmission signal of the parallel data is transmitted to the transmitter, the transmission signal is converted into the serial transmission differential signals PETp0, PETn0, PETp1, and PETn1 to be transmitted to the host apparatus.

The power supply voltage PWR1 is supplied to the flash memory 13 and the card controller 14. In the embodiment, the power supply voltage PWR1 is used for operations of the flash memory 13, such as read/write of the flash memory 13.

As described above, the power supply voltage PWR1 is equal to or higher than the power supply voltage PWR2 and is equal to or higher than the power supply voltage PWR3. The power supply voltage PWR1 can satisfy the write voltage of the flash memory 13.

In a case where the host apparatus and the memory card 10 are connected with a signal voltage of 3.3 V, the power supply voltage PWR1 is used for an I/O power supply. The power supply voltage PWR1 may be used as an I/O power supply even in a case where the host apparatus and memory card 10 are connected with a signal voltage of 1.8 V as in the example of FIG. 5. Accordingly, the memory card 10 has a high withstand voltage, and thus, a card input circuit is protected. For example, if the power supply voltage PWR1 is set to 2.5 V, the memory card 10 can be set to a withstand voltage of 2.5 V. When the power supply voltage PWR1 is set to 3.3 V, the memory card 10 can be set to a withstand voltage of 3.3 V.

The power supply voltage PWR2 is supplied to the flash memory 13 and the card controller 14. In the embodiment, the power supply voltage PWR2 is used as a power supply of a logic circuit. The power supply voltage PWR2 is also used as an interface voltage between the flash memory 13 and the card controller 14.

When the host apparatus and the memory card 10 are connected with a 1.8 V signal voltage, the power supply voltage PWR2 may be used for an I/O power supply. In this case, the memory card 10 can be set to a withstand voltage of 1.8 V.

The power supply voltage PWR3 is supplied to the card controller 14. In the embodiment, the power supply voltage PWR3 is used as a power supply of a physical layer (PHY) of a differential signal circuit and an analog circuit.

In general, a power supply with little noise is used for a differential signal circuit which operates analogously, and the power supply is separated from a digital power supply. In the embodiment, the power supply voltage PWR3 supplied from the host apparatus needs to be a power supply that is sufficiently stabilized and has little noise.

As described above, in the memory card 10, the three power supply voltages PWR1, PWR2, and PWR3 are separated and supplied in order to reduce the influence of noise and the power supply fluctuation. That is, the three power supply voltages PWR1, PWR2, and PWR3 are selectively used depending on the application.

Figure 6:
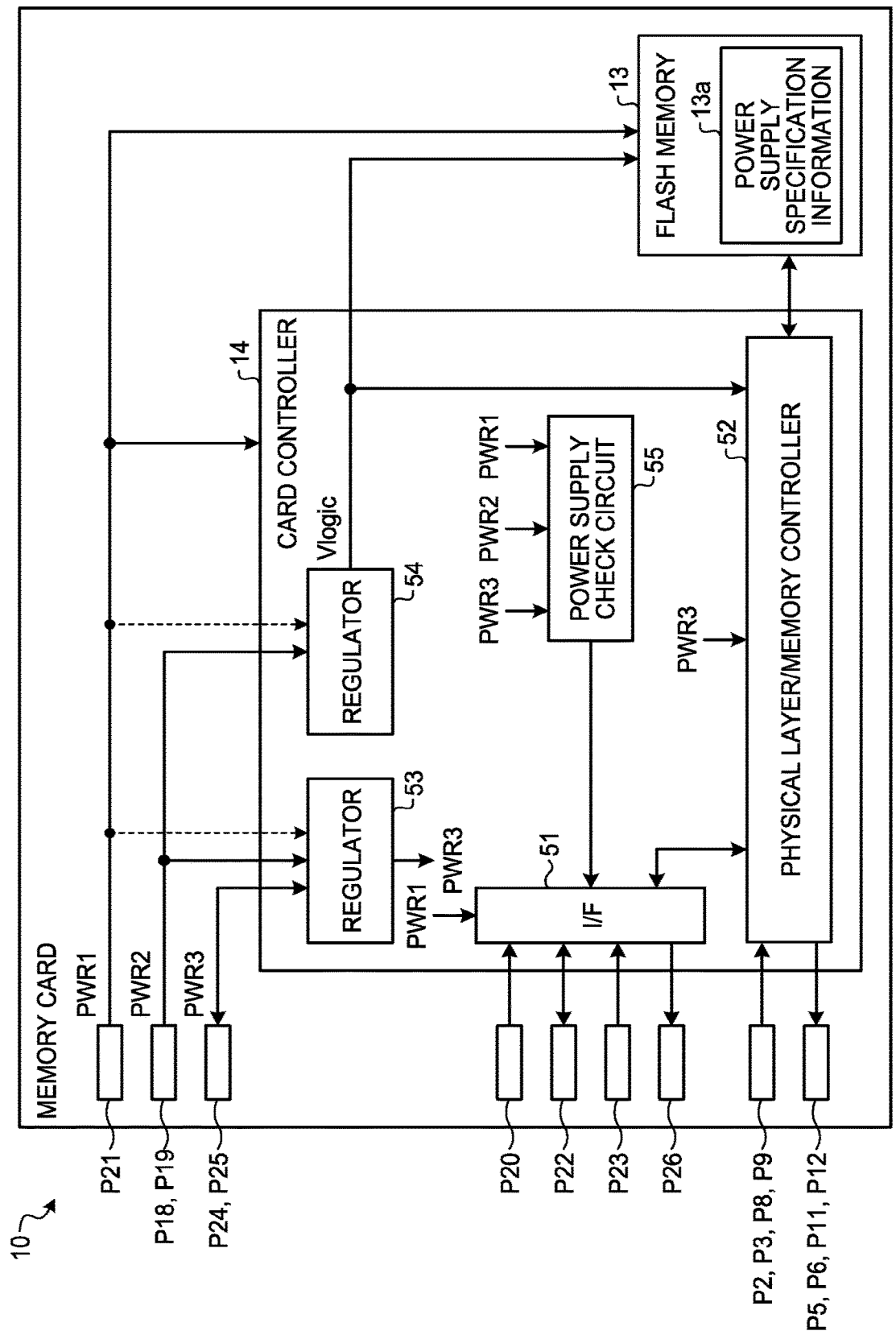
FIG. 6 is an exemplary block diagram schematically illustrating a second example of the configuration of the memory card in the first embodiment.

FIG. 6 is an exemplary block diagram schematically illustrating a second example of the configuration of the memory card 10 of the first embodiment. As illustrated in FIG. 6, the power supply voltage PWR2 may be supplied to the regulators 53 and 54. In addition, the terminals P24 and P25 to which the power supply voltage (third power supply) PWR3 is assigned may be set to the ground level. This is the case of using the memory card 10 operating with two power supplies of the power supply voltage PWR1 and the power supply voltage PWR2.

As in the example of FIG. 6, the regulator 54 generates a power supply voltage Vlogic lower than the input the power supply voltage PWR2. This power supply voltage Vlogic is supplied to the flash memory 13, the physical layer of the card controller 14, and the physical layer/memory controller 52 instead of the power supply voltage PWR2. The power supply voltage Vlogic is used as a power supply for the logic circuit and also as an interface voltage between the flash memory 13 and the card controller 14. By reducing the interface voltage, data transmission can be performed at a high speed between the flash memory 13 and the card controller 14, and power consumption is also reduced. In general, as the signal voltage is lowered, the rising/falling time of the signal can be allowed to be shortened, so that high speed data transmission becomes possible.

As in the example of FIG. 6, when the terminals P24 and P25 are connected to ground, the regulator 53 generates the power supply voltage PWR3 lower than the power supply voltage PWR2 from the input the power supply voltage PWR2. In a case where it is difficult to supply a stable power supply voltage PWR3 from the host apparatus for reasons such as environment, the problem can be solved by using the power supply voltage PWR3 generated by the regulator 53.

The power supply voltages PWR3, Vlogic are both generated from the power supply voltage PWR2. The power supply voltage PWR3 and the power supply voltage Vlogic may be the same voltage or different voltages, but in order that the power supply voltages do not influence each other by separating the power supply voltages, the power supply voltages are generated by separate regulator 53 and regulator 54. In addition, by using Low Drop Out (LDO) as the regulators 53 and 54, unnecessary power consumption due to input/output voltage difference can be reduced.

As illustrated by the broken lines in FIG. 6, the regulator 53 may generate the power supply voltage PWR3 from the power supply voltage PWR1, and the regulator 54 may generate the power supply voltage Vlogic from the power supply voltage PWR1. That is, the memory card 10 can operate if the power supply voltage PWR1 exists.

As described above, the memory card 10 operates according to the power supply voltage PWR1, the power supply voltages PWR1 and PWR2, or the power supply voltages PWR1, PWR2, and PWR3 applied to the terminals P18, P19, P21, P24, and P25. The memory card 10 may switch the power mode according to a combination of the power supply voltages PWR1, PWR2, and PWR3 applied to the terminals P18, P19, P21, P24, and P25.

The host apparatus can cope with the power supply configuration of the memory card 10 by acquiring power supply specification information 13a of the memory card 10 stored in the flash memory 13 by the following power supply check sequence. The power supply specification information 13a includes, for example, voltage ranges, maximum currents (continuous), and peak currents (100 μs period) of the power supply voltages PWR1, PWR2, and PWR3.

Figure 7:
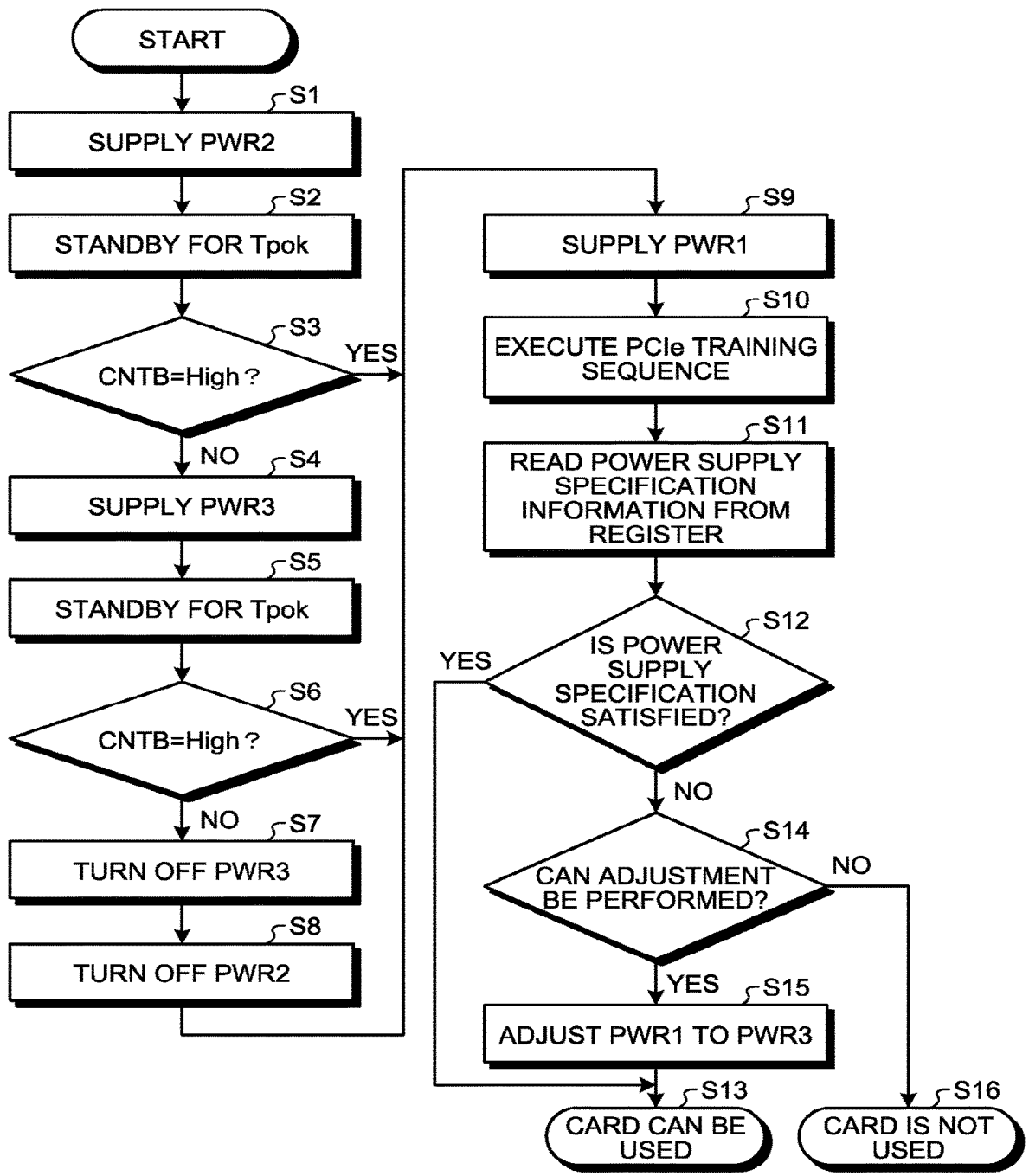
FIG. 7 is an exemplary flowchart illustrating operations of a host apparatus in a power supply check sequence of the memory card in the first embodiment.

FIG. 7 is an exemplary flowchart illustrating the operation of the host apparatus in the power supply check sequence of the memory card 10 of the first embodiment. The initialization of the PCIe is performed before the host apparatus acquires the power supply specification information 13a from the flash memory 13. For this reason, the host apparatus determines whether or not the initialization can be started with a combination of the power supply voltages PWR1, PWR2, and PWR3 to be supplied in the power supply check sequence.

As illustrated in FIG. 7, the host apparatus supplies (applies) the power supply voltage PWR2 to the terminals P18 and P19 of the memory card 10 inserted in the slot of the connector (S1).

As illustrated in FIG. 5, the power supply voltage PWR2 is input to the power supply check circuit 55. In a case where the initialization by the PCIe can be started by the applied the power supply voltage PWR2, the power supply check circuit 55 drives CNTB=High. At this point, it is assumed that the PWR1 is not supplied but the PWR1 is supplied before the initialization is started.

In a case where the initialization by the PCIe cannot be started by the applied the power supply voltage PWR2, the power supply check circuit 55 maintains CNTB=Low.

The host apparatus checks the level of the control signal CNTB (S3) after a certain time Tpok has elapsed (S2). The power supply check circuit 55 can switch the level of the control signal CNTB from Low to High during the time Tpok. For this reason, the host apparatus may check the level of control signal CNTB once after the time Tpok has elapsed. In a case where CNTB=Low is maintained (S3: No), the host apparatus supplies (applies) the power supply voltage PWR3 to the terminals P24 and P25 of the memory card 10 (S4).

The power supply check circuit 55 drives CNTB=High in a case where the initialization by the PCIe can be started by the applied the power supply voltage PWR3. At this point, it is assumed that the PWR1 is not supplied but the PWR1 is supplied before the initialization is started. On the other hand, the power supply check circuit 55 maintains CNTB=Low in a case where the initialization by the PCIe cannot be started by the applied the power supply voltage PWR3. For example, the power supply check circuit 55 maintains CNTB=Low in a case where the initialization by the PCIe can be started by the power supply voltage PWR1.

The host apparatus checks the level of the control signal CNTB (S6) after a certain time Tpok has elapsed (S5). In a case where CNTB=Low is maintained (S6: No), the host apparatus turns off the power supply voltage PWR3 (S7) and turns off the power supply voltage PWR2 (S8) in the reverse order of application. In this example, the power not used by the card is turned off, but the power not used by the card may be maintained to be turned on.

In a case where CNTB=High at the time of checking the level of the control signal CNTB (S3: Yes and S6: Yes), or in a case where the power supply voltage PWR2 is turned off (S8), the host apparatus supplies (applies) the power supply voltage PWR1 to the terminal P21 of the memory card 10 (S9). That is, the power supply voltage PWR1 is always supplied before the initialization is started.

As described above, in a case where the power supply voltage PWR1 is not applied to the terminal P21, the control signal CNTB output to the terminal P26 is used as the output of the result of the power supply check circuit 55. When the power supply check circuit 55 detects the power supply voltage PWR1, the memory card 10 can switch the CNTB output to the terminal P26 to an output signal for another purpose. In addition, since the control signal CNTB is output with the signal voltage of the power supply voltage PWR2, the power supply voltage PWR2 is first applied in the power supply check sequence.

Next, the host apparatus executes the training sequence of the PCIe (S10). With this training sequence, detection of the physical layer, training of the physical layer, and the like are performed, and thus, the host apparatus and the memory card 10 can communicate with each other, so that a state where an MMIO register can be read is achieved.

FIG. 8 is an exemplary table listing an example of the power supply specification information 13*a* of the first embodiment. The power supply specification information 13*a* exemplified in FIG. 8 is register information described as a power supply requirement specification, and as described above, the power supply specification information 13*a* includes voltage ranges, maximum currents (continuous), and peak currents (for example, 100 μs period) of the power supply voltages PWR1, PWR2, and PWR3.

The maximum current (continuous) is a continuous current value used at the time of memory access of the memory card 10. The power supply circuit of the host apparatus is required to continuously supply this current value.

The peak current (100 μs period) is a peak current value flowing in a case of measuring, for example, in the 100 μs period and is influenced by the capacity of the coupling capacitor in the power setting of the host apparatus and the response characteristics of the power supply circuit. The power supply circuit of the host apparatus is required to supply the peak current.

The voltage range is a range where the power supply voltage is allowed to vary. The power supply circuit of the host apparatus is required to hold the voltage such that the power supply voltage at the terminal P falls within the voltage range even if a drop voltage of the wire line or the connector exists.

In addition, the power supply specification information 13*a* includes information indicating whether or not the power supply voltage PWR3 is generated by the regulator 53. As described above, in a case where the power supply voltage PWR3 is not applied to the terminals P24 and P25, the regulator 53 can generate the power supply voltage PWR3 from the power supply voltage PWR2. In addition, although the memory card 10 has the regulator 53, the memory card may use the power supply voltage PWR3 applied to the terminals P24 and P25.

As illustrated in FIG. 7, the host apparatus reads the power supply specification information 13*a* from the flash memory 13 (S11). For example, the power supply specification information 13*a* is disposed in a vendor specific area of an NVMe register mapped on the MMIO and is output as a differential data signal via the physical layer/memory controller 52. The host apparatus restores the power supply specification information 13*a* on the system memory by decoding the differential data signal.

The host apparatus compares the power supply requirement specification of the read the power supply specification information 13*a* with the power supply circuit specification of the host apparatus to determine whether or not the memory card 10 can be used (S12). In a case where the host apparatus satisfies all the power supply requirement specifications (S12: Yes), since the host apparatus includes a power supply circuit sufficient for accessing the flash memory 13, the memory card 10 can be used (S13).

In a case where the host apparatus does not satisfy the power supply requirement specification (S12: No), the host apparatus determines whether or not the power supply voltages PWR1, PWR2, and PWR3 can be adjusted (S14). For example, in a case where the power supply voltage PWR1 is insufficient, the host apparatus restricts the maximum power to the slot power limit defined by the PCIe, and thus, when the memory card 10 can be used (S14: Yes), the adjustment is performed (S15), and it is determined that the memory card 10 can be used (S13). On the other hand, in a case where the adjustment cannot be performed (S14: No), the host apparatus does not use the memory card 10 (S16).

The memory card 10 can implement a plurality of power modes. For example, as described above, the memory card 10 can implement a slot power limit (a maximum power consumption upper limit setting function).

The host apparatus sets a usable slot power limit to the memory card 10 with the PCIe packet according to the power supply capability. For example, as illustrated in FIG. 8, an example of the memory card 10 of the embodiment supports three slot power limits is described. The memory card 10 is not limited to this example. Since the peak current does not depend on the slot power limit, a common setting is provided.

A slot power limit A is larger than a slot power limit B in power consumption. In addition, the slot power limit B is larger than a slot power limit C in power consumption. As the power consumption is increased, the performance is improved. In a case where the power supply circuit of the host apparatus does not satisfy the slot power limit A, the power supply circuit is set to the slot power limit B, so that the host apparatus can use the memory card 10. The options of the slot power limit are given, for example, by other PCIe registers.

FIG. 9 is an exemplary timing chart illustrating a first example of the power supply check sequence of the memory card 10 of the first embodiment. Hereinafter, the first example of the power supply check sequence will be described with reference to FIGS. 7 and 9. In the memory card 10 according to the first example, the initialization by the PCIe can be started by using the power supply voltage PWR3. In addition, in FIG. 9, reference numerals corresponding to FIG. 7 are given to timings corresponding to the respective operations in FIG. 7.

First, the host apparatus supplies the power supply voltage PWR2 to the terminals P18 and P19 of the memory card 10 (S1). Since the power supply voltage PWR3 is used for initialization of the memory card 10, the level of the control signal CNTB remains low (S3: No) even after a certain time Tpok has elapsed (S2). For this reason, the host apparatus supplies the power supply voltage PWR3 to the terminals P24 and P25 of the memory card 10 (S4).

The power supply voltage PWR3 is supplied, and thus, CNTB=High. For this reason, after a certain time Tpok has elapsed (S5), since CNTB=High at the time of CNTB level check (S6: Yes), the host apparatus supplies the power supply voltage PWR1 to the terminal P21 (S9). In other words, the host can recognize that the memory card is a memory card 10 requiring three power supplies.

FIG. 10 is an exemplary timing chart illustrating a second example of the power supply check sequence of the memory card 10 of the first embodiment. Hereinafter, the second example of the power supply check sequence will be described with reference to FIGS. 7 and 10. In the memory card 10 according to the second example, the power supply voltage PWR3 can be generated from the power supply voltage PWR2 by the regulator 53, and the initialization by the PCIe can be started by using the power supply voltage PWR2.

First, the host apparatus supplies the power supply voltage PWR2 to the terminals P18 and P19 of the memory card 10 (S1). The power supply voltage PWR2 is supplied, and thus, CNTB=High. For this reason, after a certain time Tpok has elapsed (S2), since CNTB=High at the time of CNTB level check (S3: Yes), the host apparatus supplies the power supply voltage PWR1 to the terminal P21 (S9). The time Tpok is set, for example, to a time enough to stabilize the power supply voltage PWR3 generated by the regulator 53. In other words, the host can recognize that the memory card is a memory card 10 requiring two power supplies PWR1 and PWR2.

FIG. 11 is an exemplary timing chart illustrating a third example of the power supply check sequence of the memory card 10 of the first embodiment. Hereinafter, the third example of the power supply check sequence will be described with reference to FIGS. 7 and 11. In the memory card 10 according to the third example, the power supply voltage PWR3 can be generated from the power supply voltage PWR1 by the regulator 53, and the initialization by the PCIe can be started by using the power supply voltage PWR1.

First, the host apparatus supplies the power supply voltage PWR2 to the terminals P18 and P19 of the memory card 10 (S1). Since the power supply voltage PWR1 is used for initialization of the memory card 10, the level of the control signal CNTB is maintained to be low (S3: No) even after a certain time Tpok has elapsed (S2).

The host apparatus supplies the power supply voltage PWR3 to the terminals P24 and P25 of the memory card 10 (S4). Even when a certain time Tpok has elapsed (S5), the level of the control signal CNTB is maintained to be Low (S6: No). For this reason, the host apparatus turns off the power supply voltage PWR3 (S7), turns off the power supply voltage PWR2 (S8), and supplies the power supply voltage PWR1 to the terminal P21 (S9). That is, the host can recognize that the memory card is a memory card 10 requiring one power supply of the PWR1. When the power supply voltage PWR1 is supplied, in the memory card 10, the output of the power supply check circuit 55 is disconnected and is not output to the terminal P26 to which the control signal CNTB is assigned. However, the control signal CNTB can be used as a signal for another purpose.

In order to access the flash memory 13 at a high speed, in some cases, a large current may be used. However, the current consumed in the initialization of the PCIe may be smaller than the current for access at a high speed. For this reason, the power supply specification information 13a can be read even with the minimum power supply implementation.

In the above power supply check sequence, the card controller 14 of the memory card 10 determines whether or not the initialization of the PCIe by the differential data signal by the power supply voltages PWR1, PWR2, and PWR3 applied to the terminals P18, P19, P21, P24 and P25 is possible and outputs the result of the determination from terminal P26. Furthermore, when the initialization of the PCIe by the differential data signal is completed, the flash memory 13 can read the power supply specification information 13a recorded in the flash memory 13.

Even if a plurality of types of memory cards 10 having different the power supply specifications coexist, the host apparatus can identify the power supply specification through the power supply check sequence described above. In addition, by defining the power supply specification between the memory card 10 and the corresponding host apparatus in advance, the power supply check sequence can be omitted.

The host apparatus has a function of, for example, detecting insertion/removal of the memory card 10 with respect to the connector. In this case, the host apparatus turns on the power after detecting insertion of the memory card 10 into the connector, and turns off the power when detecting that the memory card 10 has been removed from the connector. For this reason, in the memory card 10, the function of hot swapping can be omitted.

In the memory card 10 according to the first embodiment described above, the housing 11 has a first edge 31 extending in the X-axis direction, a second edge 32 extending in the Y-axis direction intersecting the X-axis direction, and a first corner portion 35 where a notch C is formed between the first edge 31 and the second edge 32. The first corner portion 35 where the notch C is formed is used, for example, to prevent the memory card 10 from being reversely inserted. For this reason, in a case where the memory card 10 is inserted into, for example, a push-pull type connector, the memory card 10 is inserted into the connector from the first edge 31. Then, the plurality of terminals P are arranged in the X-axis direction with intervals interposed between the terminals to constitute a first row R1, and the plurality of terminals P are arranged in the X-axis direction with intervals interposed between the terminals at positions further away from the first edge 31 than the first row R1 to constitute a second row R2. In this manner, the plurality of terminals P constitute the plurality of rows R1 and R2, so that the memory card 10 of the embodiment can speed up the communication interface.

In general, the length of the wire line between the terminal P of the memory card 10 inserted into the connector and the host controller is decreased as goes to the inner side of the connector. That is, the length of the wire line between the terminal P included in the first row R1 and the host controller becomes smaller than the length of the wire line between the terminal P included in the second row R2 and the host controller. For this reason, the terminals P2, P3, P5, P6, P8, P9, P11, and P12 used for the signal transmission included in the first row R1 can more easily ensure the signal integrity than the terminals P15, P16, P20, P22, P23, and P26 used for the signal transmission included in the second row R2. For example, the number of terminals P used for the signal transmission included in the first row R1 may be set to be larger than the number of terminals P used for the signal transmission included in the second row R2, or the terminals P included in the first row R1 are used for transmission of the differential signals, so that the memory card 10 of the embodiment can speed up the communication interface.

The number of terminals P2, P3, P5, P6, P8, P9, P11, and P12 included in the first row R1 is larger than the number of terminals P15, P16, P20, P22, P23, and P26 included in the second row R2. Accordingly, the memory card 10 of the embodiment can speed up the communication interface.

In addition, the plurality of terminals P constitute the first row R1 and the second row R2. Accordingly, as compared with a case where the plurality of terminals P are arranged in a line, although the terminals P2, P3, P5, P6, P8, P9, P11, and P12 used for signal transmission are arranged more in the vicinity of the first edge 31, it is possible to ensure a desired size of the terminal P and a desired interval of the plurality of terminals P.

The terminals P2, P3, P5, P6, P8, P9, P11, and P12 used for transmission of signals having frequencies higher than the terminals P15, P16, P20, P22, P23, and P26 are included in the first row R1. Accordingly, the memory card 10 of the embodiment can speed up the communication interface.

The number of lanes is increased by increasing the number of differential data signal terminals, so that the memory card 10 of the embodiment can speed up the communication interface.

The plurality of terminals P constituting the first row R1 include the terminals P2, P3, P5, P6, P8, P9, P11, and P12 to which the differential data signals are assigned. On the other hand, the plurality of terminals P constituting the second row R2 include the terminals P15 and P16 to which the differential clock signals having a frequency lower than that of the differential data signals are assigned, the terminals P20, P22, P23, and P26 to which the single-end signals are assigned, and the terminals P18, P19, P21, P24, and P25 to which the power supplies are assigned. Accordingly, in the first row R1, the number of terminals P2, P3, P5, P6, P8, P9, P11, and P12 that can transmit the signals at a high speed can be further increased, so that the memory card 10 of the embodiment can speed up the communication interface.

The plurality of terminals P constituting the first row R1 include terminals P2, P3, P5, P6, P8, P9, P11, and P12 to which a plurality of lanes of the differential data signal are assigned. Accordingly, the memory card 10 of the embodiment can speed up the communication interface.

Each of the plurality of pairs of terminals P2, P3, P5, P6, P8, P9, P11, and P12 is located between two terminals among the plurality of terminals P1, P4, P7, P10, and P13. Accordingly, a return path can be ensured for each differential signals, the mutual interference between differential signals is reduced, and the operation signal level is stabilized.

The terminals P20 and P22 are assigned to sideband signals of the PCIe standard. Accordingly, in the first row R1, the number of terminals P2, P3, P5, P6, P8, P9, P11, and P12 that can transmit the signals at a high speed can be further increased, so that the memory card 10 of the embodiment can speed up the communication interface.

The terminal P21 is assigned to the first power supply PWR1. The terminals P18 and P19 are assigned to the second power supply PWR2 of which voltage is equal to or lower than the first power supply PWR1. The terminals P24 and P25 are assigned to the third power supply PWR3 of which voltage is equal to or lower than the second power supply PWR2. Accordingly, the first to third power supplies PWR1, PWR2, and PWR3 can be selectively used depending on the application, and the flexibility of the memory card 10 is enhanced. Furthermore, since the allowable value of the power supply voltage fluctuation is decreased as the voltage is increased, it is preferable to reduce the current value flowing to one terminal P. However, since the plurality of terminals P18 and P19 and the plurality of terminals P24 and P25 are provided, the current value is distributed, the current value per terminal becomes small, and the voltage fluctuation is suppressed.

In a case where the terminals P24 and P25 to which the third power supply PWR3 of the power supply voltage PWR3 is assigned are connected to ground, the regulator 53 generates the power supply voltage PWR3 from the power supply voltage PWR2 applied to the terminals P18 and P19 assigned to the second power supply PWR2 of the power supply voltage PWR2. Accordingly, the memory card 10 of the embodiment can cope with either the host apparatus having a two-power-supply configuration of the PWR1 and the PWR2 or the host apparatus having a three-power-supply configuration of the PWR1, the PWR2, and the PWR3.

The card controller 14 determines whether or not initialization by the differential data signal is possible by the power supply voltages PWR1, PWR2, and PWR3 applied to the terminals P18, P19, P21, P24, and P25 and outputs the result of the determination from the terminal P26 assigned to the control signal CNTB. When the initialization by the differential data signal is completed, the flash memory 13 can read the power supply specification information 13a stored in the flash memory 13. By comparing the power supply specification information 13a with the power supply specification of the host apparatus, the host apparatus can determine whether or not the memory card 10 can be used. Accordingly, even if the memory cards 10 having plural kinds of power supply configurations coexist, the host apparatus can identify the power supply specification of the memory card 10.

At least a portion of the side 14a of the card controller 14 is located between the first row R1 and the second row R2, and the connection terminal CP connected by the wire line W to the terminals P2, P3, P5, P6, P8, P9, P11, and P12 included in the first row R1 can be disposed on the side 14a. Accordingly, it is possible to set the wire line W without bypassing other wire lines and other parts or passing between the plurality of terminals P included in the second row R2. Therefore, it is easy to provide, for example, the ESD protection diode 43 in the wire line w, and it is possible to shorten the length of the wire line W between the terminals P2, P3, P5, P6, P8, P9, P11, and P12 included in the first row R1 and the connection terminal CP.

The memory card 10 has a length of 14±0.1 mm in the X-axis direction and a length of 18±0.1 mm in the Y-axis direction. In general, the size of the microSD card is 11 mm×15 mm. That is, the memory card 10 of the embodiment is larger than the microSD card. Accordingly, the memory card 10 can be mounted with a memory having a large memory capacity and a large size, which is difficult to mount on a microSD card, such as a large-sized three-dimensional flash memory, and thus, the memory card can cope with, for example, the large size of a future flash memory 13 with the evolution of the technology. Furthermore, the memory card 10 is larger than the microSD card and smaller than the standard SD memory card. For this reason, the memory card 10 is not too large for the host apparatus, and it is easy to insert and eject the memory card to the connector of the host apparatus.

The housing 11 further has a third edge 33 located on a side opposite to the second edge 32 and extending in the Y-axis direction and a second corner portion 36 between the first edge 31 and the third edge 33. The shape of the first corner portion 35 and the shape of the second corner portion 36 are different from each other. Accordingly, the reverse insertion of the memory card 10 is suppressed.

The first corner portion 35 extends in a linear shape between one end of the first edge 31 and the end of the second edge 32 to form a corner-chamfered portion of so-called C1.1. The second corner portion 36 extends in an arc shape between the other end of the first edge 31 and the end of the third edge 33 to forms a round-chamfered portion of so-called R0.2. In some cases, the memory card 10 may be inserted into the connector in a state where the second corner portion 36 is in contact with the connector. In this case, the position deviation of the memory card 10 in the X-axis direction can be reduced.

Second Embodiment

Hereinafter, a second embodiment will be described with reference to FIG. 12. In addition, in the following description of the embodiments, the constituent elements having the same functions as the previously described constituent elements are denoted by the same reference numerals, and the description may be omitted in some cases. In addition, a plurality of the constituent elements denoted by the same reference numerals are not necessarily common to all functions and properties and may have different functions and properties according to the respective embodiments.

FIG. 12 is an exemplary plan view illustrating the memory card 10 according to the second embodiment. As illustrated in FIG. 12, the card controller 14 according to the second embodiment is stacked in the flash memory 13.

The flash memory 13 is overlaid on the terminals P included in the second row R2. According to another expression, the flash memory 13 may be disposed such that the terminals P included in the second row R2 are located between the end of the flash memory 13 in the positive Y-axis direction and the end of the flash memory 13 in the negative Y-axis direction. On the other hand, the flash memory 13 is spaced from the terminals P included in the first row R1.

The card controller 14 is located between the first row R1 and the second row R2. For this reason, similarly to the first embodiment, the plurality of connection terminal CP of the card controller 14 is also located between the first row R1 and the second row R2. The wire line W connects the connection terminal CP and the terminal P included in the first row R1.

Like the memory card 10 of the second embodiment described above, the card controller 14 may be stacked in the flash memory 13. Since the flash memory 13 is spaced from the first row R1 and the connection terminal CP is located between the first row R1 and the second row R2, the lengthening of the wire line W is suppressed.

Third Embodiment

Figure 13:
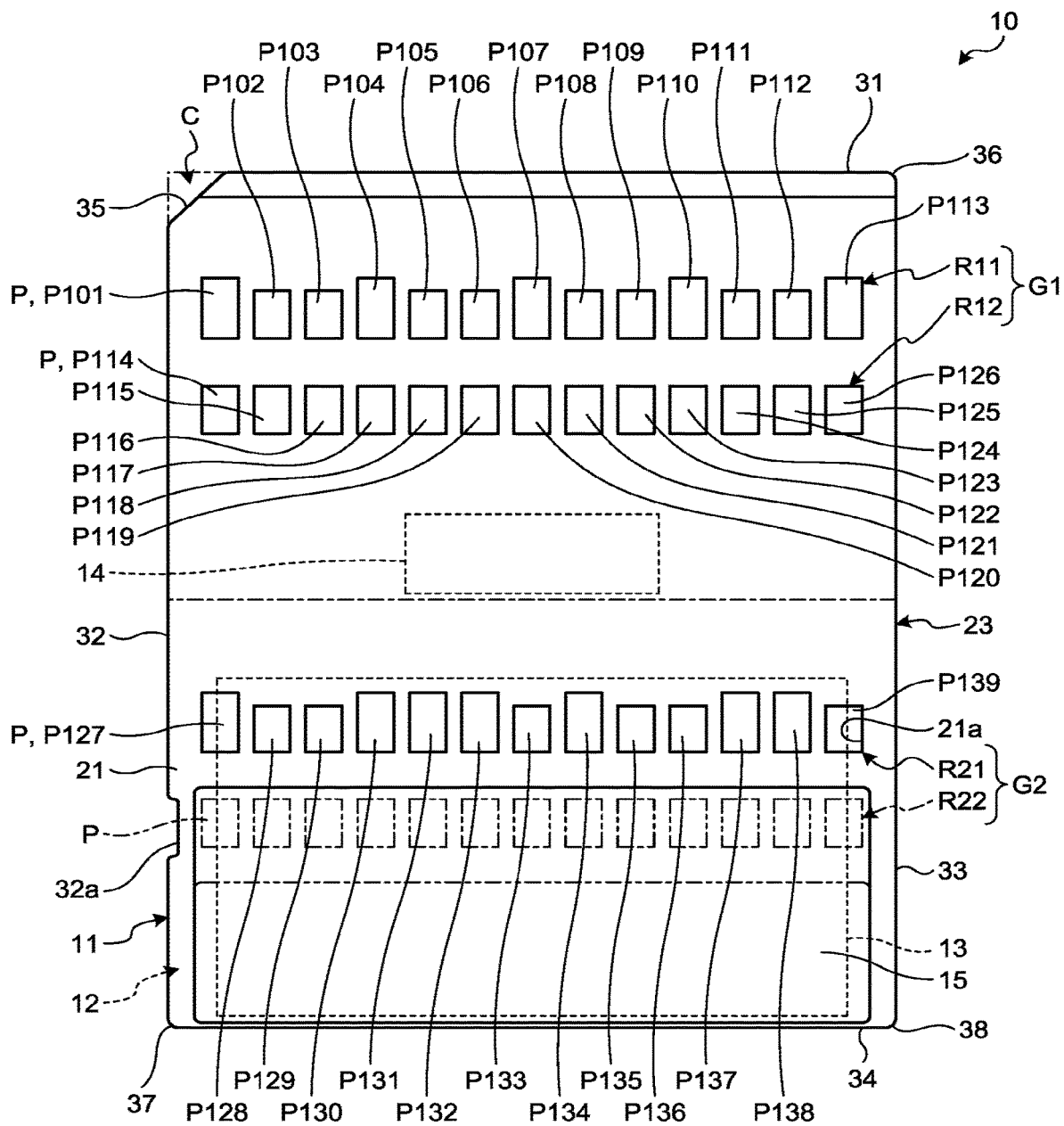
FIG. 13 is an exemplary plan view illustrating a memory card according to a third embodiment.
Figure 14:
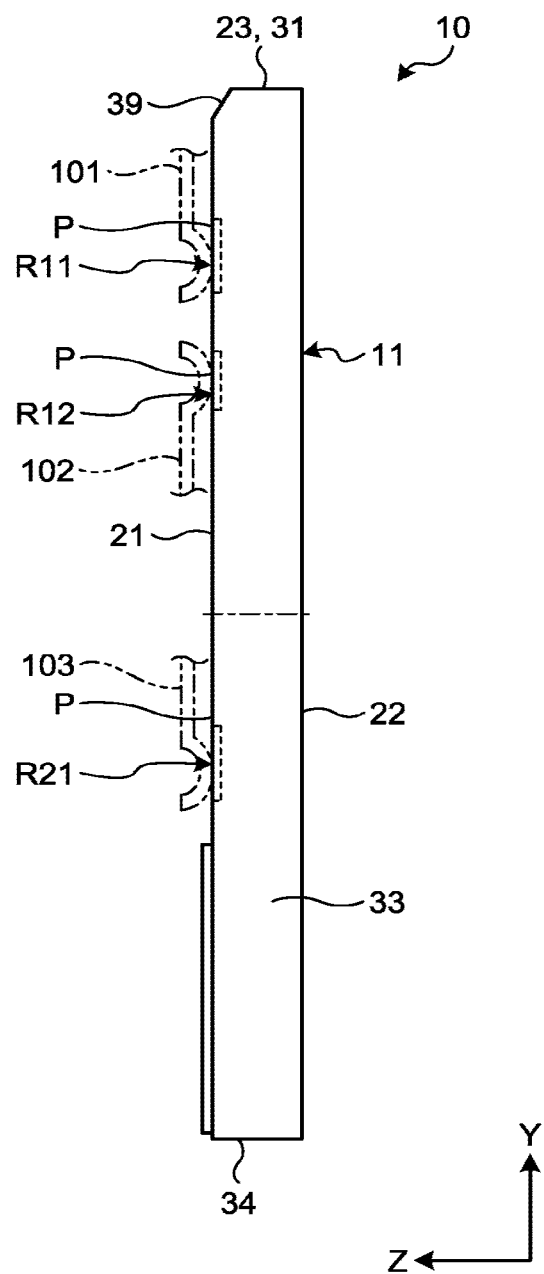
FIG. 14 is an exemplary side view illustrating the memory card in the third embodiment.

Hereinafter, a third embodiment will be described with reference to FIGS. 13 to 25. FIG. 13 is an exemplary plan view illustrating a memory card 10 according to the third embodiment. FIG. 14 is an exemplary side view illustrating the memory card 10 in the third embodiment. The memory card 10 is an example of a semiconductor memory device.

The memory card 10 includes a housing 11, a substrate 12, a nonvolatile memory 13, a card controller 14, and a protective sheet 15. The nonvolatile memory 13 is an example of a memory. The card controller 14 is an example of a controller.

The memory card 10 and the housing 11 are formed, for example, in a substantially rectangular plate shape extending in the Y-axis direction. The Y-axis direction is the longitudinal direction of the memory card 10 and the housing 11. The Y-axis direction is an example of the second direction.

As illustrated in FIG. 14, the housing 11 is plate-shaped and has a first surface 21, a second surface 22, and an outer edge 23. The first surface 21 and the second surface 22 are formed in a substantially quadrangular (rectangular) shape extending in the Y-axis direction. That is, the Y-axis direction is also the longitudinal direction of the first surface 21 and the second surface 22. In the embodiment, each of the shapes of the memory card 10, the housing 11, the first surface 21, and the second surface 22 is expressed as a rectangular shape, but other shapes can also be used.

The first surface 21 is a substantially flat surface facing in the positive direction of the Z axis. As illustrated in FIG. 14, the second surface 22 is located on a side opposite to the first surface 21 and is a substantially flat surface facing the negative Z-axis direction.

The outer edge 23 is provided between the first surface 21 and the second surface 22 and is connected to the edge of the first surface 21 and the edge of the second surface 22. As illustrated in FIG. 13, the outer edge 23 includes a first edge 31, a second edge 32, a third edge 33, a fourth edge 34, a first corner portion 35, a second corner portion 36, a third corner portion 37, and a fourth corner portion 38. The first edge 31 is an example of the first end edge. The second edge 32 is an example of the first side edge. The third edge 33 is an example of a second side edge. The fourth edge 34 is an example of the second end edge.

The first edge 31 extends in the X-axis direction and faces in the positive Y-axis direction. The X-axis direction is the short side direction of the memory card 10, the housing 11, the first surface 21, and the second surface 22, and includes the positive X-axis direction and the negative X-axis direction. The X-axis direction is an example of the first direction.

The second edge 32 extends in the Y-axis direction and faces in the negative X-axis direction. The second edge 32 is provided with a recess 32a. In addition, the recess 32a may be omitted. In some cases, a connector into which the memory card 10 is inserted may be provided with a protrusion that fits into the recess 32a. In this case, the protrusion allows the memory card 10 provided with the recess 32a to be inserted into the connector and can prevent the memory card 10 without the recess 32a from being inserted into the connector.

Both of the memory cards 10 can be allowed to be inserted into a connector without the protrusion. In this manner, the connector with the protrusion can identify the type of the memory card 10 on the basis of the recess 32a.

There may be another connector which has a detection signal of the recess 32a so that host can recognize which card with or without the recess 32a is inserted to the connector. In addition, the connector can identify more types of the memory card 10 on the basis of no recess or the position of the recess 32a of the memory card 10 and a position of the protrusion or recess positions detection of the connector. The third edge 33 is located on a side opposite to the second edge 32, extends in the Y-axis direction, and faces in the positive X-axis direction. The fourth edge 34 is located on a side opposite to the first edge 31, extends in the X-axis direction, and faces in the negative Y-axis direction.

The length of each of the second edge 32 and the third edge 33 is larger than the length of each of the first edge 31 and the fourth edge 34. The first edge 31 and the fourth edge 34 constitute the short sides of the substantially rectangular memory card 10, and the second edge 32 and the third edge 33 constitute the long sides of the substantially rectangular memory card 10.

The first corner portion 35 is a corner portion between the first edge 31 and the second edge 32 and connects the end of the first edge 31 in the negative X-axis direction and the end of the second edge 32 in the positive Y-axis direction. The end of the first edge 31 in the negative X-axis direction is an example of one end of the first edge. The end of the second edge 32 in the positive Y-axis direction is an example of the end of the second edge.

The first corner portion 35 extends in a linear shape between the end of the first edge 31 in the negative X-axis direction and the end of the second edge 32 in the positive Y-axis direction. In the X-axis direction, the distance between the end of the first edge 31 in the negative X-axis direction and the second edge 32 is 1.1 mm. According to another expression, in the X-axis direction, the distance between the end of the first edge 31 in the negative X-axis direction and the intersection of the extension line of the first edge 31 and the extension line of the second edge 32 is 1.1 mm.

In the Y-axis direction, the distance between the end of the second edge 32 in the positive Y-axis direction and the first edge 31 is 1.1 mm. According to another expression, in the Y-axis direction, the distance between the end of the second edge 32 in the positive Y-axis direction and the intersection of the extension line of the first edge 31 and the extension line of the second edge 32 is 1.1 mm.

By setting the corner between the first edge 31 and the second edge 32 to a corner chamfer of so-called C1.1, the first corner portion 35 is provided. According to another expression, in the first corner portion 35, a notch C is formed between the first edge 31 and the second edge 32.

In the embodiment, in the first corner portion 35, a substantially triangular notch C is formed in the corner portion between the first edge 31 and the second edge 32 extending in directions perpendicular to each other. However, the notch C is not limited to this example. For example, in the first corner portion 35, a substantially rectangular notch C recessed inside the housing 11 as compared with the embodiment may be formed.

The second corner portion 36 is a corner portion between the first edge 31 and the third edge 33 and connects the end of the first edge 31 in the positive X-axis direction and the end of the third edge 33 in the positive Y-axis direction. The end of the first edge 31 in the positive X-axis direction is an example of the other end of the first edge. The end of the third edge 33 in the positive Y-axis direction is an example of the end of the third edge.

The second corner portion 36 extends in an arc shape between the end of the first edge 31 in the positive X-axis direction and the end of the third edge 33 in the positive Y-axis direction. The second corner portion 36 extends in a circular arc shape. However, the second corner portion 36 may extend in an elliptic arc shape.

The radius of the second corner portion 36 extending in an arc shape is 0.2 mm. By setting the corner between the first edge 31 and the third edge 33 to a round chamfer of so-called R0.2, the second corner portion 36 is provided. In this manner, the shape of the first corner portion 35 and the shape of the second corner portion 36 are different from each other.

The third corner portion 37 connects the end of the second edge 32 in the negative Y-axis direction and the end of the fourth edge 34 in the negative X-axis direction. The fourth corner portion 38 connects the end of the third edge 33 in the negative Y-axis direction and the end of the fourth edge 34 in the positive X-axis direction. Each of the third corner portion 37 and the fourth corner portion 38 extends in an arc shape having a radius of 0.2 mm.

The memory card 10, the housing 11, the first surface 21 and the second surface 22 are set to have a length of about 18±0.1 mm in the Y-axis direction and a length of about 14±0.1 mm in the X-axis direction. That is, the distance between the first edge 31 and the fourth edge 34 in the Y-axis direction is set to about 18±0.1 mm, and the distance between the second edge 32 and the third edge 33 in the X-axis direction is set to about 14±0.1 mm. In addition, the lengths of the memory card 10, the housing 11, the first surface 21, and the second surface 22 in the X-axis direction and the Y-axis direction are not limited to this example. The memory card 10 and the housing 11 are set to have a thickness of about 1.4±0.1 mm between the first surface 21 and the second surface 22. It is not limited to this example. Several form factor may exist that is the same length in X and Y direction but different thickness in z direction.

As illustrated in FIG. 14, the housing 11 further has an inclined portion 39. The inclined portion (chamfer, taper) 39 is a corner portion between the first surface 21 and the first edge 31, and extends in a linear shape between the end of the first surface 21 in the positive Y-axis direction and the end of the first edge 31 in the positive Z-axis direction.

As illustrated in FIG. 13, the substrate 12, the nonvolatile memory 13, and the card controller 14 are provided in the housing 11. The substrate 12, the nonvolatile memory 13, and the card controller 14 may be accommodated in the box-shaped housing 11 or may be embedded in the housing 11.

The substrate 12 is, for example, a PCB. In addition, the substrate 12 may be another kind of substrate. The flash memory 13 and the card controller 14 are mounted on the substrate 12.

The nonvolatile memory 13 is not dependent on the kind of memory as long as the memory is nonvolatile, but a representative nonvolatile memory is a flash memory. For this reason, hereinafter, the nonvolatile memory is referred to as a flash memory 13. The flash memory 13 is a nonvolatile memory capable of storing information, and is, for example, a NAND type flash memory. In addition, the flash memory 13 may be another flash memory such as a NOR type flash memory. The memory card 10 may have, for example, a plurality of stacked flash memories 13.

The card controller 14 can control the flash memory 13, and the whole memory card 10 including the flash memory 13. For example, the card controller 14 can perform control of read/write with respect to the flash memory 13 and control of communication with the outside. This communication control includes protocol control corresponding to the PCIe. In addition, the card controller 14 may indirectly control the flash memory 13 via other electronic components that control the flash memory 13.

The protective sheet 15 is attached to the first surface 21. The protective sheet 15 seals test terminals exposed to, for example, the first surface 21. The protective sheet 15 is not limited to this example.

The memory card 10 further includes a plurality of terminals P. In the embodiment, the memory card 10 includes thirty-nine terminals P. In addition, the number of terminals P is merely an example and is not limited to this example. That is, the number of terminals P may be less than 39 or may be more than 39. The plurality of terminals P are provided on the first surface 21 and electrically connected with the substrate 12, for example. The plurality of terminals P are metal plates attached to the first surface 21. In the embodiment, the second surface 22 is not provided with the terminal P and can be used, for example, for a printing surface or a heat dissipating surface.

The plurality of terminals P of the embodiment constitute a plurality of rows divided into a first group G1 and a second group G2. The first group G1 includes first rows R11 and R12. The second group G2 includes a second row R21. That is, the plurality of terminals P are arranged in three rows to constitute the first rows R11 and R12 and the second row R21.

The first group G1 includes at least one first row (R11 or R12). That is, the first group G1 may include one first row (R11 or R12) or may include more than two first rows (R11, R12, . . . ).

The second group G2 includes at least one second row (R21). That is, the second group G2 may include one second row (R21) or may include more than two second rows (R21, R22, . . . ).

Figure 15:
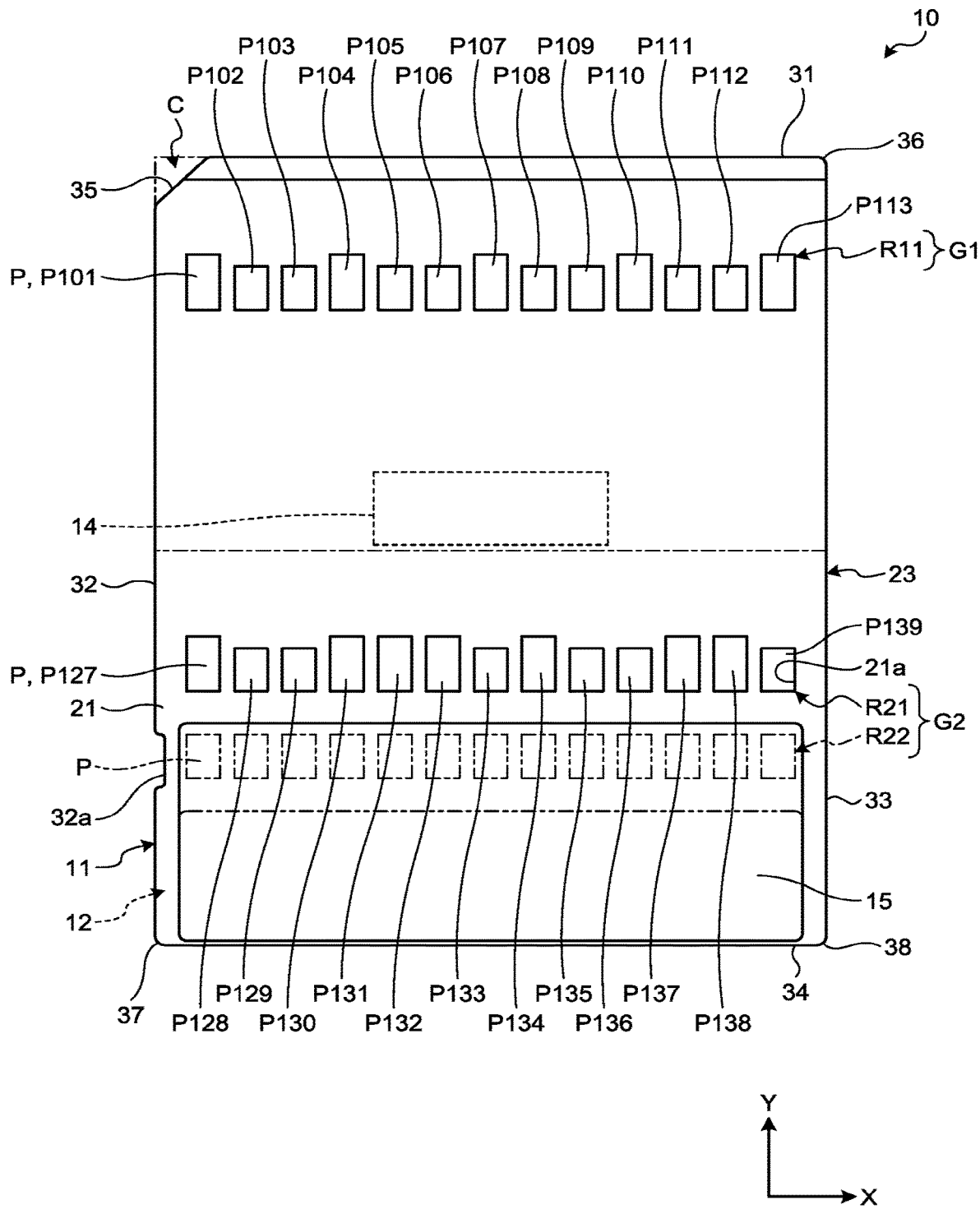
FIG. 15 is an exemplary plan view illustrating a memory card according to Modified Example of the third embodiment.

FIG. 15 is an exemplary plan view illustrating a memory card 10 according to Modified Example of the third embodiment. As illustrated in FIG. 15, the memory card 10 of Modified Example may include twenty-six terminals P arranged in two rows to constitute a first row R11 and a second row R21. That is, the first group G1 may include one first row R11, and the first row R12 may be omitted.

As illustrated in FIG. 13, the first row R11 includes thirteen terminals P arranged at positions closer to the first edge 31 than the fourth edge 34 in the X-axis direction with intervals interposed between the terminals. Hereinafter, in some cases, the thirteen terminals P constituting the first row R11 and being included in the first row R11 may be individually referred to as terminals P101 to P113. The number of terminals P constituting the first row R11 is not limited to 13. The terminals P constituting the first row R11 are arranged in order from the terminal P101 closest to the second edge 32 to the terminal P113 closest to the third edge 33.

The terminals P101 to P113 are arranged in the X-axis direction along the first edge 31 in the vicinity of the first edge 31. The first row R11 constituted by the terminals P101 to P113 and the terminals P101 to P113 is slightly spaced from the first edge 31. However, the distance between the first row R11 and the first edge 31 is shorter than the distance between the first row R11 and the fourth edge 34. In addition, the terminals P101 to P113 and the first row R11 may be adjacent to the first edge 31.

The first row R12 includes thirteen terminals P arranged at positions closer to the first edge 31 than the fourth edge 34 in the X-axis direction with intervals interposed between the terminals. Hereinafter, in some cases, the thirteen terminals P constituting the first row R12 and being included in the first row R12 may be individually referred to as terminals P114 to P126. The number of terminals P constituting the first row R12 is not limited to 13. In addition, the number of terminals P constituting the first row R12 may be larger or smaller than the number of terminals P constituting the first row R11. The terminals P constituting the first row R12 are arranged in order from the terminal P114 closest to the second edge 32 to the terminal P126 closest to the third edge 33.

The plurality of terminals P constituting the first row R12 are arranged at positions farther from the first edge 31 than from the first row R11. For this reason, the first row R12 is farther from the first edge 31 than from the first row R11. The first row R11 and the first row R12 are arranged in the Y-axis direction with a predetermined short interval interposed between the rows.

The second row R21 includes thirteen terminals P arranged at positions closer to the fourth edge 34 than the first edge 31 in the X-axis direction with intervals interposed between the terminals. Hereinafter, in some cases, the thirteen terminals P constituting the second row R21 and being included in the second row R21 may be individually referred to as terminals P127 to P139. The number of terminals P constituting the second row R21 is not limited to 13. In addition, the number of terminals P constituting the second row R21 may be larger or smaller than the number of terminals P constituting the first row R11 and the first row R12. The terminals P constituting the second row R21 are arranged in order from the terminal P127 closest to the second edge 32 to the terminal P139 closest to the third edge 33.

The plurality of terminals P constituting the second row R21 are located to be closer to the fourth edge 34 than the first edge 31. According to another expression, the plurality of terminals P constituting the second row R21 are disposed between the center line (indicated by a one-dot broken line) of the memory card 10 and the housing 11 in the Y-axis direction and the fourth edge 34. For this reason, the interval between the first row R12 and the second row R21 becomes wider. In the embodiment, the plurality of terminals P constituting the second row R21 are spaced from the center line.

As described above, the second group G2 may further include a second row R22 indicated by a two-dot broken line. In this case, the second row R21 and the second row R22 are arranged in the Y-axis direction with a predetermined short interval interposed between the rows.

As described above, the plurality of terminals P are arranged in the X-axis direction. The distance between the adjacent terminals P in the X-axis direction is determined according to, for example, the number of terminals P in a case where the length between the second edge 32 and the third edge 33 is constant. Furthermore, the maximum number of terminals P arranged in the X-axis direction is determined by the minimum distance between the adjacent terminals P in the X-axis direction. The distances between the plurality of terminals P in the X-axis direction may be equal to or different from each other. In the embodiment, the number of terminals P of each of the first rows R11 and R12 and the second row R21 is the same. For this reason, the distance between all the terminals P is constant.

The length of the terminal P in the Y-axis direction is set to be, for example, to a length between the maximum length and the minimum length determined such that the memory card 10 and the connector for the memory card 10 can be connected. In each of the first rows R11 and R12 and the second row R21, the terminals P are arranged such that the ends of the terminals P in the negative Y-axis direction are arranged.

Since the PCIe Gen 4 has a low bit rate of 16 GT/s, it is necessary to reduce the electrostatic capacity and to improve the frequency characteristics by decreasing the pad area as much as possible. On the other hand, as the pad area is decreased, the ease of manufacturing with respect to mechanical strength is decreased. Therefore, it is necessary to have a pad area that is large enough to accommodate variations in manufacturing and variations in the position of the card/connector contact point. Therefore, the minimum length of the pad is defined by the trade-off between the electrical characteristics and the mechanical level. With respect to this card form factor, the minimum length is the number of pads that can be disposed from the minimum interval of the current mounting technology, and thirteen pads where two lanes of the PCIe can be mounted in one row are adopted.

When the lengths of the plurality of terminals P in the X-axis direction and the Y-axis direction are set to be substantially the same, the electrical characteristics of the plurality of terminals P can be allowed to be similar. In the embodiment, as the length in the Y-axis direction and the length in the X-axis direction between all the terminals P for signals in the first row R11 and all the terminals P in the first row R12 are smaller, the electrical characteristics become better. However, the lengths are set to the minimum lengths at the mechanical skill level. Accordingly, the electrical characteristics of the plurality of terminals P constituting the first rows R11 and R12 are improved, and the area of the region where the first rows R11 and R12 are provided is reduced.

In addition, in the embodiment, the lengths of the terminals P in the Y-axis direction are set to be the same at the data transmission terminals P of the first row R11 and the second row R21. Accordingly, the electrical characteristics of the data transmission terminals P of the first row R11 and the first row R12 can be allowed to be similar. In addition, one terminal P may protrude in the positive Y-axis direction from the end of another terminal P in the positive Y-axis direction. For example, in the case of a lateral insertion connector that inserts the memory card 110 in the positive Y-axis direction by causing the terminal P for power supply and the terminal P for GND to protrude beyond the terminal P for data transmission, the terminal P for power supply and the terminal P for GND come into contact with the lead frame of the connector prior to the terminal P for data transmission. Accordingly, the GND level of the host apparatus and the GND level of the memory card 10 become equivalent, and thus, the electrical level of the card controller 14 can be stabilized. In a case where the terminal P for power supply and the terminal P for GND among the terminals P in the first row R11 and the second row R21 are set to be long in the Y-axis direction such that when a plurality of terminals P are arranged in two rows as illustrated in FIG. 15 that does not use the first row R12, for example, the memory card 10 can be used with a lateral insertion connector such as a push-push type or a push-pull type.

In the first rows R11 and R12, the terminal P excluding the signal terminal P is only the terminal P for GND. As taking out many signals from card pads is difficult for a lateral insertion connector, the first row R12 is expected to be not used. For this reason, there is no need to lengthen the terminal P for GND of the first row R12. For this reason, it is possible to shorten the lengths of all the terminals P in the first row R12 in the Y-axis direction. Accordingly, it is possible to shorten the interval between the first rows R11 and R12.

The plurality of terminals P may have different shapes from each other. For example, in the first row R11, the shapes of the terminals P101, P104, P107, P110, and P113 and the shapes of the terminals P102, P103, P105, P106, P108, P109, P111, and P112 are different from each other, but the shapes may be the same. In addition, in the second row R21, the shapes of the terminals P127, P130, P131, P132, P134, P137, and P138 and the shapes of the terminals P128, P129, P133, P135, P136, and P139 are different from each other, but the shapes may be the same.

In the embodiment, in each of the first rows R11 and R12 and the second row R21, the distance between the plurality of terminals P is substantially constant. However, the distances between the plurality of terminals P may be different from each other.

In the connector to be attached in the Y-axis direction, the terminals P101, P104, P107, P110, P113, P127, P130, P131, P132, P134, P137, and P138 which are power supply terminals and ground terminals of the memory card 10 are slightly longer than the terminals the P102, P103, P105, P106, P108, P109, P111, P112, P128, P129, P133, P135, P136, and P139 which are signal terminals. Accordingly, since the connector first comes into contact with the power supply terminal and the ground terminal, the connector is electrically stable, and thus, it is possible to avoid applying an electrical stress to the signal terminals. When a voltage is applied to the signal terminal before power is supplied to the card controller 14, an electrical stress is applied to the input buffer of the interface circuit 51 described later.

Signals used for communication in accordance with a predetermined interface standard are assigned to the plurality of terminals P. However, signals used for communication in accordance with a plurality of interface standards may be assigned to a plurality of terminals P.

FIG. 16 is an exemplary table listing an example of signal assignment of the plurality of terminals P in the third embodiment. As illustrated in FIG. 16, in the embodiment, a signal used for data communication of the PCIe is assigned to the plurality of terminals P in the first row R11 and the first row R12 of the first group G1. In the PCIe, differential data signal pairs can be used for the data communication.

In the first row R11, the ground (GND) of the ground potential is assigned to the terminals P101, P104, P107, P110, and P113; reception differential signals PERp0, PERn0, PERp1, and PERn1 are assigned to the terminals P102, P103, P108, and P109; and transmission differential signals PETp0, PETn0, PETp1, and PETn1 are assigned to the terminals P105, P106, P111, and P112.

In the first row R12, the ground (GND) of the ground potential is assigned to the terminals P114, P117, P120, P123, and P126; reception differential signals PERp2, PERn2, PERp3, and PERn3 are assigned to the terminals P115, P116, P121, and P122; and transmission differential signals PETp2, PETn2, PETp3, and PETn3 are assigned to the terminals P118, P119, P124, and P125.

The terminals P101, P104, P107, P110, P113, P114, P117, P120, and P123, and P126 are examples of ground terminals. The terminals P102, P103, P105, P106, P108, P109, P111, P112, P115, P116, P118, P119, P121, P122, P124, and P125 are examples of the signal terminals, the first signal terminal and the differential data signal terminals. The reception differential signals PERp0, PERn0, PERp1, PERn1, PERp2, PERn2, PERp3, and PERn3 and the transmission differential signals PETp0, PETn0, PETp1, PETn1, PETp2, PETn2, PETp3, and PETn3 are examples of the signals and the differential data signals.

A pair of the terminals P102 and P103 to which the reception differential signals PERp0 and PERn0 are assigned is located between the two terminals P101 and P104 and is surrounded by the two terminals P101 and P104. A pair of the terminals P105 and P106 to which the transmission differential signals PETp0 and PETn0 are assigned is located between the two terminals P104 and P107 and is surrounded by the two terminals P104 and P107.

A pair of the terminals P108 and P109 to which the reception differential signals PERp1 and PERn1 are assigned is located between the two terminals P107 and P110 and is surrounded by the two terminals P107 and P110. A pair of the terminals P111 and P112 to which the transmission differential signals PETp1 and PETn1 are assigned is located between the two terminals P110 and P113 and is surrounded by the two terminals P110 and P113.

A pair of the terminals P115 and P116 to which the reception differential signals PERp2 and PERn2 are assigned is located between the two terminals P114 and P117 and is surrounded by the two terminals P114 and P117. A pair of the terminals P118 and P119 to which the transmission differential signals PETp2 and PETn2 are assigned is located between the two terminals P117 and P120 and is surrounded by the two terminals P117 and P120.

A pair of the terminals P121 and P122 to which the reception differential signals PERp3 and PERn3 are assigned is located between the two terminals P120 and P123 and is surrounded by the two terminals P120 and P123. A pair of the terminals P124 and P125 to which the transmission differential signals PETp3 and PETn3 are assigned is located between the two terminals P123 and P126 and is surrounded by the two terminals P123 and P126.

In the PCIe, data are serially transmitted, but in order to be able to generate a clock in the reception circuit and to prevent the voltage level from being deviated to a high level or a low level due to the same logic level continuing to the data, encoding is performed for each unit. Methods such as 8B10B and 128*b*/130*b* are used for encoding. With this encoding, the average signal voltage level can be allowed to be to be in the vicinity of the common voltage, and the deviation from the reception threshold level can be suppressed. In addition, since the reception side can generate a reception clock following the temporal fluctuation of the data by generating the reception clock from the change point of the data, stable data reception becomes possible (technology called CDR: Clock Data Recovery). Even in a case where there is deviation between a plurality of lanes (upward and downward pairs of differential data signals), the start positions of the received data parallelized are aligned by configuring the reception circuit independently in each lane, so that the skew between the lanes can be allowed to be cancelled.

For example, in the case of the PCIe 3.0, the maximum transmission rate is 2 Gbytes/second per lane (sum of upward and downward transmission rates). In the PCIe, one lane may be configured by one set of the transmission differential signals PETp0 and PETn0 and the reception differential signals PERp0 and PERn0. In the PCIe, one lane can be configured by one set of the transmission differential signals PETp1 and PETn1 and the reception differential signals PERp1 and PERn1. Similarly, one lane can be configured by one set of the transmission differential signals PETp2 and PETn2 and the reception differential signals PERp2 and PERn2, and furthermore, one lane can be configured by one set of the transmission differential signals PETp3 and PETn3 and the reception differential signals PERp3 and PERn3.

As described above, two lanes are assigned to the plurality of terminals P constituting the first row R11, and two lanes are assigned to the plurality of terminals P constituting the first row R12. According to another expression, the plurality of terminals P constituting the first rows R11 and R12 include a plurality of pairs of the terminals P102, P103, P105, P106, P108, P109, P111, P112, P115, P116, P118, P119, P121, P122, P124, and P125 assigned to the plurality of lanes of the differential data signals. For this reason, the number of lanes of the PCIe can be increased, and thus, the data transmission rate can be improved.

In the PCIe, it is possible to recognize a multiple-lane configuration at initialization and to transmit one data with the multiple lanes. In addition, in a case where the host apparatus does not support the multiple lanes, the memory card 10 can operate in a one-lane mode or even in a mode using a portion of the plurality of lanes, for example, two lanes out of the above four lanes.

The terminals P102, P103, P105, P106, P108, P109, P111, P112, P115, P116, P118, P119, P121, P122, P124, and P125 transmit the differential data signals in accordance with the PCIe and enables bi-directional communication by the configuration in which the transmission terminals and the reception terminals are paired. The terminals P102, P103, P105, P106, P108, P109, P111, P112, P115, P116, P118, P119, P121, P122, P124, and P125 can transmit differential data signals with frequencies in a GHz band.

Besides the differential data signal of the PCIe, control signals are assigned to the plurality of terminals P of the second row R21. In the second row R21, GND is assigned to the terminals P127 and P130; reference differential clock signals REFCLKp and REFCLKn are assigned to the terminals P128 and P129; a second power supply (power rail) PWR2 is assigned to the terminals P131 and P132; a reset signal PERST# is assigned to the terminal P133; a first power supply (power rail) PWR1 is assigned to the terminal P134; a clock control signal CLKREQ# is assigned to the terminal P135; control signals CNTA and CNTB are assigned to the terminals P136 and P139; and a third power supply (power rail) PWR3 is assigned to the terminals P137 and P138. Assignment of power supply above is an example in the embodiment. The terminals for power supply pads P131, P132, P134, P137 and P138 may be assigned to any supply voltages PWR1, PWR2, PWR3, etc.

The terminals P128, P129, P133, P135, P136, and P139 are examples of the signal terminals and the second signal terminals. The terminals P128 and P129 are examples of the differential clock signal terminals. The terminals P133 and P135 are an example of the single-end signal terminal and an example of the sideband signal terminal. The terminals P131, P132, P134, P137, and P138 are examples of the power supply terminals. Each of the terminals P131 and P132 is example of the second power supply terminal and the fifth power supply terminal. The terminal P134 is an example of the first power supply terminal. Each of the terminals P137 and P138 is example of the third power supply terminal and the fourth power supply terminal. By using a connector, a contact resistance exists, and a wire line resistance depending on the length of a long wire line exists. As described later, voltages applied to the plurality of power supply terminals are different, and the plurality of terminals P are provided as power supply terminals, so that the current is dispersed and the current flowing per terminal is reduced. Therefore, it is possible to reduce the drop voltage due to the resistance component existing between the power supply circuit and the power supply terminal.

Two PCIe reference differential clock signals REFCLKp/n constitute a differential clock signal. By transmitting a clock signal having a frequency in a MHz band from the host apparatus to the terminals P128 and P129, the memory card 10 does not need to mount a highly accurate clock generator, and providing clock from host to the memory card facilitates synchronization with the host apparatus to which the memory card 10 is attached. In addition, by allowing the terminals P128 and P129 to reduce the frequency of the clock signal used for transmission, the generation of EMI can be lowered by making a waveform close to a sinusoidal wave or using Spread Spectrum Clocking (SSC). The memory card 10 multiplies the received clock by a PLL circuit, so that the terminals P102, P103, P105, P106, P108, P109, P111, P112, P115, P116, P118, P119, P121, P122, P124, and P125 generate a high frequency of the differential data signal used for transmission.

The host apparatus is an information processing apparatus such as a personal computer, a portable terminal such as a mobile phone, a digital camera, an imaging apparatus, a tablet computer or a smartphone, a game device, an in-vehicle terminal such as a car navigation system, or other apparatuses.

The memory card 10 generates the bit clock by multiplying the received reference differential clock by the PLL oscillation circuit. Data is output from the transmission differential signals PETp0, PETn0, PETp1, PETn1, PETp2, PETn2, PETp3, and PETn3 in synchronization with the bit clock. Data received from the reception differential signals PERp0, PERn0, PERp1, PERn1, PERp2, PERn2, PERp3, and PERn3 are temporarily sampled by the reception clock (CDR) generated from the received code pattern, and the data of each lane are aligned as parallel data. It is possible to resynchronize this data with the internal clock generated from the reference differential clock. The internal clock is set to a frequency lower than the bit clock by the number of data bits obtained by converting serial data to parallel data. For example, in a case where the 8B10B codec is used, when the serially received 10-bit code is aligned to 1-byte (8-bit) parallel data, the internal clock has a frequency of $\frac{1}{10}$ of the bit clock for 1-byte parallel data, $\frac{1}{40}$ for 4-byte, $\frac{1}{80}$ for 8-byte and so on.

The reset signal PERST# can be used to allow the host apparatus to activate and reset the memory device used for communication in accordance with the PCIe. The initialization start timing of the PCIe differential lane is regulated by the reset release timing of the PCIe. In the case of an embedded memory, since the time from power-on to reset release is specified, the memory card 10 is prepared such that initialization can be performed within this time. However, in the case of a removable memory, it is necessary to determine the reset release timing in consideration of the time when the memory card 10 and the connector are stably engaged. This reset signal PERST# can be used when the host apparatus reinitializes the memory card 10 at the time when an unrecoverable error occurs in the normal recovery protocol.

The clock control signal CLKREQ# is a control signal that requests the host to supply the reference differential clock. Once the memory card 10 is powered on, this signal is set to a high level (the signal becomes High in the pull-up since the memory card is open-drained). In a stage where the power supply voltage of the interior of the memory card 10 is stabilized and, thus, the memory card 10 becomes receivable of a clock, the signal is driven to a low level. When the host detects that the CLKREQ# becomes a low level, the host starts supplying the reference clock. In addition, the host can use this signal as a signal for controlling the transition of the memory card 10 to the power saving mode and the return from the power saving mode. This power saving mode is a function called L1 PM Substate in the PCIe. When the memory card 10 is in idle where the memory access is not performed, the memory card can enter into the power saving mode, so that the power consumption of the PHY can be reduced. In the power saving mode, the host can stop the PCIe reference differential clock signal REFCLKp/n, and the memory card 10 also has a mode where the common power supply of the PHY can be turned off, so that it is possible to greatly reduce the power consumption.

The reset signal PERST# and the clock control signal CLKREQ# are single-end signals and are defined as sideband signals of the PCIe. Interface signal voltage level of PERST# and CLKREQ# may be determined by either PWR1, PWR2 or PWR3 depends on a host system interface signal voltage level.

By allowing the memory card 10 to support the communication in accordance with the PCIe, it is possible to use the standard physical layer (PHY) of the PCIe. For this reason, it is possible to facilitate the design for increasing the data transmission rate of the memory card 10 and to reduce the development cost.

Furthermore, the memory card 10 can adopt the NVMe as a protocol on the PCIe. Since the NVMe standardizes the protocol, in the host apparatus corresponding to the NVMe, the memory card 10 can be used only by connection. In addition, the NVMe performs optimum control on the flash memory 13, and thus, a plurality of commands can be registered by generating a queue on the system memory. Therefore, the overhead at the time of data transmission can be reduced by multi-transaction processing. Moreover, by performing the data transmission by using the master transmission function of the PCIe, it is possible to improve data transmission efficiency.

The host apparatus can supply the power supply voltage PWR1 as the first power supply to the terminal P134. The power supply voltage PWR1 is set to 3.3 V in the embodiment. The power supply voltage notation indicates an upper standard value, which is an operating voltage supported by most flash memories. In a case where the flash memory supports a wide operating voltage range, operation at a lower voltage is allowed. The power supply voltage PWR1 may be set to be in a range of, for example, 2.5 V or more and 3.3 V or less, but the present invention is not limited to this example. This voltage range of 2.5 V or more and 3.3 V or less does not mean dynamic fluctuation, and a certain stabilized voltage within this voltage range is used as the power supply voltage PWR1.

The host apparatus can supply the power supply voltage PWR2 as the second power supply to the terminals P131 and P132. The power supply voltage PWR2 is an example of the second power supply voltage. The power supply voltage PWR2 is set to 1.8 V in the embodiment. That is, the power supply voltage PWR2 is equal to or lower than the power supply voltage PWR1. In a case where the power supply voltage PWR3 described later is not used, the power supply voltage PWR2 can be set to be, for example, in a range from 1.2 V to 1.8 V, but the power supply voltage is not limited to this example.

The host apparatus can supply the power supply voltage PWR3 as the third power supply to the terminals P137 and P138. The power supply voltage PWR3 is an example of the first power supply voltage. The power supply voltage PWR3 is set to equal to or lower than 1.2 V in the embodiment. That is, the power supply voltage PWR3 is equal to or lower than the power supply voltage PWR2. The power supply voltage PWR3 is not limited to this example.

In the memory card 10, the power supply voltage PWR3 is not indispensable. The power supply voltage PWR3 can be allowed to be unnecessary by generating the power supply voltage PWR3 from the power supply voltage PWR2 at the interior of the memory card 10. In that case, the host may supply two power supply voltages of the power supply voltage PWR1 and the power supply voltage PWR2.

As illustrated in FIG. 13, the card controller 14 is located between the first rows R11 and R12 and the second row R21. In addition, the card controller 14 may be disposed at another position and may be located, for example, between the end of the terminal P included in the first row R11 in the positive Y-axis direction and the end of the terminal P included in the second row R21 in the negative Y-axis direction. In addition, the card controller 14 may be disposed such that the terminal P included in the second row R21 is located between the end of the card controller 14 in the positive Y-axis direction and the end of the card controller 14 in the negative Y-axis direction.

Similarly to the first embodiment, the card controller 14 has a plurality of connection terminals CP illustrated in FIG. 4. FIG. 4 shows an example of card controller terminals CP locations for this form factor. The connection terminals CP locations may be different from that illustrated in FIG. 4. The plurality of connection terminals CP are provided on a side 14a of a portion of the card controller 14 and are located between the first row R11 and the second row R21. The connection terminal CP can be disposed, for example, so that the wire line between the connection terminal CP and the terminal P does not intersect.

If it is assumed that a card controller optimal for this form factor is designed in the embodiment, in a case where signals assigned to the plurality of terminals P are connected to the card controller 14, the characteristic impedance of wire line is allowed to be as constant as possible, so that the frequency characteristics become better. For this reason, by assigning the signal terminals of the card controller 14 so that the plurality of wire line W, the plurality of ground planes 41, and the plurality of power supply wire lines 42 illustrated in FIG. 4 do not overlap each other and so that interconnection of the wire line W and the power supply wire lines 42 are efficiently performed without via holes, it is possible to suppress the characteristic impedance fluctuation. Furthermore, due to left-right symmetry, it is possible to easily match the characteristics, and thus, it is possible to easily achieve a pattern design.

Wire lines W2, W3, W5, W6, W8, W9, W11, and W12 connects the connection terminal CP of the card controller 14 to the terminals P102, P103, P105, P106, P108, P109, P111, and P112.

The lengths of wire lines W2, W3, W5, W6, W8, W9, W11, and W12 are set to be equal to each other. In addition, the wire lines W2, W3, W5, W6, W8, W9, W11, and W12 are provided mirror-symmetrically with respect to the center axis Ax extending in the Y-axis direction through the center of the terminal P107. For this reason, it is easy to design the wire lines W2, W3, W5, W6, W8, W9, W11, and W12. In addition, the lengths of wire lines W15 and W16 are set to be equal to each other.

The wire lines W2, W3, W5, W6, W8, W9, W11, and W12 are wired with equal length to reduce interline skew. The wire line may be bent in order to adjust the length, but since it is difficult to draw a pattern with a normally smooth curve, at the time of changing wire line direction, the wire lines at a plurality of places are bent at not 90° but 45°. If the wire line is bent at 90°, the width of the wire line W is slightly increased at the bent portion, and thus, a change in characteristic impedance occurs, so that noise is generated. Since the fluctuation of the width is smaller at 45° than at 90°, the occurrence of noise is suppressed.

The plurality of ground planes 41 surround the wire lines W2, W3, W5, W6, W8, W9, W11, and W12. Accordingly, a return path can be ensured for each differential signals, mutual interference between the differential signals is reduced, so that the operation signal level is stabilized.

The power supply wire line 42 is connected to the terminals P131, P132, P134, P137, and P138. The width of the power supply wire line 42 is set to be larger than the width of wire line W, so that the resistance of the power supply wire line 42 is lowered, and the heat dissipation through the power supply wire line 42 is efficiently performed. In addition, the memory card 10 can dissipate heat from the plurality of terminals P to the connector.

Since resistance components or inductance components of the wire lines and the connectors exist, voltage drop occurs between a host power output and a memory card terminal. In a case where an allowable variation range of the power supply voltage is a constant ratio to the power supply voltage (for example, ±5%), the lower the voltage is, the smaller the allowable voltage variation width is. Therefore, since the voltage drop exists, it is difficult to control the power supply voltage such that the power supply voltage of the card terminal can be maintained within the allowable voltage variation width from the host apparatus as the power supply voltage is lower.

On the other hand, the resistance values of the wire lines including the connector of the host apparatus and the power supply wire line 42 are similar resistance values regardless of the voltage for the same substrate and the same connector. For this reason, when the power supply voltage is low, the current value that can flow through one terminal P is decreased.

In the embodiment, the power supply voltage PWR2 flows to two terminals P131 and P132. In addition, the power supply voltage PWR3 flows to two terminals P137 and P138. In this manner, the current is distributed to the plurality of terminals P131, P132, P137, and P138, and thus, the current value per one terminal P is approximately halved, so that it is possible to reduce the drop voltage due to the resistance component of the power supply wire line 42 and the connector of the host apparatus. Therefore, the host apparatus makes it easier for the power supply voltage to be maintained within allowable voltage variation width. Furthermore, the power supply voltages PWR2 and PWR3 may be set to the same voltage, so that it is possible to supply a larger current.

The resistance component of the connector includes, for example, a contact resistance of the contact and a contact lead resistance, but by reducing the resistance, a static current that can be flowed through the memory card 10 can be increased as long as voltage drop of the resistance is within the range of allowed voltage variation. The contact lead resistance of a connector is determined by the contact length, the contact thickness, the contact material, and the like, and the contact resistance of the contact is determined by the pressure, the shape of the contact point, the card pad roughness, the card pad and contact materials, and the like.

In addition, generally, the power supply voltage PWR1 is 3.3 V±5% and the power supply voltage PWR2 is 1.8

V±5%. However, as described above, the power supply voltage PWR1 may be set to be within a voltage range that is wider on a lower side such as 2.5 V-5% to 3.3 V+5%, and the power supply voltage PWR2 may be set to be within a voltage range that is wider on a lower side such as 1.2 V-5% to 1.8 V+5%. Accordingly, it is possible to lower the voltage and to reduce the power consumption.

An ESD protection diode 43 connects each of the wire lines W2, W3, W5, W6, W8, W9, W11, and W12 and the ground plane 41. The ESD protection diode 43 is disposed between the terminal P and the connection terminal CP and absorbs static electricity entering from the terminals P102, P103, P105, P106, P108, P109, P111, and P112.

When the plurality of connection terminals CP are located between the first row R11 and the first row R12, the wire lines W2, W3, W5, W6, W8, W9, W11, and W12 can be set without bypassing other wire lines or other parts of the first row R12 or passing between the plurality of terminals P included in the first row R12. For this reason, the lengths of the wire lines W2, W3, W5, W6, W8, W9, W11, and W12 can be decreased, and the ESD protection diodes 43 can be effectively disposed. In the embodiment, the ESD protection diode 43 is disposed in the vicinity of the terminal P included in the first row R11.

The memory card 10 is attached to the connector of the host apparatus. For example, the memory card 10 is inserted into a slot of a push-push or push-pull type connector such that the memory card is attached to the connector. In addition, the memory card 10 may be attached to another type of connector such as a hinge type connector.

The memory card 10 of the embodiment is inserted into the slot of the connector from the first edge 31 of FIG. 13 where the notch C is provided. Accordingly, in a state where the memory card 10 is attached to the connector, the first edge 31 is located at the inner side of the connector than the fourth edge 34.

By forming the notch C between the first edge 31 and the second edge 32 in the first corner portion 35, it is prevented that the memory card 10 is inserted into the connector slot in a state where the front and back sides are reversed. For example, when the memory card 10 is inserted into the slot of the connector in the correct direction, the notch C avoids the member of the interior of the connector. On the other hand, when the memory card 10 is inserted into the slot of the connector in reverse, the member of the interior of the connector interferes with, for example, the second corner portion 36 and prevents the memory card 10 from being completely inserted. In addition, when the memory card 10 is inserted into the connector from the fourth edge in a state where the Y-axis direction becomes a reverse direction, the memory card 10 cannot be attached to the connector in the same manner. In the vicinity of the second corner portion 36 formed between the first edge 31 and the third edge 33, the edge in the X-axis direction and the edge in the Y-axis direction are brought into close contact with the connector, so that the deviation of the connector and the memory card 10 in the rotational direction can be reduced.

As illustrated in FIG. 14, when the memory card 10 is inserted into the connector, the lead frames 101 and 103 of the connector come into contact with the plurality of terminals P constituting the first row R11 and the second row R21. The extension direction of the lead frames 101 and 103 is, for example, disposed in the direction in which the wire line of the host becomes the shortest. In this case, when the memory card 10 is inserted into the connector, a force is exerted in a direction in which the lead frames 101 and 103 are likely to bend. An inclined portion 39 is provided in the memory card 10, and the distal end of the memory card 10 is tapered. For this reason, the lead frames 101 and 103 can be guided by the inclined portion 39, and thus, for example, the friction between the lead frames 101 and 103 and the housing 11 is reduced, and the force to bend the lead frame can also be reduced. In addition, the peeling of the plating of the lead frames 101 and 103 is suppressed, and thus, abrasion resistance of the connector is improved. In the direction of the lead frame 102, although the bending force is small, it is difficult to extract a large number of signals from the connector, and thus, the wire line of the host becomes long. For this reason, the use and mounting of the lead frame 102 for data transfer may be optional. Still existing of the lead frame 102 is meaningful so that the contact may be used for card heat release.

For example, in the hinge type connector, the lead frame 102 comes into contact with the plurality of terminals P constituting the first row R12, respectively. In addition, in the memory card 10 of Modified Example of FIG. 15, the lead frame 102 is in contact with the first surface 21 of the housing 11. The lead frame 102 is in contact with the terminal P or the first surface 21, so that the number of contact points between the connector and the memory card 10 is increased. For this reason, the heat of the memory card 10 is conducted to the connector, and thus, the memory card 10 is easily cooled.

When the lead frames 101, 102, and 103 come into contact the terminal P, the controller (hereinafter, referred to as a host controller) of the host apparatus, and the card controller 14 of the memory card 10 is electrically connected via the wire line of the host apparatus or the wire line W of the memory card 10.

The connection point of the connector on the host controller side, such as the terminal of the connector for mounting on the substrate of the host apparatus is generally provided at the inner side of the slot of the connector (upward direction in FIG. 13). For this reason, the length of the wire line between the contact point of the terminals P constituting the first row R11 and the lead frame 101 and the host controller is likely to be decreased. On the other hand, the length of the wire line between the contact point of the terminal P and the lead frame 103 constituting the second row R21 and the host controller is likely to be increased in order to bypass, for example, the first row R11.

In the memory card 10 of the embodiment, the terminals P102, P103, P105, P106, P108, P109, P111, P112, P115, P116, P118, P119, P121, P122, P124, and P125 for high-speed transmission of the differential data signals are included in the first rows R11 and R12 where the wire line length to the host controller becomes shorter. Accordingly, the physical layer (PHY) of the host apparatus approaches the physical layer (PHY) of the memory card 10, so that the signal integrity can be easily ensured in the transmission of the differential data signal of the memory card 10.

FIG. 17 is an exemplary block diagram schematically illustrating a first example of the configuration of the memory card 10 in the third embodiment. The card controller 14 includes an interface circuit (I/F) 51, a physical layer/memory controller 52, two regulators 53 and 54, and a power supply check circuit 55. The physical layer of the card controller 14 and the memory controller 52 are illustrated in one block in FIG. 17 and will also be described below collectively.

An I/F 51 can cope with a single-end signal. The I/F 51 is provided with, for example, an input buffer and an output buffer. The reset signal PERST# is an input signal, and an input buffer is disposed at the terminal P133. CLKREQ# is a bi-directional signal, and an input buffer and an open-drain output buffer are disposed at a terminal P135. This signal is pulled up to the high level by the host. The memory card 10 enters an input state by not driving this signal to Low. In addition, when the host is not driving this signal to Low (High level), the memory card 10 can be brought into an output state capable of controlling the signal level from the memory card 10.

The physical layer/memory controller 52 can handle differential signals. The physical layer/the memory controller 52 is provided with a receiver and a transmitter. The reception differential signals PERp0, PERn0, PERp1, PERn1, PERp2, PERn2, PERp3, and PERn3 can be input to the receiver. The transmitter can output the transmission differential signals PETp0, PETn0, PETp1, PETn1, PETp2, PETn2, PETp3, and PETn3.

The physical layer/memory controller 52 and the power supply check circuit 55 are connected to the I/F 51. The physical layer/memory controller 52 is connected to the flash memory 13. Besides the physical layer of the PCIe, a data link layer and a transaction layer of the PCIe may be provided in the card controller 14.

The physical layer/memory controller 52 can perform serial/parallel conversion, parallel/serial conversion, data symbolization, and the like. The symbolization is a process of replacing 0 or 1 with a certain number or more of non-consecutive symbols when 0 or 1 of data is consecutive, with a value where the total number of 0 and the total number of 1 are equal or close to each other among the codes of the 8B10B, 128$b$/130$b$, and the like. With this symbolization, the average signal voltage level at the time of data transmission can be allowed to be in the vicinity of the common voltage, and thus, the deviation from the reception threshold level can be suppressed. In addition, when the same symbol pattern is repeatedly transmitted, harmonics of a specific frequency are increased. However, the pattern is switched to a plurality of symbols with different patterns so as not to be repeated patterns, so that the harmonics of a specific frequency can be allowed not to be large. In other words, the occurrence of EMI can be suppressed.

In addition, in the transaction layer of the PCIe, data can be packetized for transmission and reception, and messages can be transmitted and received. In the data link layer of the PCIe, a sequence number or a CRC code can be added to a packet received from the transaction layer. The sequence number can be used for checking transmission of packets or the like.

The PCIe can be configured with the multiple lanes, but each lane connecting the host apparatus and the memory card 10 is independently initialized. Only the lane where initialization is completed and communication is possible is used. In the embodiment, a maximum of four lanes are used, but only one lane or two lanes may be used.

One lane: PERp0, PERn0, PETp0, PETn0, or
  PERp1, PERn1, PETp1, PETn1
Two lanes: PERp0, PERn0, PETp0, PETn0,
  PERp1, PERn1, PETp1, PETn1
Four lanes: PERp0, PERn0, PETp0, PETn0,
  PERp1, PERn1, PETp1, PETn1,
  PERp2, PERn2, PETp2, PETn2,
  PERp3, PERn3, PETp3, PETn3

With respect to the order of the data, the data are distributed in the order of the lane number in byte units according to the number of lanes where communication is possible.

When serial reception differential signals PERp0, PERn0, PERp1, PERn1, PERp2, PERn2, PERp3, and PERn3 are transmitted from the host apparatus to the memory card 10, the serial reception differential signals are converted into parallel data in byte units for the receiver of each lane. When the parallel data in byte units are transmitted to the transmitter of each lane, the parallel data are converted into the serial transmission differential signals PETp0, PETn0, PETp1, PETn1, PETp2, PETn2, PETp3, and PETn3 to be transmitted to the host apparatus.

The power supply voltage PWR1 is supplied to the flash memory 13 and the card controller 14. In the embodiment, the power supply voltage PWR1 is mainly used for operations of the flash memory 13, such as read/write of the flash memory 13. By boosting the power supply voltage PWR1, a write voltage of the flash memory 13 is generated. The power supply voltage PWR1 can also be used for other purposes. As described above, the power supply voltage PWR1 is equal to or higher than the power supply voltage PWR2 and is equal to or higher than the power supply voltage PWR3.

In a case where the host apparatus and the memory card 10 are connected with a signal voltage of 3.3 V, the power supply voltage PWR1 is used for an I/O power supply. The power supply voltage PWR1 may be used as an I/O power supply even in a case where the host apparatus and the memory card 10 are connected by a signal voltage of 1.8 V as in the example of FIG. 17. Accordingly, the memory card 10 has a high withstand voltage, and thus, a card input circuit is protected. For example, if the power supply voltage PWR1 is set to 2.5 V, the memory card 10 can be set to a withstand voltage of 2.5 V. When the power supply voltage PWR1 is set to 3.3 V, the memory card 10 can be set to a withstand voltage of 3.3 V.

The power supply voltage PWR2 is supplied to the flash memory 13 and the card controller 14. In the embodiment, the power supply voltage PWR2 is used as a power supply of a logic circuit. The power supply voltage PWR2 is also used as an interface voltage between the flash memory 13 and the card controller 14. Since a lower signal voltage can be used in a higher speed interface, although not illustrated, the power supply voltage PWR3 may also be used as the interface voltage between the flash memory 13 and the card controller 14.

In a case where the host apparatus and the memory card 10 are connected with a signal voltage of 1.8 V, the power supply voltage PWR2 may be used for an I/O power supply. In this case, the memory card 10 can be set to a withstand voltage of 1.8 V.

The power supply voltage PWR3 is supplied to the card controller 14. In the embodiment, the power supply voltage PWR3 is used as a power supply of a physical layer (PHY) of a differential signal circuit and an analog circuit.

In general, a power supply with little noise is used for a differential signal circuit which operates analogously, and the power supply is separated from a digital power supply. In the embodiment, the power supply voltage PWR3 supplied from the host apparatus is a power supply that is sufficiently stabilized and has little noise.

As described above, in the memory card 10, the three power supply voltages PWR1, PWR2, and PWR3 are separated and supplied in order to reduce the influence of noise and the power supply fluctuation. That is, the three power supply voltages PWR1, PWR2, and PWR3 are selectively used depending on the application. In addition, the power supply voltages PWR1, PWR2, and PWR3 are not limited to the above-described examples and may be used in other modes.

Figure 18:
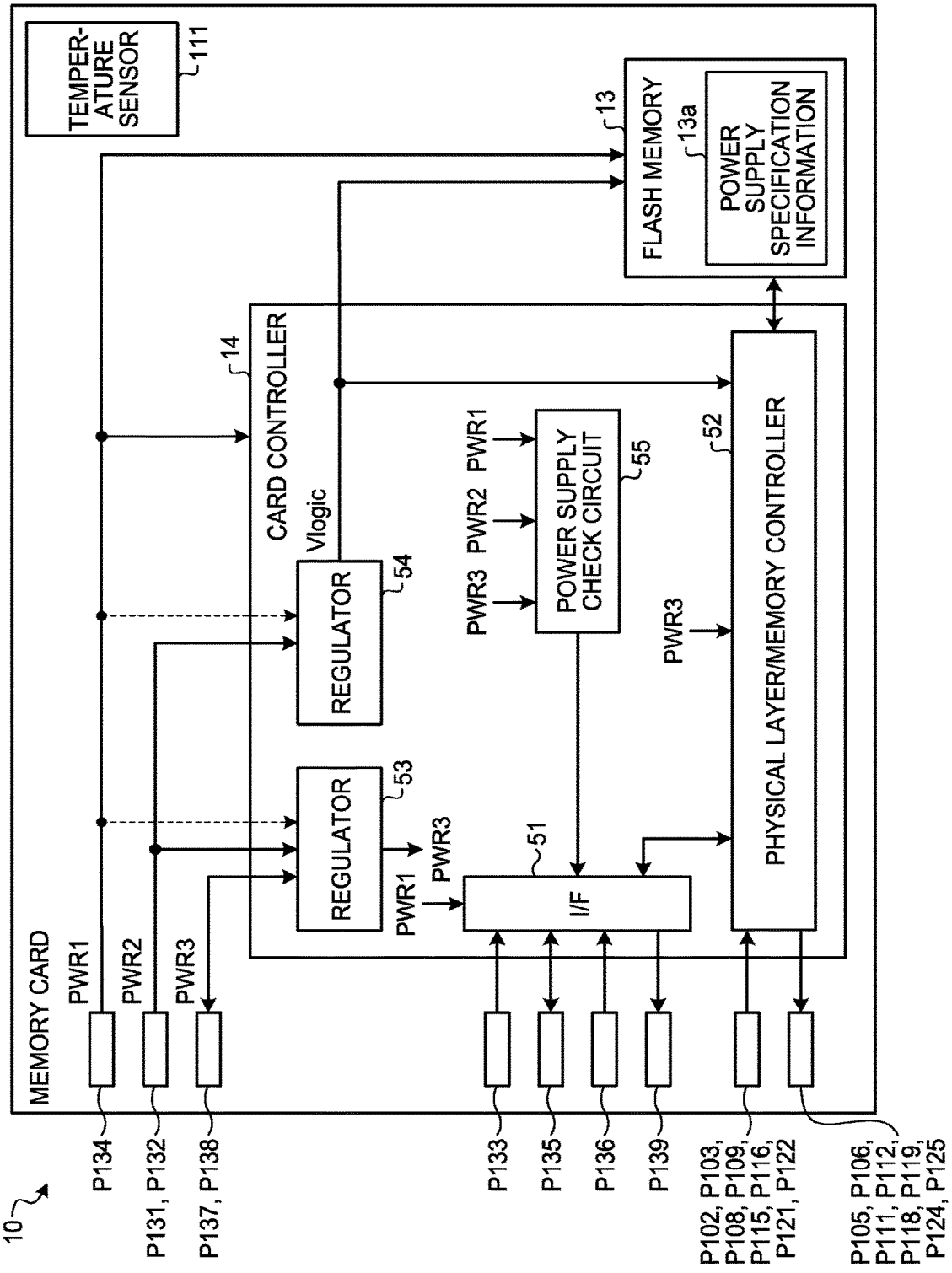
FIG. 18 is an exemplary block diagram schematically illustrating a second example of the configuration of the memory card in the third embodiment.

FIG. 18 is an exemplary block diagram schematically illustrating a second example of the configuration of the memory card 10 in the third embodiment. As illustrated in FIG. 18, the power supply voltage PWR2 may be supplied to the regulators 53 and 54. The power supply voltage PWR3 is generated by the regulator 53 by setting the terminals P137 and P138 to which the power supply voltage (third power supply) PWR3 is assigned to the ground level. This is the case of using the memory card 10 operating with two power supplies of the power supply voltage PWR1 and the power supply voltage PWR2.

As in the example of FIG. 18, the regulator 54 generates a power supply voltage Vlogic lower than the input power supply voltage PWR2. This power supply voltage Vlogic is supplied to the flash memory 13, the physical layer of the card controller 14, and the memory controller 52 instead of the power supply voltage PWR2. The power supply voltage Vlogic can be used as a power supply for the logic circuit and also as an interface voltage between the flash memory 13 and the card controller 14. By reducing the interface voltage, data transmission can be performed at a high speed between the flash memory 13 and the card controller 14, and thus, the power consumption is also reduced. In general, as the signal voltage is lowered, the rising/falling time of the signal can be allowed to be shortened, so that high speed data transmission becomes possible.

In a case where it is difficult to supply a stable power supply voltage PWR3 from the host apparatus, the problem can be solved by using the power supply voltage PWR3 generated by the regulator 53. As in the example of FIG. 18, when the terminals P137 and P138 are connected to ground, the regulator 53 generates the power supply voltage PWR3 which is lower than the power supply voltage PWR2 from the input power supply voltage PWR2. In a case where the host supplies the power supply voltage PWR3 as illustrated in FIG. 17, the memory card 10 can be switched to use the power supply voltage PWR3 supplied from the host without using the regulator 53. Card may always generate the power supply voltage PWR3 by the regulator 53 regardless of the voltage of the terminals P137 and P138.

The power supply voltages PWR3 and Vlogic are both generated from the power supply voltage PWR2. The power supply voltage PWR3 and the power supply voltage Vlogic may be the same voltage or different voltages, but in order that the power supply voltages do not influence each other by separating the power supply voltages, the power supply voltages are generated by separate regulator 53 and regulator 54. In addition, by using Low Drop Out (LDO) as the regulators 53 and 54, unnecessary power consumption due to input/output voltage difference of LDO can be reduced.

As illustrated by the broken lines in FIG. 18, the regulator 53 may generate the power supply voltage PWR3 from the power supply voltage PWR1, and the regulator 54 may generate the power supply voltage Vlogic from the power supply voltage PWR1. That is, in this case, the memory card 10 can operate if the power supply voltage PWR1 exists.

As described above, the memory card 10 can be operated by the power supply voltages PWR1 and PWR2 or the power supply voltages PWR1, PWR2, and PWR3 applied to the terminals P131, P132, P134, P137, and P138. The memory card 10 may switch the power mode according to a combination of the power supply voltages PWR1, PWR2, and PWR3 applied to the terminals P131, P132, P134, P137, and P138.

The host apparatus can cope with the power supply configuration of the memory card 10 by acquiring power supply specification information 13a of the memory card 10 stored in the flash memory 13 by the following power supply check sequence. The power supply specification information 13a includes, for example, voltage range, maximum current (continuous), and peak current (100 µs section) of the power supply voltages PWR1, PWR2, and PWR3.

Figure 19:
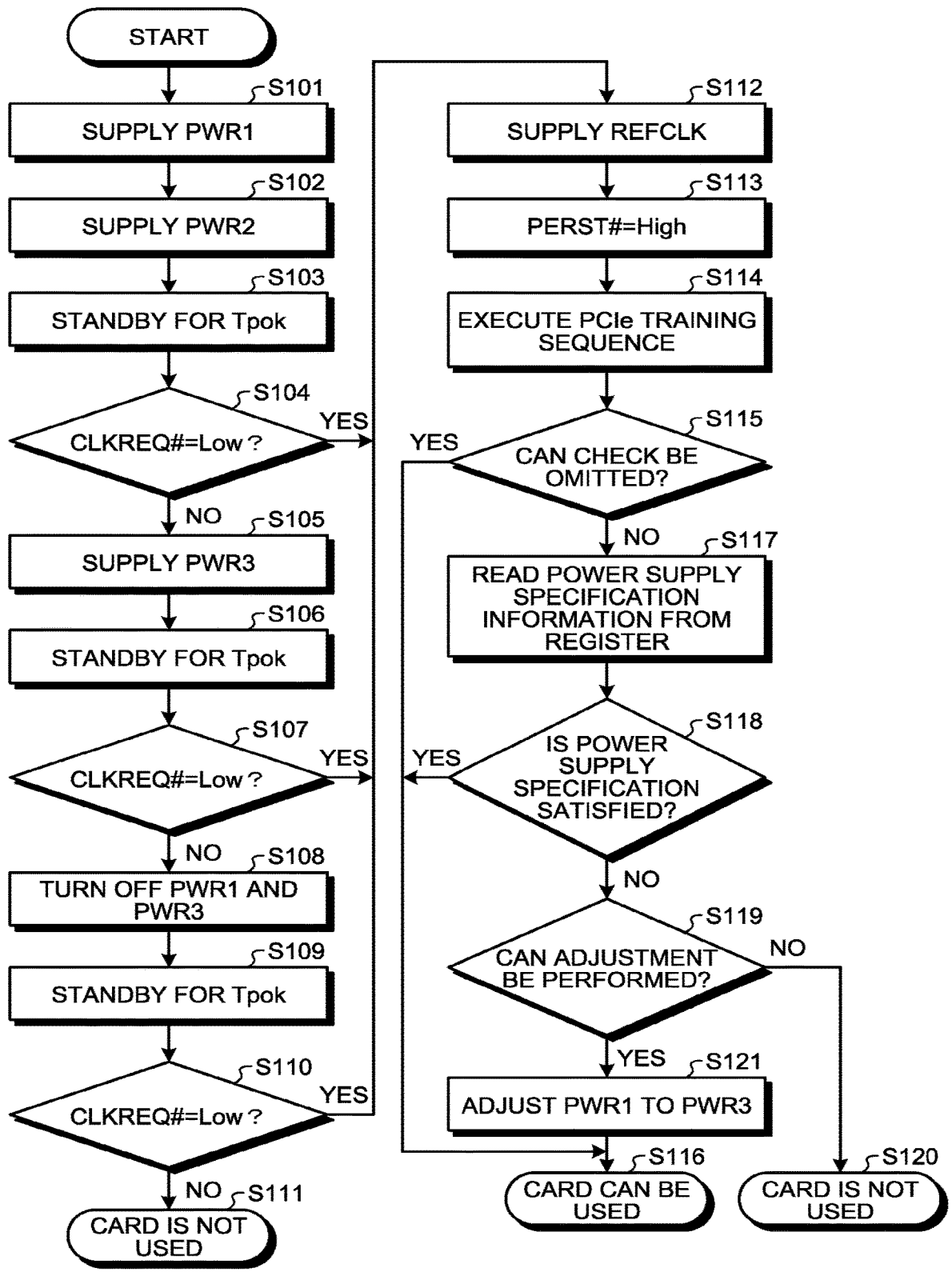
FIG. 19 is an exemplary flowchart illustrating operations of a host apparatus in a power supply check sequence of the memory card in the third embodiment.

FIG. 19 is an exemplary flowchart illustrating the operation of the host apparatus in the power supply check sequence of the memory card 10 in the third embodiment. The initialization of the PCIe is performed before the host apparatus acquires the power supply specification information 13a from the flash memory 13. For this reason, the host apparatus determines whether or not the initialization can be started with a combination of the power supply voltages PWR1, PWR2, and PWR3 to be supplied in the power supply check sequence.

As illustrated in FIG. 19, the host apparatus supplies (applies) the power supply voltage PWR1 to the terminal P134 of the memory card 10 inserted in the slot of the connector (S101) and supplies (applies) the power supply voltage PWR2 to the terminals P131 and P132 (S102).

As illustrated in FIG. 17, the power supply voltages PWR1 and PWR2 are input to the power supply check circuit 55. In a case where the memory card 10 can be used by the applied the power supply voltages PWR1 and PWR2, the power supply check circuit 55 drives CLKREQ#=Low. On the other hand, in a case where the card cannot be used by the applied the power supply voltages PWR1 and PWR2, the power supply check circuit 55 maintains CLKREQ#=High.

As illustrated in FIG. 19, the host apparatus checks the level of CLKREQ#(S104) after a certain time Tpok has elapsed (S103). The power supply check circuit 55 can switch the level of CLKREQ# from High to Low during the time Tpok. For this reason, the host apparatus may check the level of CLKREQ# once after the time Tpok has elapsed. In a case where CLKREQ#=High (S104: No), the host apparatus supplies (applies) the power supply voltage PWR3 to the terminals P137 and P138 of the memory card 10 (S105).

In a case where the memory card 10 can be used with the applied the power supply voltages PWR1, PWR2, and PWR3, the power supply check circuit 55 drives CLKREQ#=Low. On the other hand, in a case where the card cannot be used with the applied the power supply voltages PWR1, PWR2, and PWR3, the power supply check circuit 55 maintains CLKREQ#=High.

The host apparatus checks the level of CLKREQ#(S107) after a certain time Tpok has elapsed (S106). In a case where CLKREQ#=High is maintained (S107: No), the host apparatus turns off the power supply voltages PWR1 and PWR3 (S108).

The host apparatus checks the level of CLKREQ#(S110) after a certain time Tpok has elapsed (S109). In a case where CLKREQ#=High is maintained (S110: No), the host apparatus does not use the memory card 10 (S111).

The card that needs to read this information, such as having special the power supply specification information 13a, is designed to initialize the PCIe with only the power supply voltage PWR2. On the level of register access, the card can operate with low power consumption, and the initialization can be sufficiently performed even with power supply of only the PWR2. Since the power supply specification information 13a cannot be read from the memory with only the PWR2, at the time when the PWR1 is first applied, the card controller is designed to read the power supply specification information 13a from the memory and to write the power supply specification information to the memory of the interior of the card controller.

In such a card, in a case where only the power supply voltage PWR2 is applied (S108), the power supply check circuit 55 drives CLKREQ#=Low. Since the register value can be read by performing the initialization of the PCIe with only the power supply voltage PWR2, as described later, the host apparatus reads the power supply specification information 13a and determines whether or not another power supply voltage necessary for the memory card 10 can be supplied.

In a case where CLKREQ#=Low at the time of checking the level of the control signal CLKREQ#(S104: Yes, S107: Yes, and S110: Yes), the host apparatus starts the initialization of the PCIe (S112, S113, and S114). S112, S113 and S114 are standard power-up sequences of the PCIe. When CLKREQ#=Low, the host apparatus supplies a differential clock REFCLK (S112) and sets the reset signal PERST# to High at a predetermined timing (TPVPGL) (S113).

Next, the host apparatus executes the training sequence of the PCIe (S114). With this training sequence, detection of the physical layer, adjustment of operating parameters of the physical layer, and the like are performed, and thus, the host apparatus and the memory card 10 can communicate with each other, so that a state where an MMIO register can be read is achieved. The above initialization includes the training sequence.

FIG. 20 is an exemplary table listing an example of the power supply specification information 13a in the third embodiment. The power supply specification information 13a exemplified in FIG. 20 is register information described as a power supply requirement specification, and as described above, the power supply specification information 13a includes voltage range, maximum current (continuous), and peak current (for example, 100 μs section) of the power supply voltages PWR1, PWR2, and PWR3.

The maximum current (continuous) is a continuous current value used at the time of memory access of the memory card 10. The power supply circuit of the host apparatus is required to continuously supply this current value.

The peak current (100 μs period) is a peak current value flowing in a case of measuring, for example, in the 100 μs period, and is one of parameters determining the capacity of the coupling capacitor and the response characteristics of the necessary power supply circuit in the power supply design of the host apparatus. The power supply circuit of the host apparatus is required to supply the peak current.

The voltage range includes a range where the power supply voltage is allowed to fluctuate. The power supply circuit of the host apparatus is required to hold the voltage such that the power supply voltage at the terminal P falls within the voltage range even if a drop voltage of the wire line or the connector exists.

In addition, the power supply specification information 13a includes information indicating whether or not the power supply voltage PWR3 is generated from the power supply voltage PWR2 by the regulator 53. As described above, in a case where the power supply voltage PWR3 is not applied to the terminals P137 and P138, the regulator 53 can generate the power supply voltage PWR3 from the power supply voltage PWR2. In addition, although the memory card 10 has the regulator 53, the memory card may use the power supply voltage PWR3 applied to the terminals P137 and P138.

As illustrated in FIG. 19, the host apparatus determines whether or not the subsequent check can be omitted (S115). For example, in a case where CLKREQ#=Low in S104 and S107, when a power supply circuit sufficient for accessing the flash memory 13 is included in the host apparatus, the host apparatus can omit the subsequent checks (S115: Yes), and it is determined that the memory card 10 can be used (S116).

In a case host apparatus requires the subsequent check where the omission of check is no (S115: No), the host apparatus reads the power supply specification information 13a from the flash memory 13 (S117). For example, the power supply specification information 13a is disposed in a vendor specific area of the NVMe register mapped on the MMIO and is output as a differential data signal carried on a packet via the physical layer/memory controller 52. The host apparatus restores the differential data signal to restore the packet and acquires the power supply specification information 13a.

The host apparatus compares the power supply requirement specification of the read the power supply specification information 13a with the power supply circuit specification of the host apparatus to determine whether or not the memory card 10 can be used (S118). In a case where the host apparatus satisfies one of the power supply requirement specifications (S118: Yes), since the host apparatus includes a power supply circuit sufficient for accessing the flash memory 13, the memory card 10 can be used (S116).

In a case where the host apparatus does not satisfy the power supply requirement specification (S118: No), the host apparatus determines whether or not the power supply voltages PWR1, PWR2, and PWR3 can be adjusted (S119). For example, in a case where the power supply voltage PWR1 is insufficient, the host apparatus restricts the maximum power to the power state defined by the PCIe, and thus, when the memory card 10 can be used (S119: Yes), the adjustment is performed (S121), and it is determined that the memory card 10 can be used (S116). On the other hand, in a case where the adjustment cannot be performed (S119: No), the host apparatus does not use the memory card 10 (S120).

In addition, there may be a process of lowering the voltage as the adjustment of the power supply voltages PWR1, PWR2, and PWR3. For example, in the power supply specification information 13a, in a case where the power supply voltage PWR1 with 3.3 V applied can operate at 2.5 V, the host apparatus can lower the power supply voltage PWR1 to 2.5 V, so that it is possible to reduce the power consumption and to adjust to the point where the power supply request of the memory card 10 and the power capability of the host apparatus match.

The memory card 10 can implement a plurality of power modes. For example, as described above, the memory card 10 can implement a plurality of power states or power limits.

As a power state, Dynamic Power Allocation (DPA) is defined in the PCIe, and Dynamic Power State (DPS) is defined in NVMe, so that both can be used.

The host apparatus sets the usable power state in the memory card 10 by the PCIe packet or the NVMe command according to the power supply capability. For example, as illustrated in FIG. 20, the memory card 10 of the embodiment is an example supporting three power states. In addition, the memory card 10 is not limited to this example. Since the peak current is an instantaneous current value not a steady current and does not depend on the power state, common setting is used.

A power state A has higher power consumption than a power state B. The power state B has higher power consumption than a power state C. As the power consumption is increased, the performance is increased. In a case where the power supply circuit of the host apparatus does not satisfy the power state A but satisfies the power state B, the power supply circuit is set to the power state B, so that the host apparatus can use the memory card 10. The options of the power state are given, for example, by other PCIe registers or NVMe commands.

By the initialization of the PCIe, the performance of the PCIe bus is determined, and thus, the maximum performance of the memory card 10 is determined, and the maximum power consumption of the memory card 10 is determined. Therefore, by changing the setting of the power state according to the result of initialization of the PCIe and the power supply voltage value supplied from the host apparatus, the memory card 10 can control the power consumption of the memory card 10.

Instead of the power state, the memory card 10 may use a power limit (slot power limit) similarly to the first embodiment.

Figure 21:
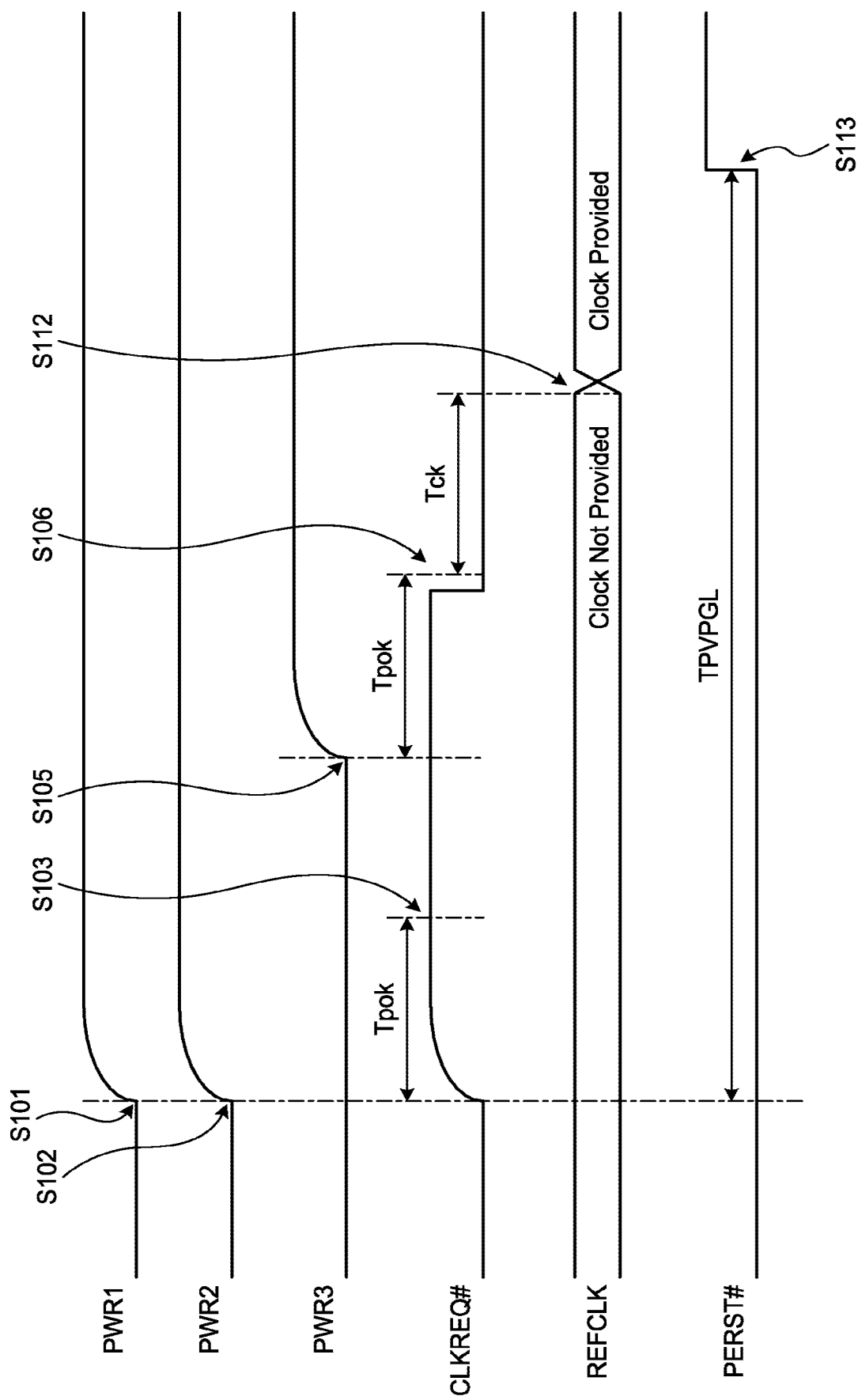
FIG. 21 is an exemplary timing chart illustrating a first example of the power supply check sequence of the memory card in the third embodiment.

FIG. 21 is an exemplary timing chart illustrating a first example of the power supply check sequence of the memory card 10 in the third embodiment. Hereinafter, the first example of the power supply check sequence will be described with reference to FIGS. 19 and 21. In the memory card 10 according to the first example, in FIG. 21, a code corresponding to FIG. 19 is added to the timing corresponding to each operation of FIG. 19. Since the signal voltage by the power supply voltage PWR2 is used for the interface between the host apparatus and the memory card 10, the host apparatus supplies at least the voltage within the range of the power supply voltage PWR2 of the memory card 10.

First, the host apparatus supplies the power supply voltage PWR1 to the terminal P134 of the memory card 10 (S101) and supplies the power supply voltage PWR2 to the terminals P131 and P132 (S102). The power supply voltage PWR3 is set to the ground level. Since the power supply voltage PWR3 is used for initialization of the memory card 10, the level of the control signal CLKREQ# remains high (S104: No) even after a certain time Tpok has elapsed (S103). For this reason, the host apparatus supplies the power supply voltage PWR3 to the terminals P137 and P138 of the memory card 10 (S105).

The power supply voltage PWR3 is supplied, and thus, CLKREQ#=Low. For this reason, after a certain time Tpok has elapsed (S106), since CLKREQ#=Low at the time of checking the level of CLKREQ#(S107: Yes), the host apparatus can recognize that the memory card is a memory card 10 requiring three power supplies. After a Tck time has elapsed from CLKREQ#=Low, the differential reference clock is supplied from the host apparatus (S112). After a TPVPGL time has elapsed, the reset signal PERST# is deasserted from Low to High (S113).

Figure 22:
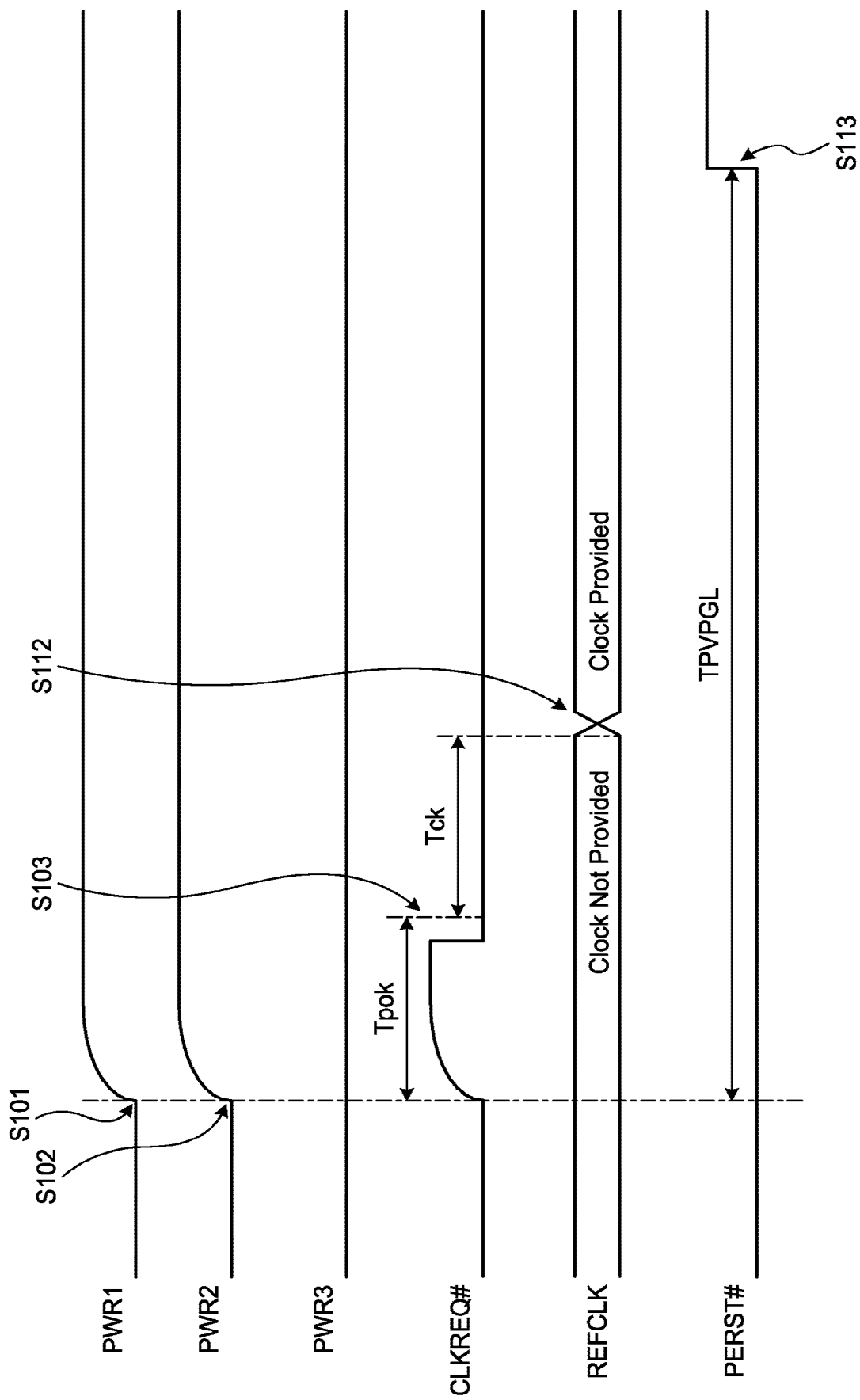
FIG. 22 is an exemplary timing chart illustrating a second example of the power supply check sequence of the memory card in the third embodiment.

FIG. 22 is an exemplary timing chart illustrating a second example of the power supply check sequence of the memory card 10 in the third embodiment. Hereinafter, the second example of the power supply check sequence will be described with reference to FIGS. 19 and 22. In the memory card 10 according to the second example, the power supply voltage PWR3 can be generated from the power supply voltage PWR1 or PWR2 by the regulator 53, so that the initialization by the PCIe can be started only with the power supply voltage PWR1 and PWR2.

First, the host apparatus supplies the power supply voltage PWR1 to the terminal P134 (S101) and supplies the power supply voltage PWR2 to the terminals P131 and P132 of the memory card 10 (S102). The power supply voltage PWR1 and PWR2 are supplied, and thus, CLKREQ#=Low. For this reason, after a certain time Tpok has elapsed (S103), since CLKREQ#=Low at the time of checking the level of CLKREQ#(S104: Yes), the host apparatus requires two power supplies PWR1 and PWR2 and can recognize that the memory card is a memory card 10 not requiring the PWR3.

Figure 23:
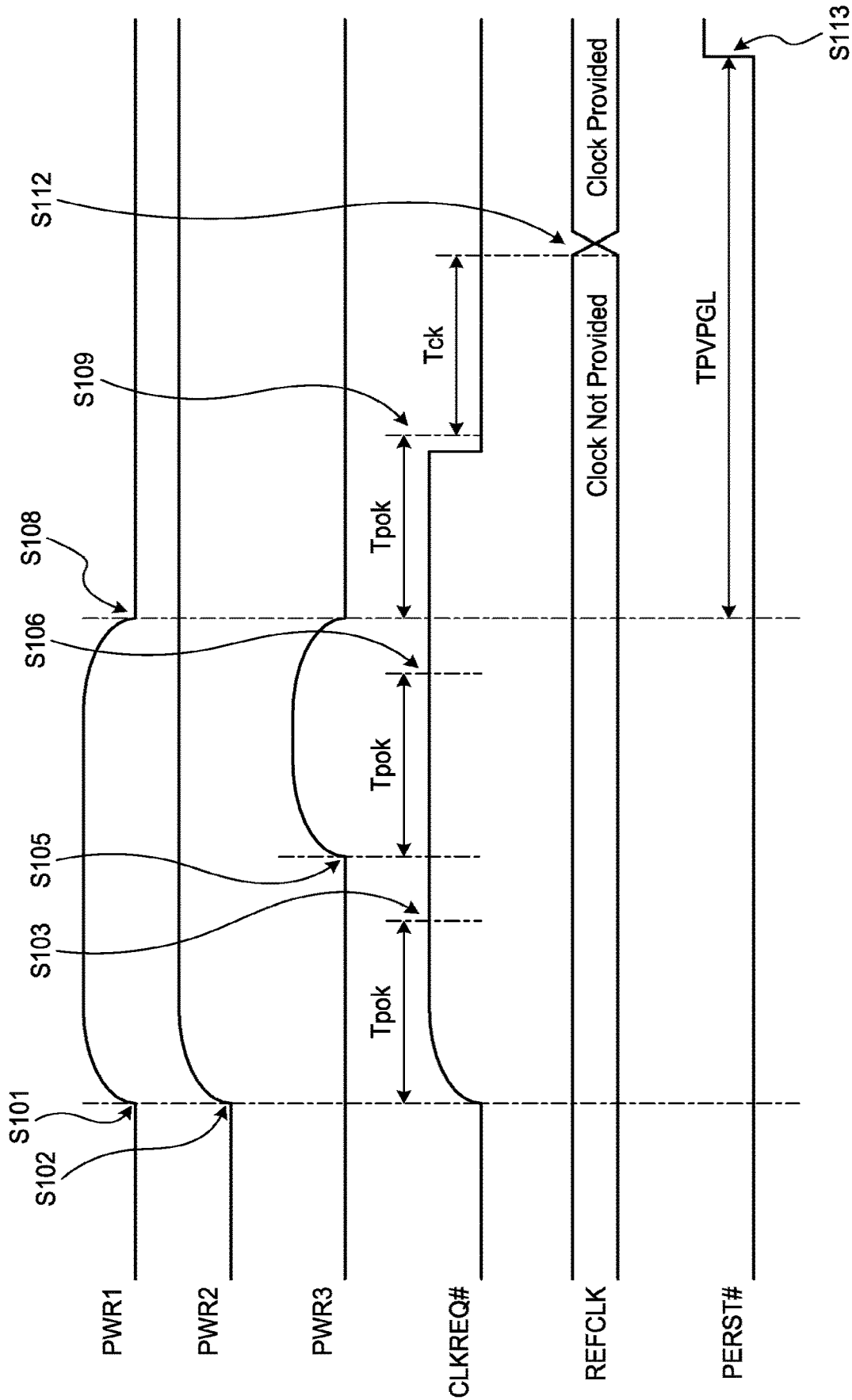
FIG. 23 is an exemplary timing chart illustrating a third example of the power supply check sequence of the memory card in the third embodiment.

FIG. 23 is an exemplary timing chart illustrating a third example of the power supply check sequence of the memory card 10 in the third embodiment. Hereinafter, the third example of the power supply check sequence will be described with reference to FIGS. 19 and 23.

First, the host apparatus supplies the power supply voltage PWR1 to the terminal P134 of the memory card 10 (S101) and supplies the power supply voltage PWR2 to the terminals P131 and P132 (S102). Even when a certain time Tpok has elapsed (S103), the level of the control signal CLKREQ# is maintained to be high (S104: No).

The host apparatus supplies the power supply voltage PWR3 to the terminals P137 and P138 of the memory card 10 (S105). Even when a certain time Tpok has elapsed (S106), the level of the control signal CLKREQ# is maintained to be high (S107: No). For this reason, the host apparatus recognizes that the memory card 10 according to the third example needs to operate with the power supply voltage different from the standard for the power supply voltages PWR1, PWR2, and PWR3. As an example, in some cases, a certain high-performance memory card 10 uses the power supply voltage which is lowered when the power consumption of the memory card 10 is too high at the standard the power supply voltage.

When the host apparatus turns off the power supply voltages PWR1 and PWR3 and applies only PWR2 (S108), if the initialization of the PCIe is can be performed, CLKREQ#=Low. After a certain time Tpok has elapsed (S109), CLKREQ#=Low at the time of checking the level of CLKREQ#(S110: Yes), and the host apparatus executes the initialization of the PCIe (S112, S113, and S114).

As described above, since the memory card 10 according to the third example operates with a special the power supply voltage, the host apparatus does not omit the check (S115: No) and reads the power supply specification information 13a (S117). In the card of the third example, the initialization of the PCIe can be performed with only the power supply voltage PWR2, and the power supply specification information 13a can be read out. In a case where the power supply voltage PWR1 is used for reading the power supply specification information 13a, since the power supply voltage PWR1 is supplied in S101, the host apparatus may read the power supply specification information 13a before the power supply voltage PWR1 is turned off. The host apparatus once drops the power supply voltage PWR2 and supplies the power supply voltages PWR1, PWR2, and PWR3 according to the power supply specification information 13a and executes the power-up sequence from the beginning. In addition, in a case where the host apparatus recognizes the power supply specification of the memory card 10 in advance, even though the memory card is a memory card 10 operating with a special the power supply voltage, the check may be omitted (S115: Yes).

Figure 24:
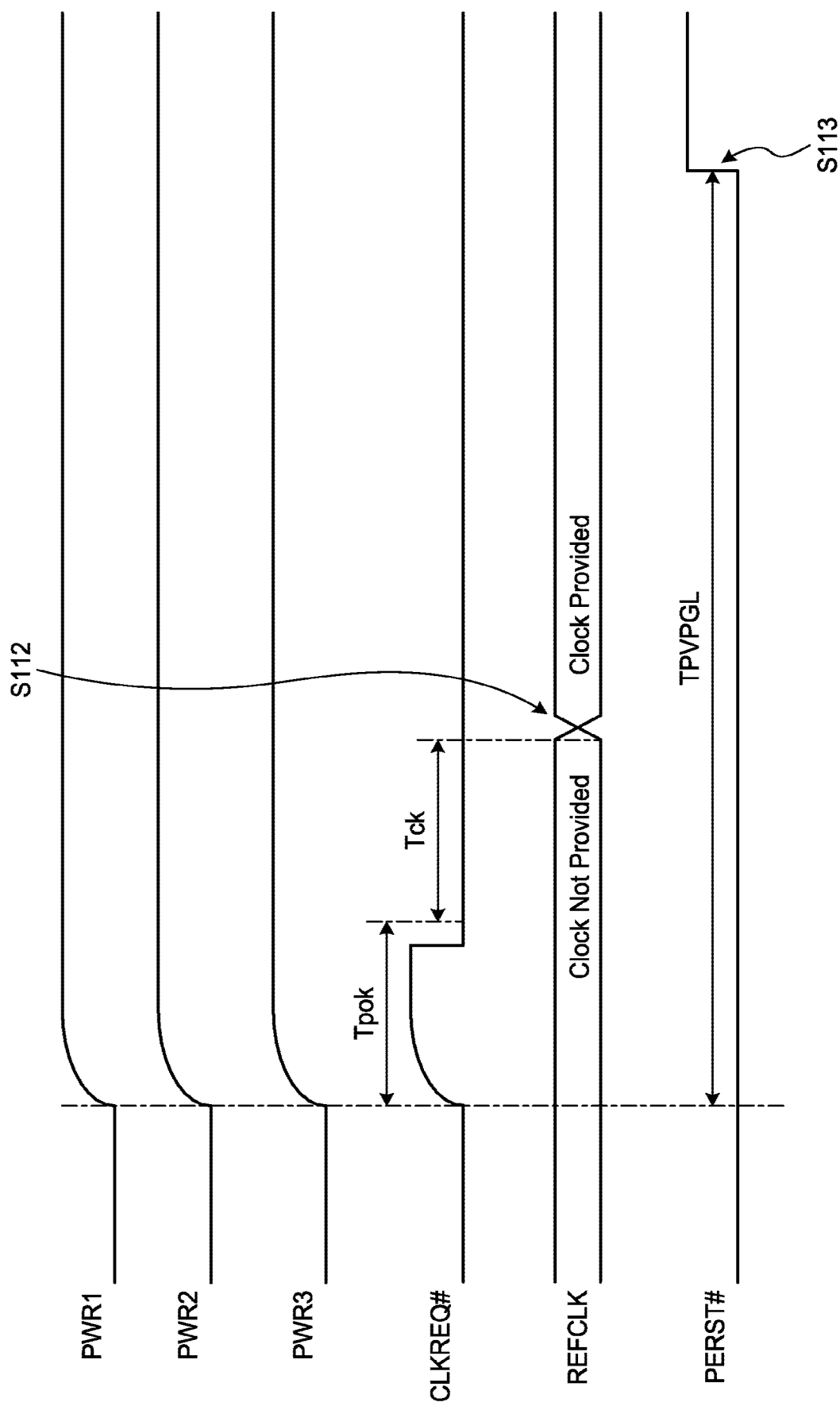
FIG. 24 is an exemplary timing chart illustrating a fourth example of the power supply check sequence of the memory card in the third embodiment.

FIG. 24 is an exemplary timing chart illustrating a fourth example of the power supply check sequence of the memory card 10 in the third embodiment. The fourth example is a general power-up sequence of the PCIe. As illustrated in FIG. 24, the host apparatus supplies the three power supply voltages PWR1, PWR2, and PWR3 from which memory card 10 can operate from the beginning. In this case, it is indicated that, regardless of whether or not the power supply voltage PWR3 is used, the check is omitted, CLKREQ#=Low is output, and the memory access is possible. Accordingly, compatibility with a general power-up sequence of the PCIe is obtained.

In addition, in some cases, in an environment where only a specific the host apparatus and a specific memory card 10 are used in combination, the host apparatus may recognize the power supply specification of the memory card 10 in advance. In this case, the host apparatus may start the initialization by applying all required the power supply voltage from the beginning without executing the power supply check sequence. In this case, if a card can work with specific power supply voltages PWR1, PWR2, and PWR3, the card indicates CLKREQ#=Low.

In order to access the flash memory 13 at a high speed, in some cases, a large current may be used. However, the current consumed in the initialization of the PCIe may be smaller than the current for access at a high speed. For this reason, the power supply specification information 13a can be read even in implementation of the minimum power supply current. The host apparatus can obtain the information on the power supply voltages PWR1, PWR2, and PWR3 optimal to the memory card 10 by the power supply specification information 13a.

In the above power supply check sequence, the card controller 14 of the memory card 10 determines whether or not memory access by the differential data signal is possible according to a combination of the power supply voltages PWR1, PWR2, and PWR3 applied to the terminals P131, P132, P134, P137, and P138 and outputs the result of the determination from the terminal P135. Furthermore, when the initialization of the PCIe by the differential data signal is completed, the flash memory 13 can read the power supply specification information 13a recorded in the flash memory 13. In addition, according to a combination of the power supply voltages PWR1, PWR2, and PWR3 applied to the terminals P131, P132, P134, P137, and P138 and the result of the initialization of the PCIe, the card controller 14 of the memory card 10 controls memory access performance and change the power state information.

Even if a plurality of types of memory cards 10 having different the power supply specifications coexist, the host apparatus can identify the power supply specification through the power supply check sequence described above. By defining the power supply specification between the memory card 10 and the corresponding host apparatus in advance, the power supply check sequence can be omitted.

Since the memory card 10 does not support hot swapping, the memory card takes countermeasures on the host apparatus and the connectors. The replacement of the memory card 10 is performed in a state where the memory card 10 is powered off.

By using the insertion detection of the memory card 10 in the connector, the host apparatus controls to turn on the power supply after the memory card 10 is attached. In addition, since data loss occurs when the memory card 10 is pulled out while the power is being supplied to the memory card 10, this problem can be prevented by the connector having the lock mechanism. When replacing the memory card 10, the host apparatus performs shutdown processing of the memory card 10, stops the power supplying after the shutdown processing is completed, and releases the lock function of the connector. Accordingly, unintentional removal of the memory card 10 can be suppressed, and thus, the data of the memory card 10 can be protected.

In the case of a host system in which replacement of the memory card 10 is always performed in a power-off state, the function of detecting insertion/removal of the memory card 10 becomes unnecessary. The connector may have a signal capable of detecting whether or not the memory card 10 is attached. The host system can determine the existence of the memory card 10 by checking the existence of the PCIe PHY by the initialization of the memory card 10 after turning on the power supply.

Figure 25:
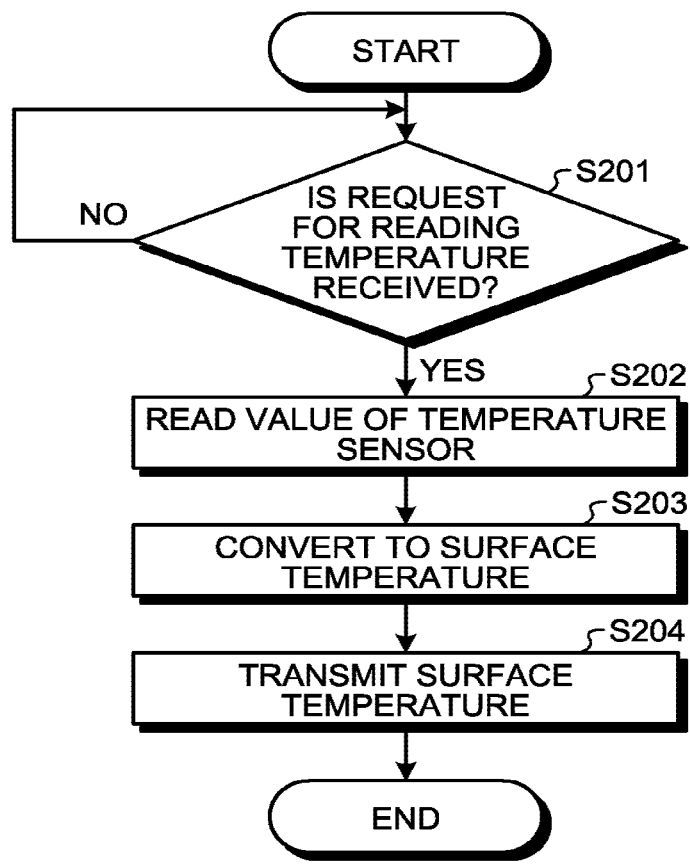
FIG. 25 is an exemplary flowchart illustrating operations of a card controller in a temperature check sequence of the memory card in the third embodiment.

FIG. 25 is an exemplary flowchart illustrating the operation of the card controller 14 in the temperature check sequence of the memory card 10 in the third embodiment. For example, in some cases, in the design of the heat dissipation mechanism of the host apparatus, information on the temperature of the memory card 10 may be used. For this design, the card controller 14 transmits the information related to the temperature of the memory card 10 to the host apparatus in response to a request as described below.

As illustrated in FIG. 25, the card controller 14 determines whether or not a request for reading temperature information is received from the host apparatus (S201). For example, the surface temperature of the memory card 10, which is called a card case temperature, where the memory card 10 is in the maximum performance state (maximum power consumption state) may be used for the design verification of the heat dissipation mechanism of the host apparatus. To make the card in the maximum performance, for example, the host apparatus performs continuously recording (writing) to the flash memory 13 or performs continuously reading from the flash memory 13 and then the host apparatus can obtain card case temperature saturated during continuous read or write by transmitting the read request to the memory card 10.

Upon receiving the request for reading the temperature information from the host apparatus (S201: Yes), the card controller 14 reads the value of the temperature sensor 111 provided in the memory card 10 (S202). For example, the value of the temperature sensor 111 indicates the junction temperature of the card controller 14.

As illustrated in FIGS. 17 and 18, the temperature sensor 111 is provided in the memory card 10 as a component separate from the card controller 14. The temperature sensor 111 is mounted on, for example, the upper surface or the lower surface of the card controller 14. The card controller 14 reads the value of the temperature sensor 111, for example, via a temperature sensor interface (I/F).

In addition, the temperature sensor 111 may be provided in the interior of the card controller 14. For example, the temperature sensor 111 may use an electric resistance built in the card controller 14 as a semiconductor temperature sensor. The temperature sensor 111 is disposed in the vicinity of the circuit generating the most amount of heat in the card controller, so that the junction temperature of the controller may be measured. When the card controller 14 receives the request for reading the temperature information, the CPU of the card controller 14 can acquire the information on the junction temperature by reading the value of the register in which the value of the semiconductor temperature sensor is displayed.

In the semiconductor temperature sensor described above, the electric resistance value varies with the temperature change. The temperature can be calculated from the resistance value by measuring the characteristics between the temperature and the resistance value in advance. For this reason, the card controller 14 can convert the measured electric resistance value of the semiconductor temperature sensor to the junction temperature.

The temperature sensor 111 is not limited to the electric resistance and may be a device using other elements of which characteristic varies with the temperature change as a semiconductor sensor. In an element used as a semiconductor sensor, for example, in a case where a constant current flows, the voltage difference between the both ends varies according to temperature. For this reason, it is possible to calculate the temperature from the voltage difference between the both ends of the element by using the temperature-voltage characteristic of the element previously calculated on the basis of the actual measurement.

In a case where the device is used as a semiconductor sensor, for example, an A/D converter for measuring a voltage is connected to the device. The junction temperature of the card controller 14 is calculated on the basis of the voltage value measured by the A/D converter and the temperature-voltage characteristic of the element. The CPU of the card controller 14 can read the information on the calculated junction temperature via a register.

Next, the card controller 14 converts the junction temperature read from the temperature sensor 111 into the surface temperature of the memory card 10 (S203). The junction temperature and the surface temperature of the memory card 10 are converted on the basis of, for example, a conversion table or a conversion formula described in firmware.

The firmware is stored in the flash memory 13 or the nonvolatile memory of the card controller 14. When the memory card 10 is supplied with power, the CPU of the card controller 14 reads the stored firmware to the memory of the card controller 14 and executes the firmware.

The card controller 14 converts the junction temperature into the surface temperature of the memory card 10 by using the conversion table or the conversion formula stored in the flash memory 13 or the nonvolatile memory of the card controller 14. For example, the conversion table and the conversion formula are created by actually measuring the junction temperature and the surface temperature in the maximum performance state (maximum power consumption state) before the factory shipment of the memory card 10 and calculating the relationship between the junction temperature and the surface temperature from the result of the actual measurement or simulation. In addition, the conversion table and the conversion formula may be created by calculation based on, for example, the type and configuration of the flash memory 13, the arrangement of the card controller 14, and the material of the housing 11. In actual measurement, generally, the surface temperature in the vicinity of the card controller 14 is measured.

Next, the card controller 14 transmits the information on the surface temperature of the memory card 10 to the host apparatus as a response to the request for reading the temperature information (S204). In addition, the card controller 14 may transmit the surface temperatures and the junction temperature or may transmit only one of the temperatures. Card may indicate both the surface temperature for write and the surface temperature for read if the conversion formula is different between read and write. In this case, the host apparatus selects either temperature depends on previous operation has been read or write.

The request for reading the surface temperature by the host apparatus is, for example, a command including a field of requesting Self-Monitoring Analysis and Reporting Technology (S.M.A.R.T.) information including the temperature information to the memory card 10.

In a case where the connection between the memory card 10 and the host apparatus is based on the NVMe, the host apparatus uses, for example, a SMART/Health information command described in the NVM Express Revision 1.3 as a command of requesting the S.M.A.R.T. information. With respect to the command, the memory card 10 may notify the host apparatus of the response in which the junction temperature is set in the composite temperature field and the surface temperature of the memory card 10 converted from the junction temperature is set in the reserve area.

In a case where the connection between the memory card 10 and the host apparatus is based on the SMBus, for example, the host apparatus assigns an information read command assigned to a specific address of the SMBus and transmits the information read command to the memory card 10. The memory card 10 returns a response in which the temperature information is stored in a predetermined area with respect to the command to the host apparatus. In this case, the terminal P136 (CONTA) and the terminal P139 (CONTB) are assigned as the two-wire SMBus interface signal, the memory card 10 may receive the surface temperature read request from the host apparatus by using the terminals P136 and P139 and may transmit the surface temperature information of the memory card 10.

According to the above temperature check sequence, the temperature information of the memory card 10 is provided to the host apparatus. The provided temperature information can be used, for example, for analyzing the characteristics of heat dissipation mechanism of the host apparatus and for checking the heat dissipation mechanism of the host apparatus.

The temperature check sequence of the memory card 10 is not limited to the above-described example. For example, the temperature sensor 111 may measure the temperature of the surface of the flash memory 13. In this case, the card controller 14 may convert the temperature information acquired from the temperature sensor 111 to the surface temperature of the memory card 10 as the junction temperature of the flash memory 13. The surface temperature in this case represents the surface temperature in the vicinity of the flash memory 13.

In the memory card 10 according to the third embodiment described above, the housing 11 includes a first edge 31 extending in the X-axis direction, a fourth edge 34 located on a side opposite to the first edge 31 and extending in the X-axis direction, a second edge 32 extending in the Y-axis direction intersecting the X-axis direction, and a first corner portion 35 where a notch C is formed between the first edge 31 and the second edge 32. The first corner portion 35 where the notch C is formed is used, for example, to prevent the memory card 10 from being reversely inserted. For this reason, in a case where the memory card 10 is inserted into, for example, a push-pull type connector, the memory card 10 is inserted into the connector from the first edge 31. Then, the plurality of terminals P constitute the first rows R11 and R12 and the second row R21 arranged in the Y-axis direction with intervals interposed between the rows. Each of the first rows R11 and R12 includes a plurality of terminals P arranged at positions closer to the first edge 31 than the fourth edge 34 in the X-axis direction with intervals interposed between the terminals. The second row R21 includes a plurality of terminals P arranged at positions closer to the fourth edge 34 than the first edge 31 in the X-axis direction with intervals interposed between the terminals. In this manner, the plurality of terminals P constitute a plurality of rows (R11, R12, and R21), so that the memory card 10 of the embodiment can speed up the communication interface.

In general, the length of the wire line between the terminal P of the memory card 10 inserted into the connector and the host controller is decreased as goes to the inner side of the connector. That is, the length of the wire line between the terminals P included in the first rows R11 and R12 and the host controller becomes smaller than the length of the wire line between the terminal P included in the second row R21 and the host controller. For this reason, the terminals P102, P103, P105, P106, P108, P109, P111, P112, P115, P116, P118, P119, P121, P122, P124, and P125 used for the signal transmission included in the first rows R11 and R12 can more easily ensure the signal integrity than the terminals P128, P129, P133, P135, P136, and P139 used for the signal transmission included in the second row R21. For example, the number of terminals P used for the signal transmission included in the first rows R11 and R12 may be set to be larger than the number of terminals P used for the signal transmission included in the second row R21, and/or the terminals P included in the first rows R11 and R12 are used for transmission of the differential signals, so that the memory card 10 of the embodiment can speed up the communication interface.

The number of signal terminals (the terminals P102, P103, P105, P106, P108, P109, P111, P112, P115, P116, P118, P119, P121, P122, P124, and P125) included in the first rows R11 and R12 is larger than the number of signal terminals (terminals P128, P129, P133, P135, P136, and P139) included in the second row R21. Accordingly, the memory card 10 of the embodiment can speed up the communication interface.

In addition, since the first rows R11 and R12 are used for data transmission at the same time, the memory card 10 of the embodiment can speed up the communication interface.

In addition, the plurality of terminals P constitute the two first rows R11 and R12 and the second row R21. Accordingly, as compared with a case where all the terminals P are arranged in a line, it is possible to ensure a desired size of the terminal P and a desired interval of the plurality of terminals P.

The terminals P102, P103, P105, P106, P108, P109, P111, P112, P115, P116, P118, P119, P120, P121, P124, and P125 used for transmission of signals having frequencies higher than that of the terminals P128, P129, P133, P135, P136, and P139 are included in the first rows R11 and R12. Accordingly, the memory card 10 of the embodiment can speed up the communication interface.

The number of lanes is increased by increasing the number of terminals P102, P103, P105, P106, P108, P109, P111, P112, P115, P116, P118, P119, P120, P121, P124, and P125 assigned to the differential data signals, so that the memory card 10 of the embodiment can speed up the communication interface.

The plurality of terminals P constituting the first rows R11 and R12 include the plurality of terminals P102, P103, P105, P106, P108, P109, P111, P112, P115, P116, P118, P119, P121, P122, P124, and P125 assigned to the differential data signals. On the other hand, the plurality of terminals P constituting the second row R21 include the terminals P128 and P129 assigned to the differential clock signals having a frequency lower than that of the differential data signals, the terminals P133, P135, P136, and P139 assigned to the single-end signals, and the terminals P131, P132, P134, P137, and P138 assigned to the power supplies. Accordingly, in the first rows R11 and R12, providing the terminals P102, P103, P105, P106, P108, P109, P111, P112, P115, P116, P118, P119, P121, P122, P124, and P125 that can transmit the signals at a high speed increases the number of lanes, so that the memory card 10 of the embodiment can speed up the communication interface.

The plurality of terminals P constituting the first row R11 include the terminals P102, P103, P105, P106, P108, P109, P111, and P112 assigned to two lanes of the differential data signals. The plurality of terminals P constituting the first row R12 include the terminals P115, P116, P118, P119, P121, P122, P124, and P125 assigned to two lanes of the differential data signals. Accordingly, the memory card 10 of the embodiment can speed up the communication interface.

Each of the plurality of pairs of terminals P102, P103, P105, P106, P108, P109, P111, and P112 assigned to differential data signals is located between the two terminal among the plurality of terminals P101, P104, P107, P110, and P113 assigned to the ground. Accordingly a return path can be ensured for each differential signal, the mutual interference between the differential signals is reduced, and the operation signal level is stabilized.

Each of the plurality of pairs of terminals P115, P116, P118, P119, P121, P122, P124, and P125 assigned to the differential data signals is located between the two terminal among the plurality of terminals P114, P117, P120, P123, and P126 assigned to the ground. Accordingly, a return path can be ensured for each differential signals, the mutual interference between differential signals is reduced, and the operation signal level is stabilized.

The terminal P134 is assigned to the first power supply PWR1. The terminals P131 and P132 are assigned to the second power supply PWR2 of which voltage is equal to or lower than the first power supply PWR1. The terminals P137 and P138 are assigned to the third power supply PWR3 of which voltage is equal to or lower than the second power supply PWR2. Accordingly, the first to third power supplies PWR1, PWR2, and PWR3 can be selectively used depending on the application, and the flexibility of the memory card 10 is enhanced. Since the allowable value of the power supply voltage fluctuation decreases as the voltage decreases, it is generally preferable to reduce the current value flowing to one terminal P. However, since the plurality of terminals P131 and P132 and the plurality of terminals P137 and P138 are provided, the current value is distributed, so that the current value per terminal becomes small, and voltage fluctuation is suppressed.

In a case where the terminals P137 and P138 assigned to the third power supply PWR3 of the power supply voltage PWR3 are connected to the ground, the regulator 53 generates the power supply voltage PWR3 from the power supply voltage PWR2 applied to the terminals P131 and P132 assigned to the second power supply PWR2 of the power supply voltage PWR2 or the power supply voltage PWR1 applied to the terminal P134 assigned to the first power supply PWR1 of the power supply voltage PWR1. Accordingly, the memory card 10 of the embodiment can cope with either the host apparatus having a two-power-supply configuration of the PWR1 and the PWR2 or the host apparatus having a three-power-supply configuration of the PWR1, the PWR2, and the PWR3.

The card controller 14 determines whether or not memory access by the differential data signal is possible according to a combination of the power supply voltages PWR1, PWR2, and PWR3 applied to the terminals P131, P132, P134, P137, and P138 and outputs the result of the determination from the terminal P135 assigned to the CLKREQ#. In a case where the memory access by the differential data signal is possible, the flash memory 13 can read the power supply specification information 13a stored in the flash memory 13. By comparing the power supply specification information 13a with the power supply specification of the host apparatus, the host apparatus can determine whether or not the memory card 10 can be used. Accordingly, even if the memory cards 10 having a plurality of types of power supply configurations coexist, the host apparatus can identify the power supply specification of the memory card 10.

At least a portion of the side 14a of the card controller 14 is located between the first rows R11 and R12 and the second row R21, and can be provided with the connection terminal CP connected by the wire line W to the terminals P102, P103, P105, P106, P108, P109, P111, and P112 included in the first row R11. Similarly, a portion of the side 14a can be provided with the connection terminal CP connected by the wire line W to the terminals P115, P116, P118, P119, P121, P122, P124, and P125 included in the first row R12. Accordingly, it is possible to achieve the interconnection of the wire line W without bypassing other wire lines and other parts or passing a gap between the terminals P included in the second row R21. Therefore, it is easy to provide, for example, the ESD protection diode 43 in the wire line W, and it is possible to shorten the length of the wire line W between the terminals P102, P103, P105, P106, P108, P109, P111, and P112 included in the first row R11 and the terminals P115, P116, P118, P119, P121, P122, P124, and P125 included in the first row R12 and the connection terminal CP.

The memory card 10 has a length of 14±0.1 mm in the X-axis direction and a length of 18±0.1 mm in the Y-axis direction. In general, the size of the microSD card is 11 mm×15 mm. That is, the memory card 10 of the embodiment is larger than the microSD card. Therefore, the memory card 10 can be mounted with a memory chip having a large memory capacity and a large size, which is difficult to mount on a microSD card, such as a large three-dimensional flash memory, and thus, the memory card 10 can cope with, for example, the large chip size of a future flash memory 13 with the evolution of the technology. Furthermore, the memory card 10 is larger than the microSD card and smaller than the standard SD memory card. For this reason, the memory card 10 is not too large for the host apparatus, and it is easy to insert and eject the memory card 10 to the connector of the host apparatus.

The housing 11 further includes a third edge 33 located on a side opposite to the second edge 32 and extending in the Y-axis direction and a second corner portion 36 between the first edge 31 and the third edge 33. The shape of the first corner portion 35 and the shape of the second corner portion 36 are different from each other. Accordingly, the reverse insertion of the memory card 10 is suppressed.

The first corner portion 35 extends in a linear shape between one end of the first edge 31 and the end of the second edge 32. The first corner portion 35 constitutes a corner-chamfered portion of so-called C1.1. The second corner portion 36 extends in an arc shape between the other end of the first edge 31 and the end of the third edge 33. The second corner portion 36 constitutes a round-chamfered portion of so-called R0.2. In some cases, the memory card 10 may be inserted into the connector in a state where the second corner portion 36 is in contact with the connector. In this case, the position deviation of the memory card 10 in the X-axis direction can be reduced.

The first rows R11 and R12 are disposed in the vicinity of the first edge 31. The second row R21 is located closer to the fourth edge 34 than the first edge 31. That is, the first rows R11 and R12 are located between the center line of the memory card 10 and the housing 11 in the Y-axis direction and the first edge 31, and the second row R21 is located between the center line and the fourth edge 34. For this reason, the pressure acting on the memory card 10 by the lead frames 101, 102, 103 of the connector is allowed to be uniform. In other words, the pressure acting on the area between the center line and the first edge 31 and the pressure acting on the area between the center line and the fourth edge 34 are allowed to be uniform. Therefore, the memory card 10 is more stabilized in the interior of the connector.

The width of the terminal P in the X-axis direction and the distance between the adjacent terminals P are the minimum dimensions capable of forming the terminal of the connector and forming the footprint of the substrate. For this reason, the number of terminals P of the first rows R11 and R12 and the number of terminals P of the second row R21 are the same thirteen. The first row R11 includes two lanes of PCIe, and the first row R12 also includes two lanes of the PCIe. The memory card 10 of FIG. 15, in which the first row R11 and the second row R21 are formed, can use two lanes of the PCIe. The memory card 10 of FIG. 13, in which the first rows R11, R12 and the second row R21 are formed, can use four lanes of the PCIe and can increase the speed.

As the host apparatus, a first host apparatus using only the first row R11 and a second the host apparatus using the first row R11 and the first row R12 can be configured. The first the host apparatus and the second the host apparatus and the memory card 10 of FIG. 13 and the memory card 10 of FIG. 15 can be used in combination with all the host apparatuses and the memory cards 10.

In addition, each the PCIe lane has the performance of at least Gen. 3 and can support the performance of Gen. 4. The host apparatus has a wide range of communication speed options and can select bus performance with the best performance for applications and the lowest power consumption.

In the case of the first the host apparatus or the memory card 10 of FIG. 15, the first row R12 is not used for communication. However, it is possible to dissipate heat from the memory card 10 by the lead frame 102. The lead frame 102 can dissipate heat from the memory card 10 even if the lead frame is in contact with the terminal P of the first row R12 or in contact with the first surface 21 of the housing 11. The first the host apparatus may have the lead frame 102 that is electrically connected to the ground dedicated to the heat dissipation.

The flash memory 13 is disposed under the second row R21, so that the second row R21 can be used for heat dissipation of the flash memory 13. For example, the lead frame 103 in contact with the second row R21 dissipates heat from the flash memory 13.

As described above, in the connector, not only the heat dissipation mechanism in contact with the second surface 22 but also a large number of lead frames 101, 102, and 103 in contact with the first surface 21 can be used for heat dissipation of the memory card 10. By dissipating heat from both the first surface 21 and the second surface 22, the heat dissipation capability and the heat dissipation effect of the memory card 10 are improved.

The ends of the terminals P farther away from the first edge 31 in the respective first rows R11 and R12 are aligned at the same position in the Y-axis direction. The lengths of the signal terminals P102, P103, P105, P106, P108, P109, P111, and P112 included in the first row R11 closer to the first edge 31 than the first row R12 in the Y-axis direction are shorter than the respective lengths of the ground terminals P101, P104, P107, P110, and P113 in the Y-axis direction and are equal to the respective lengths of the terminals P114 to P126 included in the first row R12 in the Y-axis direction. Accordingly, when the memory card 10 is inserted into the connector of the host apparatus in the Y-axis direction, the ground terminals P101, P104, P107, P110, P113, P127, and P130 and the power supply terminals P131, P132, P134, P137, and P138 come into contact with the lead frame of the connector earlier than the signal terminals P102, P103, P105, P106, P108, P109, P111, P112, P128, P129, P133, P135, P136, and P139. Therefore, the GND level of the host apparatus is equivalent to the GND level of the memory card 10, and the electrical level of the card controller 14 can be stabilized. Furthermore, since the ground terminals P101, P104, P107, P110, and P113 of the first row R11 come into contact with the lead frame of the connector first earlier, there is no need to lengthen the ground terminal P of the first row R12. For this reason, it is possible to shorten the lengths of all the terminals P of the first row R12 in the Y-axis direction, and it is possible to shorten the interval between the first rows R11 and R12. Therefore, it is possible to widen the interval between the first row R12 and the second row R21, and it is possible to ensure the area where the lead frames 102, 103 extending in opposite directions in FIG. 14 are disposed.

The shapes and lengths of the terminals P included in the second rows R21 and R22 can be arbitrarily set because the frequency of the signal used by the terminal P is low. For example, as illustrated in FIGS. 13 and 15, in a case where the plurality of terminals P constitute the plurality of second rows R21 and R22, in the respective second rows R21 and R22, the ends farther away from the first edge 31 of the terminal P are aligned at the same position in the Y-axis direction. In addition, the lengths of the signal terminals P128, P129, P133, P135, P136, and P139 included in the second row R21 closer to the first edge 31 than the second row R22 in the positive Y-axis direction are shorter than the respective lengths of the ground terminals P127 and P130 and the power supply terminals P131, P132, P134, P137, and P138 in the Y-axis direction.

In the Y-axis direction, the length of the signal terminal P included in the second row R22 may be shorter than the lengths of the power supply terminal P and the ground terminal P included in the second row R22. In a case where the power supply terminal P is included in the second row R22, the power supply terminal P may have the same shape as the power supply terminal P included in the second row R21.

The lengths of the signal terminals P included in the first rows R11 and R12 in the X-axis direction are equal to each other. Accordingly, it is possible to allow the electrical characteristics of the signal terminals P included in the first rows R11 and R12 to be similar to each other.

In the X-axis direction, the lengths of the signal terminals P included in the first rows R11 and R12 may be different from the length of the ground terminal P. In this case, for example, in the X-axis direction, the lengths of the signal terminals P are allowed to be equal to each other, and the lengths of the ground terminals P are allowed to be equal to each other. The lengths of the terminals P in the X-axis direction are not limited to this example.

Heretofore, one form factor of the memory card 10 has been described. However, with respect to the form factor of the memory card 10, as compared with the form factor of the memory card 10 described above, the outer shape and the number of terminals P may be expanded while the positions of the terminals P constituting the first row R11 and the second row R21 are maintained.

For example, the outer shape of the memory card 10 can be enlarged in at least one of the X-axis direction, the Y-axis direction, and the Z axis direction. The number of terminals P constituting the first rows R11 and R12 can be expanded in the form factor of the memory card 10 of which outer shape is enlarged. For example, the number of terminals P included in the first rows R11 and R12 may be more than 13. In addition, the plurality of terminals P can constitute more than two first rows R11, R12, R13, and R14.

The expanded first rows R13, R14, . . . may be arranged in the negative Y-axis direction or may be arranged in the positive Y-axis direction with respect to the first rows R11 and R12. In a case where the first rows R13, R14, . . . are arranged in the negative Y-axis direction with respect to the first rows R11 and R12, the shape of the terminals P included in the first rows R13, R14, . . . is the same as the shape of the terminals P included in the first row R12.

The number of terminals P constituting the second rows R21 and R22 may be expanded in the form factor of the memory card 10 of which outer shape is enlarged. For example, a plurality of terminals P may constitute more than two second rows R21, R22, R23, and R24. The shapes of the terminals P included in the expanded second rows R23, R24, . . . can be arbitrarily set.

By using, for example, an adapter, the memory card 10 according to one form factor can be used as a connector for the memory card 10 according to a larger form factor. In the connector and the connector for the memory card 10 according to the one form factor, the relative positions of the lead frames 101, 102, and 103 are the same.

Fourth Embodiment

Figure 26:
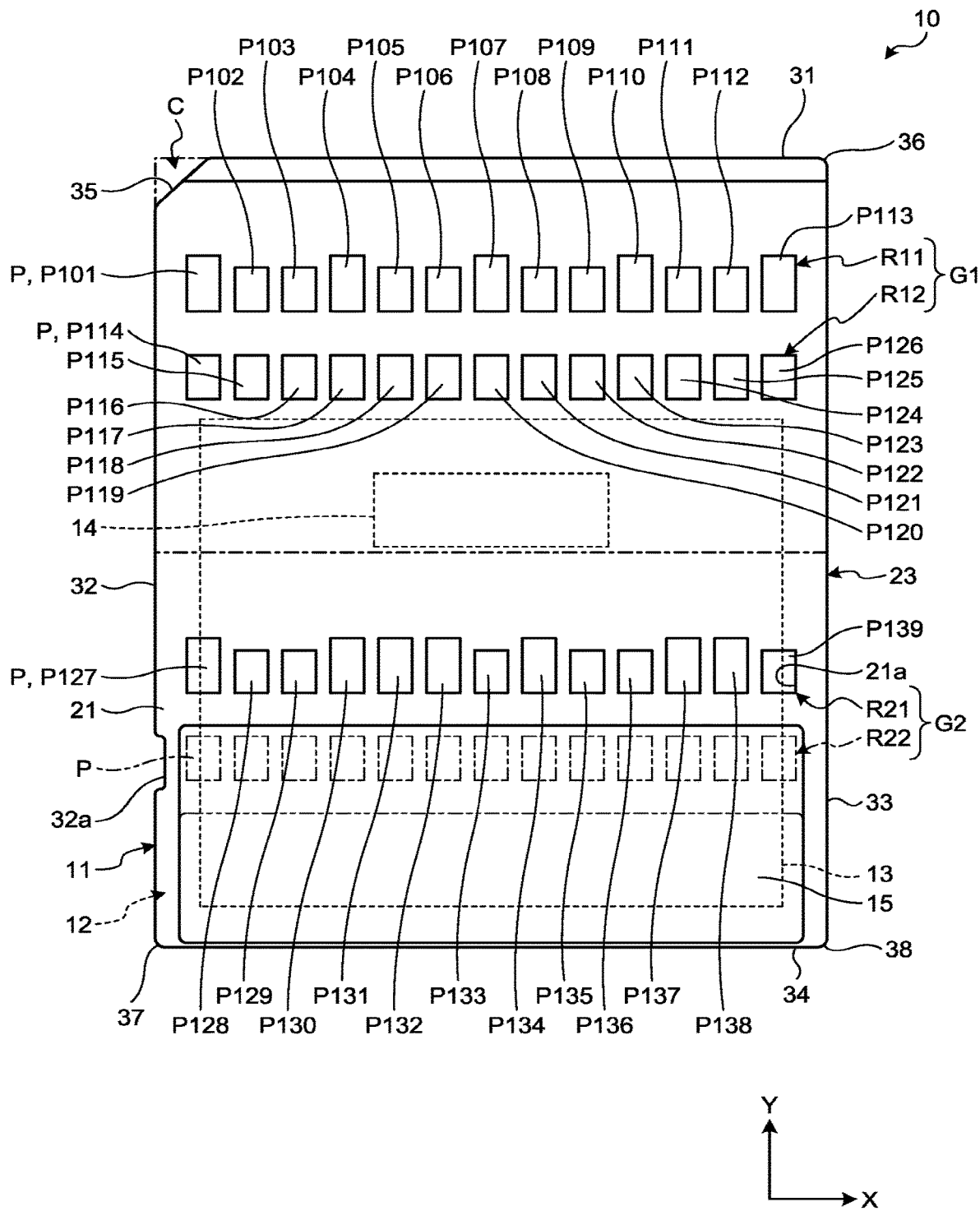
FIG. 26 is an exemplary plan view illustrating a memory card according to a fourth embodiment.

Hereinafter, a fourth embodiment will be described with reference to FIG. 26. FIG. 26 is an exemplary plan view illustrating a memory card 10 according to the fourth embodiment. As illustrated in FIG. 26, a card controller 14 according to the fourth embodiment is stacked in a flash memory 13.

The flash memory 13 is overlaid on the terminal P included in the second row R21. According to another expression, the flash memory 13 may be disposed such that the terminals P included in the second row R21 are located between the end of the flash memory 13 in the positive Y-axis direction and the end of the flash memory 13 in the negative Y-axis direction. For example. On the other hand, since the flash memory 13 has a different chip area depending on the memory capacity, there are a case where the flash memory is close to the terminals P included in the first rows R11 and R12 and a case where the flash memory is spaced from the terminals.

The card controller 14 is located between the first rows R11 and R12 and the second row R21. For this reason, similarly to the third embodiment, the plurality of connection terminal CP of the card controller 14 can also be disposed between the first rows R11 and R12 and the second row R21. The wire line W connects the connection terminal CP and the terminal P included in the first row R11.

Like the memory card 10 of the fourth embodiment described above, the card controller 14 may be stacked in the flash memory 13. Since the flash memory 13 is located at a position spaced from the first rows R11 and R12 and the connection terminal CP is located between the first rows R11 and R12 and the second row R21, the lengthening of the wire line W of the card controller 14 is suppressed.

According to at least one embodiment described above, the housing has a first edge extending in a first direction, a second edge extending in a second direction intersecting the first direction, and a first corner portion wherein a notch between the first edge and the second edge is formed. The first corner portion where the notch is formed is used, for example, for preventing the reverse insertion of a semiconductor memory device. For this reason, in a case where a semiconductor memory device is inserted into a push-pull type connector, for example, the semiconductor memory device is inserted into the connector from the first edge. The plurality of terminals are arranged in the first direction with intervals interposed between the terminals to constitute the first row, and a plurality of terminals are arranged at positions farther from the first edge than the first row in the first direction with intervals interposed between the terminals to constitute at least one second row. Since a plurality of terminals constitute a plurality of rows, the semiconductor memory device of the embodiment can speed up the communication interface.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a housing having a first surface, a second surface located on a side opposite to the first surface, a first end edge extending in a first direction, a second end edge located on a side opposite to the first end edge and extending in the first direction, a first side edge extending in a second direction intersecting the first direction, and a first corner portion where a notch between the first end edge and the first side edge is formed;
    a nonvolatile memory;
    a controller configured to control the nonvolatile memory; and
    a plurality of terminals provided on the first surface,
    wherein the terminals include a first plurality of terminals, a second plurality of terminals, and a third plurality of terminals,
    the first plurality of terminals are arranged in the first direction with intervals at a position closer to the first end edge than the second end edge,
    the third plurality of terminals are arranged in the first direction with intervals at a position closer to the second end edge than the first end edge,
    the second plurality of terminals are arranged between the first plurality of terminals and the third plurality of terminals in the first direction with intervals,
    the first plurality of terminals are closer to the first end edge than the second plurality of terminals are,
    the first plurality of terminals include at least one pair of first signal terminals for differential data signals, the differential data signals complying with PCIe standard,
    the first plurality of terminals include a first plurality of ground terminals assigned to ground,
    each pair of the at least one pair of first signal terminals is located between two of the first plurality of ground terminals,
    the second plurality of terminals include a second plurality of ground terminals assigned to ground,
    the third plurality of terminals include differential clock signal terminals assigned to differential clock signals, a single-end signal terminal assigned to a single-end signal, a first power supply terminal assigned to a first power supply and one or more second power supply terminals assigned to a second power supply having a voltage equal to or lower than that of the first power supply,
    the first power supply terminal is configured to be supplied with a current having one of a first plurality of set current values, and
    the one or more second power supply terminals are configured to be supplied with a current having one of a second plurality of set current values.

2. The semiconductor memory device according to claim 1,
    wherein the plurality of terminals include a plurality of signal terminals used for signal transmission, and
    the number of at least one of the signal terminals included in the first plurality of terminals and the second plurality of terminals is larger than the number of at least one of the signal terminals included in the third plurality of terminals.

3. The semiconductor memory device according to claim 1,
    wherein a plurality of pairs of the first signal terminals assigned to a plurality of lanes of the differential data signals are included in the first plurality of terminals.

4. The semiconductor memory device according to claim 1,
    wherein the single-end signal terminal includes a plurality of sideband signal terminals assigned to sideband signals of PCIe standard.

5. The semiconductor memory device according to claim 1,
    wherein the third plurality of terminals include a plurality of third power supply terminals assigned to a third power supply having a voltage equal to or lower than that of the second power supply.

6. The semiconductor memory device according to claim 1,
    wherein the first direction and the second direction are perpendicular to each other,
    a length of the semiconductor memory device in the first direction is 14±0.1 mm, and
    a length of the semiconductor memory device in the second direction is 18±0.1 mm.

7. The semiconductor memory device according to claim 1,
    wherein the housing has a second side edge located on a side opposite to the first side edge and extending in the second direction and a second corner portion between the first end edge and the second side edge, and
    a shape of the first corner portion and a shape of the second corner portion are different from each other.

8. The semiconductor memory device according to claim 1,
    wherein the second plurality of terminals include a plurality of second signal terminals used for signal transmission, and
    lengths of the at least one pair of first signal terminals included in the first plurality of terminals and the plurality of second signal terminals in the second plurality of terminals in the first direction are equal to each other.

9. The semiconductor memory device according to claim 1,
    wherein the housing has an inclined portion extending in a linear shape between the first end edge and the first surface.

10. The semiconductor memory device according to claim 1,
    wherein the one or more second power supply terminals are located in the first direction adjacently.

11. The semiconductor memory device according to claim 10,
wherein the third plurality of terminals include a third plurality of ground terminals assigned to ground.

12. The semiconductor memory device according to claim 11,
wherein the single-end signal terminal is located between the first power supply terminal and the one or more second power supply terminals.

13. The semiconductor memory device according to claim 12,
wherein the single-end signal terminal includes a sideband signal terminal assigned to a sideband signal of PCIe standard.

14. The semiconductor memory device according to claim 10,
wherein a power supplied to the first power supply terminal is configured to be supplied to the nonvolatile memory.

15. The semiconductor memory device according to claim 10,
wherein a power supplied to one of the one or more second power supply terminal is configured to be supplied to the nonvolatile memory.

16. The semiconductor memory device according to claim 1, wherein
the second plurality of terminals are arranged in the first direction at a position closer to the first end edge than to the second end edge, and
one of the first plurality of terminals and one of the second plurality of terminals are arranged in the second direction with intervals.

17. The semiconductor memory device according to claim 1,
wherein at least a portion of sides of the controller is located between the second plurality of terminals and the third plurality of terminals, and has a connection terminal connected to one of the second plurality of terminals through a wire line.

18. The semiconductor memory device according to claim 1,
wherein the nonvolatile memory is provided in the housing, and
the controller is provided in the housing.

19. The semiconductor memory device according to claim 1,
wherein the third plurality of terminals include a plurality of third signal terminals used for signal transmission and a third plurality of ground terminals assigned to ground.

20. The semiconductor memory device according to claim 1,
wherein the semiconductor memory device is connectable to a host, and
a power of the first power supply is supplied to the first power supply terminal from the host and a power of the second power supply is supplied to the one or more second power supply terminals from the host when the semiconductor memory device is connected to the host.

* * * * *